(12) United States Patent
Yamazaki et al.

(10) Patent No.: US 10,205,007 B2
(45) Date of Patent: Feb. 12, 2019

(54) SEPARATION METHOD AND MANUFACTURING METHOD OF FLEXIBLE DEVICE

(71) Applicant: Semiconductor Energy Laboratory Co., Ltd., Atsugi-shi, Kanagawa-ken (JP)

(72) Inventors: Shunpei Yamazaki, Setagaya (JP); Junpei Yanaka, Tochigi (JP); Seiji Yasumoto, Tochigi (JP); Masakatsu Ohno, Utsunomiya (JP); Hiroki Adachi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 17 days.

(21) Appl. No.: 15/486,545

(22) Filed: Apr. 13, 2017

(65) Prior Publication Data

US 2017/0309731 A1 Oct. 26, 2017

(30) Foreign Application Priority Data

Apr. 22, 2016 (JP) .................................. 2016-086552
Apr. 22, 2016 (JP) .................................. 2016-086553

(51) Int. Cl.
*H01L 21/00* (2006.01)
*H01L 29/66* (2006.01)
(Continued)

(52) U.S. Cl.
CPC .. *H01L 29/66969* (2013.01); *H01L 21/02532* (2013.01); *H01L 21/02609* (2013.01); *H01L 21/02623* (2013.01); *H01L 21/31116* (2013.01)

(58) Field of Classification Search
USPC ........................................................ 438/104
See application file for complete search history.

(56) References Cited

U.S. PATENT DOCUMENTS 6,700,631 B1    3/2004  Inoue et al.
7,728,326 B2*   6/2010  Yamazaki .......... H01L 21/6835
                                                              257/40
(Continued)

FOREIGN PATENT DOCUMENTS

CN    001256794 A    6/2000
DE    69931130       11/2006
(Continued)

OTHER PUBLICATIONS

International Search Report (Application No. PCT/IB2017/052070) dated Aug. 1, 2017.
(Continued)

*Primary Examiner* — Timor Karimy
(74) *Attorney, Agent, or Firm* — Robinson Intellectual Property Law Office; Eric J. Robinson

(57) ABSTRACT

A low-cost separation method with high mass productivity is provided. A first layer with a thickness of 0.1 μm or more and 3 μm or less can be formed by using a photosensitive and thermosetting material over the formation substrate, a resin layer comprising an opening is formed by forming an opening in the first layer by using a photolithography method, a silicon layer or an oxide layer is formed so as to overlap with the opening of the resin layer, a transistor including a metal oxide is formed over the resin layer, a conductive layer formed in the same manufacturing steps as the source or drain of the transistor is formed over the silicon layer or the oxide layer, the resin layer and one of the silicon layer and the oxide layer are irradiated with the laser light, and the transistor and the conductive layer are separated from the formation substrate.

20 Claims, 40 Drawing Sheets

(51) Int. Cl.
*H01L 21/02* (2006.01)
*H01L 21/311* (2006.01)

(56) References Cited

U.S. PATENT DOCUMENTS

| | | |
|---|---|---|
| 2004/0212012 A1 | 10/2004 | Yamazaki et al. |
| 2014/0234664 A1 | 8/2014 | Yasumoto et al. |
| 2014/0339517 A1 | 11/2014 | Park et al. |
| 2014/0346473 A1* | 11/2014 | Park .................... H01L 51/5256 257/40 |
| 2015/0151531 A1 | 6/2015 | Ohno et al. |
| 2017/0294463 A1 | 10/2017 | Yamazaki et al. |

FOREIGN PATENT DOCUMENTS

| | | |
|---|---|---|
| EP | 1014452 A | 6/2000 |
| JP | 11-312811 A | 11/1999 |
| JP | 2004-246351 A | 9/2004 |
| JP | 2015-72361 * | 10/2013 |
| JP | 2014-187356 A | 10/2014 |
| JP | 2015-072361 | 4/2015 |
| JP | 2015-223823 | 12/2015 |
| JP | 2016-036005 A | 3/2016 |
| KR | 2015-0064671 A | 6/2015 |
| KR | 2015-0120376 A | 10/2015 |
| TW | 201438115 | 10/2014 |
| TW | 201529329 | 8/2015 |
| WO | WO-1999/044242 | 9/1999 |
| WO | WO-2014/129519 | 8/2014 |

OTHER PUBLICATIONS

Written Opinion (Application No. PCT/IB2017/052070) dated Aug. 1, 2017.

* cited by examiner

SEPARATION METHOD AND MANUFACTURING METHOD OF FLEXIBLE DEVICE

TECHNICAL FIELD

One embodiment of the present invention relates to a separation method and a manufacturing method of a flexible device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input-output device (e.g., a touch panel), a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

Display devices using organic electroluminescent (EL) elements or liquid crystal elements have been known. In addition, examples of the display device include a light-emitting device including a light-emitting element such as a light-emitting diode (LED), and an electronic paper performing display by an electrophoretic method or the like.

The organic EL element generally has a structure in which a layer containing a light-emitting organic compound is provided between a pair of electrodes. By voltage application to this element, the light-emitting organic compound can emit light. With use of such an organic EL element, thin, lightweight, high-contrast, and low-power-consumption display devices can be achieved.

Further, by forming a semiconductor element such as a transistor and a display element such as the organic EL element over a flexible substrate (film), a flexible display device can be provided.

Patent Document 1 discloses a method for manufacturing a flexible display device by separating a heat-resistant resin layer from a glass substrate after a supporting substrate provided with a heat-resistant resin layer and electronic elements is irradiated with laser light through a sacrificial layer.

REFERENCE

Patent Document

[Patent Document 1] Japanese Published Patent Application No. 2015-223823

DISCLOSURE OF INVENTION

An object of one embodiment of the present invention is to provide a novel separation method. An object of one embodiment of the present invention is to provide a separation method at low cost with high productivity. An object of one embodiment of the present invention is to perform separation using a large substrate.

An object of one embodiment of the present invention is to provide a manufacturing method of a novel flexible device. An object of one embodiment of the present invention is to provide a manufacturing method of a highly reliable flexible device. An object of one embodiment of the present invention is to manufacture a flexible device at low temperatures. An object of one embodiment of the present invention is to provide a manufacturing method of a flexible device with a simplified manufacturing process. An object of one embodiment of the present invention is to provide a manufacturing method of a flexible device at low cost with high productivity. An object of one embodiment of the present invention is to manufacture a flexible device using a large substrate.

Note that the descriptions of these objects do not disturb the existence of other objects. Note that one embodiment of the present invention does not necessarily achieve all the objects. Other objects can be derived from the description of the specification, the drawings, and the claims.

One embodiment of the present invention is a method for manufacturing a flexible device including a step of forming a first layer with a thickness of 0.1 μm or more and 3 μm or less using a photosensitive and thermosetting material over a formation substrate, a step of forming an opening in the first layer by a photolithography method to form a resin layer including an opening, a step of forming a silicon layer so as to overlap with the opening of the resin layer, a step of forming a transistor including a metal oxide over the resin layer, a step of forming a conductive layer in the same manufacturing steps as manufacturing steps of a source or a drain of the transistor over the silicon layer, a step of performing irradiation with laser light on the resin layer and the silicon layer, and a step of separating the transistor and the conductive layer from the formation substrate.

As the silicon layer in the above-described embodiment, a silicon layer having a function of releasing hydrogen by light irradiation may be formed.

As the silicon layer in the above-described embodiment, a hydrogenated amorphous silicon layer may be formed.

In the above-described embodiment, the resin layer and the silicon layer may be irradiated with the laser light from the formation substrate side.

One embodiment of the present invention is a method for manufacturing a flexible device including a step of forming a first layer with a thickness of 0.1 μm or more and 3 μm or less using a photosensitive and thermosetting material over a formation substrate, a step of forming an opening in the first layer by a photolithography method to form a resin layer including an opening, a step of forming an oxide layer so as to overlap with the opening of the resin layer, a step of forming a transistor including a metal oxide over the resin layer, a step of forming a conductive layer in the same manufacturing steps as manufacturing steps of a source or a drain of the transistor over the oxide layer, a step of performing irradiation with laser light on the resin layer and the oxide layer, and a step of separating the transistor and the conductive layer from the formation substrate.

As the oxide layer in the above-described embodiment, an oxide layer containing indium, zinc, and any one of aluminum, gallium, yttrium, and tin may be formed.

In the above-described embodiment, the resin layer and the oxide layer may be irradiated with the laser light from the formation substrate side.

As the laser light in the above-described embodiment, linear laser light may be used.

In the above-described embodiment, the first layer may be formed using a solution with a viscosity of 5 cP or more and less than 100 cP.

In the above-described embodiment, the first layer may be formed using a spin coater.

In the above-described embodiment, the resin layer may be formed by heating the first layer at a first temperature and the transistor may be manufactured at a temperature lower than the first temperature.

According to one embodiment of the present invention, a novel separation method can be provided. According to one embodiment of the present invention, a separation method at low cost with high productivity can be provided. According to one embodiment of the present invention, separation using a large substrate can be performed.

According to one embodiment of the present invention, a manufacturing method of a novel flexible device can be provided. According to one embodiment of the present invention, a manufacturing method of a highly reliable flexible device can be provided. According to one embodiment of the present invention, a flexible device can be manufactured at a low temperature. According to one embodiment of the present invention, a manufacturing method of a flexible device with a simplified manufacturing process can be provided. According to one embodiment of the present invention, a manufacturing method of a flexible device at low cost with high productivity can be provided. According to one embodiment of the present invention, a flexible device using a large substrate can be manufactured.

Note that the descriptions of these effects do not disturb the existence of other effects. Note that one embodiment of the present invention does not necessarily achieve all the effects. Other effects can be derived from the description of the specification, the drawings, and the claims.

BEST MODE FOR CARRYING OUT THE INVENTION

Figure 1A:
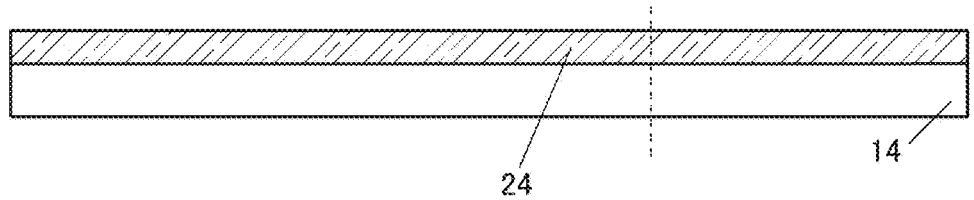
FIGS. 1A to 1D are diagrams illustrating an example of a manufacturing method of a flexible device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following description of the embodiments.

Note that in structures of the present invention described below, the same portions or portions having similar functions are denoted by the same reference numerals in different drawings, and description of such portions is not repeated.

Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Embodiment 1

In this embodiment, a separation method, a flexible device, and a manufacturing method of the flexible device of one embodiment of the present invention will be described.

One embodiment of the present invention is a manufacturing method of a flexible device in which a first layer having a thickness of greater than or equal to 0.1 μm and less than or equal to 3 μm is formed over a formation substrate using a photosensitive and thermosetting material, a resin layer having an opening is formed by forming an opening in the first layer using a photolithography method, a second layer is formed so as to overlap with the opening of the resin layer, a transistor including an oxide semiconductor is formed over the resin layer, a conductive layer formed in the same manufacturing steps as the source or drain of the transistor is formed over the second layer, the resin layer and the second layer are irradiated with laser light, and the transistor and the conductive layer are separated from the formation substrate. Note that the second layer can be a silicon layer or an oxide layer.

In this specification and the like, an oxide semiconductor may be referred to as a metal oxide.

In one embodiment of the present invention, the second layer is irradiated with laser light. In the case where the second layer is a silicon layer, the second layer releases hydrogen by absorbing light and being heated. For example, hydrogen is released in a gaseous state. Hydrogen in a gaseous state can form a bubble-form region (or a brittle region or a region with a void) in the second layer or over the surface of the second layer.

The second layer is irradiated with light to release hydrogen. This reduces the adhesion between the second layer and the layer in contact with the second layer and separation is performed at the interface between the two layers. Alternatively, by releasing hydrogen from the second layer, the second layer itself is damaged so that separation is performed in the second layer.

Further, in the case where the second layer is an oxide layer, by laser light irradiation of the oxide layer, the adhesion between the second layer and the layer in contact with the second layer can be reduced and separation can be performed at the interface between the two layers. Alternatively, the second layer itself is damaged, so that separation can be performed in the second layer.

In one embodiment of the present invention, an oxide semiconductor is used in a channel formation region of the transistor. With the use of the oxide semiconductor, the maximum process temperature can be lower than that of the case of using low-temperature polysilicon (LTPS).

In the case of using LTPS for the channel formation region of the transistor, the resin layer is required to have heat resistance because temperatures of approximately 500° C. to 550° C. are applied. Further, it is necessary to increase the thickness of the resin layer in order to relieve damage in the laser crystallization process.

In contrast, the transistor formed using an oxide semiconductor can be formed at a temperature lower than or equal to 350° C., or even lower than or equal to 300° C. Thus, the resin layer is not required to have high heat resistance. Accordingly, the heat resistant temperature of the resin layer can be low, and the range of choices for the materials can be widened. Therefore, the transistor formed using an oxide semiconductor does not need laser crystallization process; thus, the resin layer can be thin. Since the resin layer is not required to have high heat resistance and can be thinned, the cost for manufacturing a device can be significantly reduced. Further, the oxide semiconductor is preferably used because the process can be simplified as compared with the case where LTPS is used.

In one embodiment of the present invention, the transistor and the like are formed at a temperature lower than or equal to the heat resistant temperature of the resin layer. Here, the heat resistance of the resin layer can be evaluated by, for example, weight loss percentage due to heating, specifically 5% weight loss temperature (a heating temperature in the case where the weight of the resin layer is reduced by 5% by the heat treatment). The 5% weight loss temperature of the resin layer is preferably lower than or equal to 450° C., further preferably lower than or equal to 400° C., still further preferably lower than 400° C., still yet further preferably lower than 350° C. For example, the transistor is manufactured at a temperature lower than or equal to 350° C. and further, lower than or equal to 300° C.

According to one embodiment of the present invention, irradiation with a linear laser beam is performed. A laser apparatus used in a manufacturing line for LTPS or the like can be effectively used. A linear laser beam is condensed in a long rectangular shape (is shaped into a linear laser beam) so that the resin layer and the second layer are irradiated with light. Thus, the transistor can be separated from the formation substrate.

The photosensitive material is used for manufacturing the resin layer in one embodiment of the present invention. When a photosensitive material is used, the resin layer having a desired shape can be easily formed. For example, the opening can be formed easily in the resin layer.

For example, an electrode part of which is exposed (also referred to as a rear electrode or a through electrode) can be formed by separating the conductive layer and the formation substrate after the opening is formed in the resin layer and disposing the second layer and the conductive layer to cover the opening. The electrode can be used as an external connection terminal.

In this embodiment, an example of electrically connecting the external connection terminal and the circuit board such as a flexible printed circuit (FPC) through the opening formed in the resin layer is illustrated.

A flexible device can be manufactured using the separation method of one embodiment of the present invention. A flexible device and a manufacturing method thereof of one embodiment of the present invention will be specifically described below with reference to FIGS. 1A to 1D, FIGS. 2A to 2C, FIGS. 3A to 3C, FIGS. 4A to 4C, FIGS. 5A to 5C, FIGS. 6A and 6B, FIGS. 7A to 7D, FIGS. 8A to 8C, FIGS. 9A to 9C, FIGS. 10A to 10C, FIGS. 11A to 11C, FIGS. 12A and 12B, FIGS. 13A to 13C, and FIGS. 14A to 14C. Here, an example where a display device including the transistor and the organic EL element (also referred to as an active matrix organic EL display device) is manufactured as the flexible device will be described. By using a material having flexibility as the substrate, a foldable organic EL display device can be achieved.

Note that the thin films constituting the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, or the like. As the CVD method, a plasma-enhanced chemical vapor deposition (PECVD) method or a thermal CVD method may be used. As an example of the thermal CVD method, a metal organic chemical vapor deposition (MOCVD) method may be used.

The thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

When the thin films included in the display device are processed, a lithography method or the like can be used. Alternatively, island-shaped thin films may be formed by a film formation method using a blocking mask. Alternatively, the thin films may be processed by a nano-imprinting method, a sandblasting method, a lift-off method, or the like. Examples of the photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

As light for exposure in a photolithography method when using light, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

Manufacturing Method Example 1

First, a first layer 24 is formed using a photosensitive and thermosetting material over a formation substrate 14 (see FIG. 1A).

Specifically, the photosensitive and thermosetting material is formed with a thickness of 0.1 μm or more and 3 μm or less.

Figure 1B:
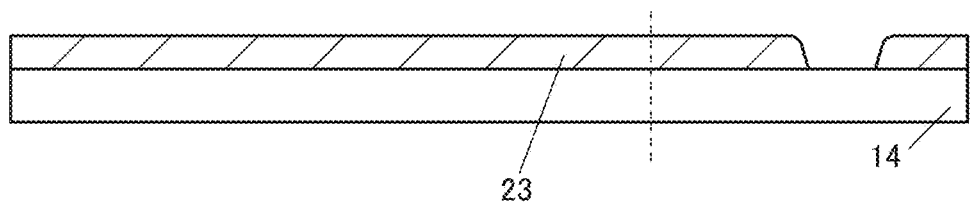

In one embodiment of the present invention, the first layer 24 can be partly removed by a lithography method using light because the photosensitive material is used as the first layer 24. Specifically, after the material is deposited, heat treatment (also referred to as pre-baking treatment) for removing a solvent is performed, and then light exposure is performed using a photomask. Next, development treatment is performed to remove an unnecessary portion. In addition, heat treatment (also referred to as postbake treatment) is performed so that a resin layer 23 having an opening is formed. FIG. 1B illustrates an example where the opening that reaches the formation substrate 14 is provided in the resin layer 23.

Note that by the heat treatment (postbake treatment), released gas components (e.g., hydrogen or water) in the resin layer 23 can be reduced. In particular, the heat treatment is preferably performed at a temperature higher than the manufacturing temperature of each layer formed over the resin layer 23. For example, in the case where the manufacturing temperature of the transistor is below 350° C., a film to be the resin layer 23 is preferably heated at a temperature higher than 350° C. and lower than or equal to 450° C., further preferably lower than or equal to 400° C., still further preferably lower than 400° C., and still yet further preferably lower than 375° C. Thus, a gas released from the resin layer 23 in the manufacturing process of the transistor can be significantly reduced.

The first layer 24 is preferably formed with a spin coater. By a spin coating method, a thin film can be uniformly formed over a large-sized substrate.

The first layer 24 is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the coating is. Furthermore, the lower the viscosity of the solution is, the more the entry of bubbles can be prevented, leading to a favorable-quality film.

The resin layer 23 has flexibility. The formation substrate 14 has lower flexibility than the resin layer 23 does.

The resin layer 23 is preferably formed using a photosensitive polyimide resin (also referred to as PSPI).

Examples of photosensitive and thermosetting materials which can be used to form the resin layer 23 include an acrylic resin, an epoxy resin, a polyamide resin, a polyimide-amide resin, a siloxane resin, a benzocyclobutene-based resin, and a phenol resin.

The thickness of the resin layer 23 is preferably greater than or equal to 0.01 μm and less than 10 μm, further preferably greater than or equal to 0.1 μm and less than or equal to 3 μm, and still further preferably greater than or equal to 0.5 μm and less than or equal to 1 μm. With the use of a solution with low viscosity, the resin layer 23 can be easily made thin.

Alternatively, the resin layer 23 can be formed by dipping, spray coating, ink-jetting, dispensing, screen printing, or offset printing, or with a doctor knife, a slit coater, a roll coater, a curtain coater, or a knife coater, for example.

The thermal expansion coefficient of the resin layer 23 is preferably greater than or equal to 0.1 ppm/° C. and less than or equal to 20 ppm/° C., and further preferably greater than or equal to 0.1 ppm/° C. and less than or equal to 10 ppm/° C. The lower the thermal expansion coefficient of the resin layer 23 is, the more the breakage of the transistor or the like by heating can be prevented.

In the case where the resin layer 23 is positioned on the display surface side of the display device, the resin layer 23 preferably has a high visible-light transmitting property.

The formation substrate 14 has stiffness high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

Figure 1C:
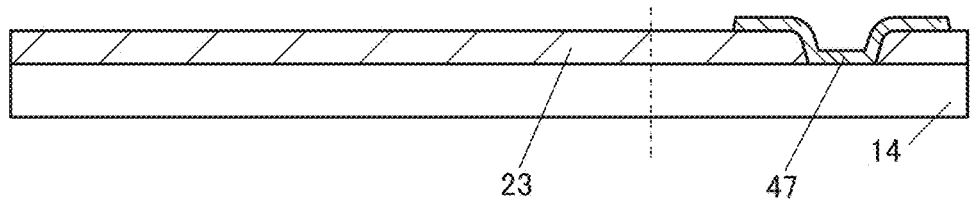

Subsequently, a second layer 47 is formed (see FIG. 1C). The second layer 47 can be formed in the following manner: a silicon film is formed, a resist mask is formed, the silicon film is etched, and the resist mask is removed.

As the second layer 47, for example, a silicon layer from which hydrogen is released by heating can be used. In particular, a hydrogenated amorphous silicon (a-Si:H) film is preferably used. The hydrogenated amorphous silicon film can be formed by, for example, a plasma CVD method using a deposition gas containing $SiH_4$. A silicon layer having crystallinity is preferably used as the second layer 47. After the deposition of the second layer 47, heat treatment may be performed under an atmosphere containing hydrogen in order that the second layer 47 can contain a larger amount of hydrogen.

For example, an impurity can be contained in the second layer 47 at the time of film formation in the case where the deposition gas contains impurities such as gallium or arsenide. Alternatively, after the second layer 47 is formed, the resistance of the second layer 47 can be lowered by the impurity addition. Ion doping or ion implantation can be used, for example, for the impurity addition. Specifically, by adding phosphorus, arsenic, or the like, the second layer 47 becomes n-type. By adding boron, aluminum, gallium, or the like, the second layer 47 becomes p-type. Further, the second layer 47 preferably has a high conductivity.

Note that when the second layer is a silicon layer, the steps performed before the layer is irradiated with laser light, which will be described later, are preferably performed at temperatures which are less likely to cause release of hydrogen from the second layer 47. Accordingly, a problem such as separation of the second layer 47 before the layer is irradiated with laser light and a decrease in yield can be suppressed.

Further, an oxide layer such as an oxide insulating layer, an oxide conductive layer (oxide semiconductor layer including impurity states), or an oxide semiconductor layer can be used as the second layer 47. In particular, the oxide semiconductor layer and the oxide conductive layer are preferred because they have narrower band gaps and are more likely to absorb light than the oxide insulating layer such as a silicon oxide layer. Further, the second layer 47 is preferably the oxide conductive layer because the second layer 47 can function as an electrode that can be used as an external connection terminal. The oxide conductive layer can be formed by reducing the resistance of the oxide semiconductor layer.

An oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide conductive layer can be controlled by selecting between treatment for increasing oxygen vacancies and/or impurity concentration on the oxide semiconductor layer, or treatment for reducing oxygen vacancies and/or impurity concentration on the oxide semiconductor layer.

Specifically, the resistivity of the oxide semiconductor layer can be controlled by plasma treatment. For example, plasma treatment using a gas containing one or more kinds selected from a rare gas (He, Ne, Ar, Kr, or Xe), hydrogen, boron, phosphorus, and nitrogen, can be employed. For example, plasma treatment can be performed in an Ar atmosphere, a mixed gas atmosphere of Ar and nitrogen, a mixed gas atmosphere of Ar and hydrogen, an ammonia atmosphere, a mixed gas atmosphere of Ar and ammonia, a nitrogen atmosphere, or the like. Thus, the oxide semiconductor layer can have a high carrier density and a low resistivity.

Hydrogen, boron, phosphorus, or nitrogen is injected into the oxide semiconductor layer by an ion implantation method, an ion doping method, a plasma immersion ion implantation method, or the like, so that the resistivity of the oxide semiconductor layer can be reduced.

Alternatively, a method in which a film containing hydrogen and/or nitrogen is formed in contact with the oxide semiconductor layer and hydrogen and/or nitrogen are/is diffused from the film into the oxide semiconductor layer can be employed. Thus, the oxide semiconductor layer can have a high carrier density and a low resistivity.

In the case where heat treatment is performed in the manufacturing process of the flexible device, oxygen is released from the oxide semiconductor layer by heating the oxide semiconductor layer, so that oxygen vacancies might be increased. Thus, the resistivity of the oxide semiconductor layer can be reduced.

Oxygen is released from the oxide semiconductor layer and oxygen vacancies might be increased by laser irradiation of the oxide semiconductor layer in order to separate the oxide semiconductor layer from the formation substrate. Thus, the resistivity of the oxide semiconductor layer can be reduced.

Note that such the oxide conductive layer formed using an oxide semiconductor layer can be referred to as an oxide semiconductor layer having a high carrier density and a low resistance, an oxide semiconductor layer having conductivity, or an oxide semiconductor layer having high conductivity.

An In-M-Zn-based oxide layer (M is Al, Ga, Y, or Sn), for example, can be used as the second layer 47. In particular, the In—Ga—Zn-based oxide layer is preferably used.

Alternatively, an oxide conductive layer of indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO to which gallium is added, ITO containing silicon, or the like may be used.

For example, the thickness of the second layer 47 is preferably greater than or equal to 1 nm and less than or equal to 200 nm, further preferably greater than or equal to 5 nm and less than or equal to 100 nm.

Figure 1D:
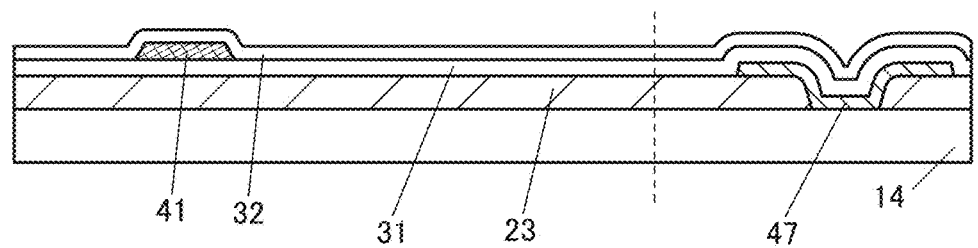

Next, the insulating layer 31 is formed over the resin layer 23 (FIG. 1D).

The insulating layer 31 is formed at a temperature lower than or equal to the heat resistant temperature of the resin layer 23. The insulating layer 31 is preferably formed at a temperature lower than the heating temperature in the above-described postbake treatment.

The insulating layer 31 can be used as a barrier layer that prevents diffusion of impurities contained in the resin layer 23 into a transistor and a display element formed later. For example, the insulating layer 31 preferably has a function of preventing moisture or the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, a yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film.

In the case of using an inorganic insulating film as the insulating layer 31, the temperature during the formation of the insulating layer 31 is preferably higher than or equal to room temperature (25° C.) and lower than or equal to 350° C., further preferably higher than or equal to 100° C. and lower than or equal to 300° C.

In the case where the resin layer 23 has an uneven surface, the insulating layer 31 preferably covers the unevenness. The insulating layer 31 may function as a planarization layer that fills the unevenness. It is preferable to use a stack including an organic insulating material and an inorganic insulating material for the insulating layer 31, for example. As the organic insulating material, for example, a resin that can be used for the resin layer 23 can be used.

In the case of using an organic insulating film for the insulating layer 31, it is preferable to form the insulating layer 31 at a temperature higher than or equal to room temperature and lower than or equal to 350° C., further preferably at a temperature higher than or equal to room temperature and lower than or equal to 300° C.

Figure 2A:
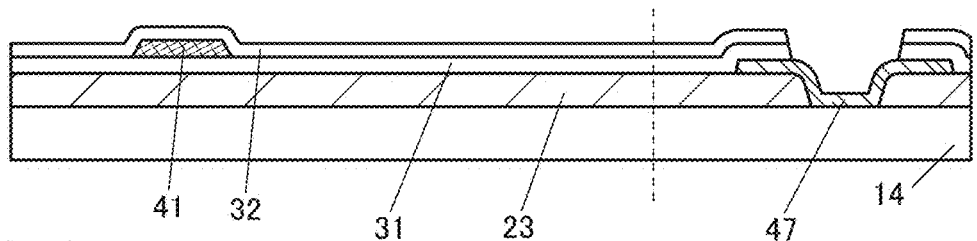
FIGS. 2A to 2C are diagrams illustrating an example of a manufacturing method of a flexible device.
Figure 2B:
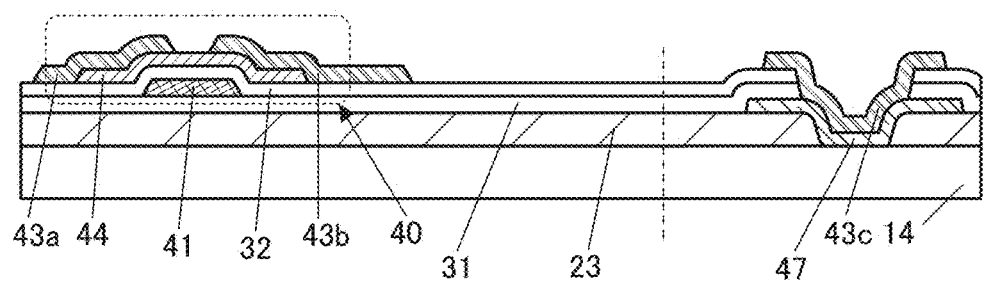

Next, the transistor 40 is formed over the insulating layer 31 (FIG. 1D and FIGS. 2A and 2B)

There is no particular limitation on the structure of the transistor in the display device. For example, a planar transistor, a staggered transistor, or an inverted staggered transistor may be used. Further, a top-gate transistor or a bottom-gate transistor may be used. Gate electrodes may be provided above and below a channel.

Here, the case where a bottom-gate transistor including an oxide semiconductor layer 44 is manufactured as the transistor 40 is described.

According to one embodiment of the present invention, an oxide semiconductor is used as a semiconductor of the transistor. A semiconductor material having a wider band gap and a lower carrier density than silicon is preferably used because off-state current of the transistor can be reduced.

Furthermore, the transistor 40 is formed at a temperature lower than or equal to the heat resistant temperature of the resin layer 23. The transistor 40 is preferably formed at a temperature lower than the heating temperature in the above-described postbake treatment.

Specifically, first, the conductive layer 41 is formed over the insulating layer 31 (FIG. 1D). The conductive layer 41 can be formed in the following manner: a conductive film is formed, a resist mask is formed, the conductive film is etched, and the resist mask is removed.

The conductive film is preferably formed at a temperature higher than or equal to room temperature and lower than or equal to 350° C., further preferably higher than or equal to room temperature and lower than or equal to 300° C.

The conductive layers included in the display panel can each have a single-layer structure or a stacked-layer structure containing any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO to which gallium is added, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film containing graphene may be used as well. The film containing graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed (FIG. 1D). For the insulating layer 32, the inorganic insulating film that can be used for the insulating layer 31 can be used.

Next, an opening is formed in a portion of the insulating layers 31 and 32 overlapping with the opening of the resin layer 23 (FIG. 2A). Here, an example where the opening is formed in the insulating layers 31 and 32 at one time is illustrated. The opening of the insulating layers 31 and 32 may be formed in different steps. For example, the opening may be formed in the insulating layer 31 before the conductive layer 41 is formed. By forming the opening, the second layer 47 covered by the insulating layers 31 and 32 is exposed.

Then, the oxide semiconductor layer 44 is formed (FIG. 2B). The oxide semiconductor layer 44 can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

Further, the oxide semiconductor film is formed using either of an inert gas and an oxygen gas. Note that there is no particular limitation on the flow rate ratio of oxygen (the partial pressure of oxygen) in the step of forming the oxide semiconductor film. In the case where a transistor having high field-effect mobility is obtained, the flow rate ratio of oxygen (the partial pressure of oxygen) in the step of forming the oxide semiconductor film is preferably higher than or equal to 0% and lower than or equal to 30%, further preferably higher than or equal to 5% and lower than or equal to 30%, still further preferably higher than or equal to 7% and lower than or equal to 15%.

The oxide semiconductor film preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

Examples of stabilizers are, in addition to the above-described metals that can be used as M, lanthanoids such as lanthanum, cerium, praseodymium, neodymium, samarium, europium, gadolinium, terbium, dysprosium, holmium, erbium, thulium, ytterbium, and lutetium.

As an oxide semiconductor, any of the following can be used, for example: an In—Ga—Zn-based oxide, an In—

Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the manufacturing cost can be reduced by using a metal oxide target with the same metal composition. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor is preferably 2 eV or more, further preferably 2.5 eV or more, and still further preferably 3 eV or more. The use of such an oxide semiconductor having a wide energy gap leads to a reduction in off-state current of the transistor.

In the case where the oxide semiconductor is an In-M-Zn-based oxide, it is preferable that the atomic ratio of metal elements of a sputtering target used for forming the In-M-Zn-based oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The oxide semiconductor film can be formed by a sputtering method. Note that instead of a sputtering method, a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of a thermal CVD method, a metal organic chemical vapor deposition (MOCVD) method can be given.

Next, conductive layers 43a, 43b, and 43c are formed (FIG. 2B). The conductive layers 43a, 43b, and 43c can be formed in the following manner: a conductive film is formed, a resist mask is formed, the conductive film is etched, and the resist mask is removed. The conductive layer 43a and the conductive layer 43b are connected to the oxide semiconductor layer 44. The conductive layer 43c is connected to the second layer 47 through the opening provided in the resin layer 23 and the insulating layers 31 and 32.

Note that during the processing of the conductive layer 43a and the conductive layer 43b, the oxide semiconductor layer 44 might be partly etched to be thin in a region not covered by the resist mask.

The conductive film is preferably formed at a temperature higher than or equal to room temperature and lower than or equal to 350° C., further preferably higher than or equal to room temperature and lower than or equal to 300° C.

In the above manner, the transistor 40 can be manufactured (FIG. 2B). In the transistor 40, part of the conductive layer 41 functions as a gate, part of the insulating layer 32 functions as a gate insulating layer, and the conductive layer 43a and the conductive layer 43b function as a source and a drain.

Note that although the case where the conductive layer 43c is formed at the same time as the conductive layers 43a and 43b is shown, the conductive layer 43c and the conductive layers 43a and 43b are not necessarily formed at the same time. For example, the conductive layer 43c may be formed at the same time as the conductive layer 41. In this case, after the insulating layer 31 is formed, the opening is formed in the insulating layer 31 in a portion that overlaps with the opening of the resin layer 23. Next, a conductive film is formed. The conductive layers 41 and 43c are formed in the following manner: a resist mask is formed, the conductive film is etched, and the resist mask is removed.

Figure 2C:
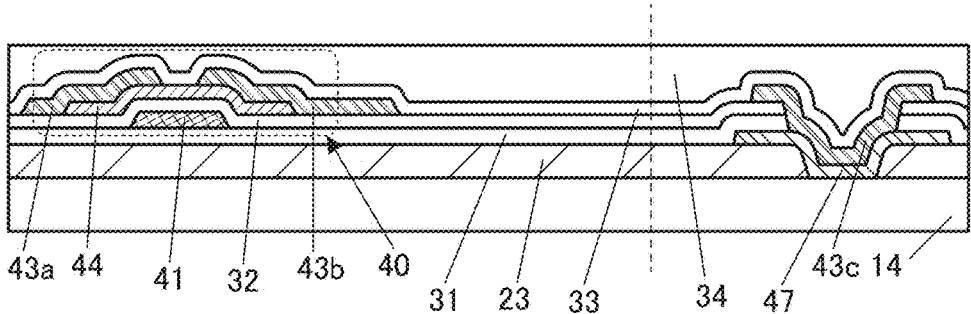

After that, the insulating layer 33 that covers the transistor 40 is formed (FIG. 2C). The insulating layer 33 can be formed in a manner similar to that of the insulating layer 31.

It is preferable to use an oxide insulating film, such as a silicon oxide film or a silicon oxynitride film, formed at a low temperature in the above range in an atmosphere containing oxygen for the insulating layer 33. An insulating film with low oxygen diffusibility and oxygen permeability, such as a silicon nitride film, is preferably stacked over the silicon oxide or the silicon oxynitride film. The oxide insulating film formed at low temperatures in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer 44. As a result, oxygen vacancies in the oxide semiconductor layer 44 can be filled and defects at the interface between the oxide semiconductor layer 44 and the insulating layer 33 can be repaired, leading to a reduction in defect levels. Accordingly, a flexible device having high reliability can be provided.

Through the above steps, the insulating layer 31, the transistor 40, and the insulating layer 33 can be formed over the resin layer 23 (FIG. 2C).

If the formation substrate 14 and the transistor 40 are separated from each other at this stage by a method described later, a flexible device including no display element can be manufactured. A flexible device including a semiconductor circuit can be manufactured by forming the transistor 40 and forming a capacitor, a resistor, a wiring, and the like, for example.

Then, the insulating layer 34 is formed over the insulating layer 33 (FIG. 2C). The display element is formed over the insulating layer 34 in a later step; thus, the insulating layer 34 preferably functions as a planarization layer. For the insulating layer 34, the organic insulating film or the inorganic insulating film that can be used for the insulating layer 31 can be used.

The insulating layer 34 is formed at a temperature lower than or equal to the heat resistant temperature of the resin layer 23. The insulating layer 34 is preferably formed at a temperature lower than the heating temperature in the above-described postbake treatment.

In the case of using an organic insulating film for the insulating layer 34, it is preferable to form the insulating layer 34 at a temperature higher than or equal to room temperature and lower than or equal to 350° C., further preferably at a temperature higher than or equal to room temperature and lower than or equal to 300° C.

In the case of using an inorganic insulating film for the insulating layer 34, it is preferable to form the insulating layer 34 at a temperature higher than or equal to room temperature and lower than or equal to 350° C., further preferably a temperature higher than or equal to 100° C. and lower than or equal to 300° C.

Next, an opening that reach the conductive layer 43b and the like are formed in the insulating layer 34 and the insulating layer 33.

Figure 3A:
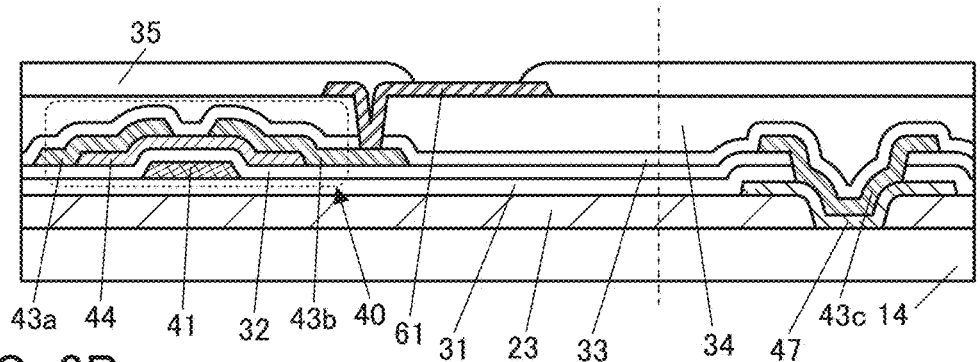
FIGS. 3A to 3C are diagrams illustrating an example of a manufacturing method of a flexible device.

After that, a conductive layer 61 is formed (FIG. 3A). Part of the conductive layer 61 functions as a pixel electrode of the display element 60. The conductive layer 61 can be formed in the following manner: a conductive film is formed, a resist mask is formed, the conductive film is etched, and the resist mask is removed.

Furthermore, the conductive layer 61 is formed at a temperature lower than or equal to the heat resistant temperature of the resin layer 23. The conductive layer 61 is preferably formed at a temperature lower than the heating temperature in the above-described postbake treatment.

The conductive film is preferably formed at a temperature higher than or equal to room temperature and lower than or equal to 350° C., further preferably higher than or equal to room temperature and lower than or equal to 300° C.

Subsequently, the insulating layer 35 that covers an end portion of the conductive layer 61 is formed (FIG. 3A). For the insulating layer 35, the organic insulating film or the inorganic insulating film that can be used for the insulating layer 31 can be used.

The insulating layer 35 is formed at a temperature lower than or equal to the heat resistant temperature of the resin layer 23. The insulating layer 35 is preferably formed at a temperature lower than the heating temperature in the above-described postbake treatment.

In the case of using an organic insulating film as the insulating layer 35, it is preferable to form the insulating layer 35 at a temperature higher than or equal to room temperature and lower than or equal to 350° C., further preferably higher than or equal to room temperature and lower than or equal to 300° C.

In the case of using an inorganic insulating film for the insulating layer 35, it is preferable to form the insulating layer 35 at a temperature higher than or equal to room temperature and lower than or equal to 350° C., further preferably higher than or equal to 100° C. and lower than or equal to 300° C.

Figure 3B:
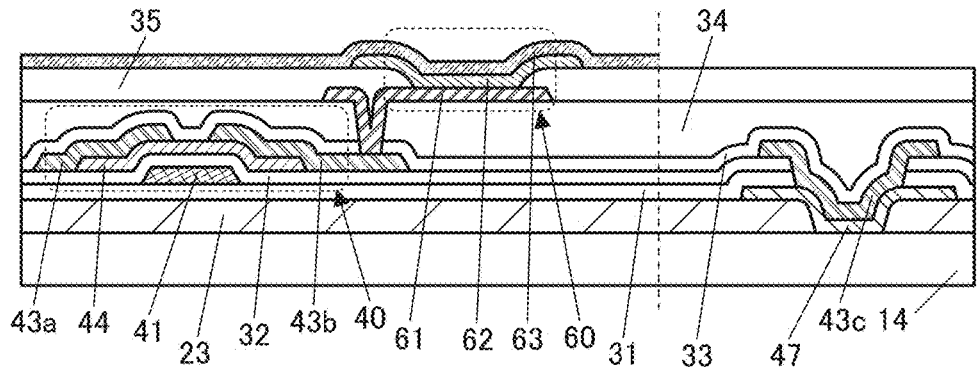

Then, the EL layer 62 and the conductive layer 63 are formed (FIG. 3B). Part of the conductive layer 63 functions as a common electrode of the display element 60.

The EL layer 62 can be formed by an evaporation method, a coating method, a printing method, a discharge method, or the like. In the case where the EL layer 62 is formed for each individual pixel, an evaporation method using a shadow mask such as a metal mask, an ink-jet method, or the like can be used. In the case of sharing the EL layer 62 by some pixels, an evaporation method not using a metal mask can be used.

For the EL layer 62, either a low molecular compound or a high molecular compound can be used, and an inorganic compound may also be used.

The conductive layer 63 can be formed by an evaporation method, a sputtering method, or the like.

The EL layer 62 and the conductive layer 63 are each formed at a temperature lower than or equal to the heat resistant temperature of the resin layer 23. The EL layer 62 and the conductive layer 63 are preferably formed at a temperature lower than the heating temperature in the above-described postbake treatment.

Specifically, the EL layer 62 and the conductive layer 63 are each preferably formed at a temperature higher than or equal to room temperature and lower than or equal to 350° C., further preferably higher than or equal to 100° C. and lower than or equal to 300° C.

In the above manner, the display element 60 can be formed. In the display element 60, the conductive layer 61 part of which functions as a pixel electrode, the EL layer 62, and the conductive layer 63 part of which functions as a common electrode are stacked.

Although an example of manufacturing a top-emission light-emitting element as the display element 60 is shown here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 3C:
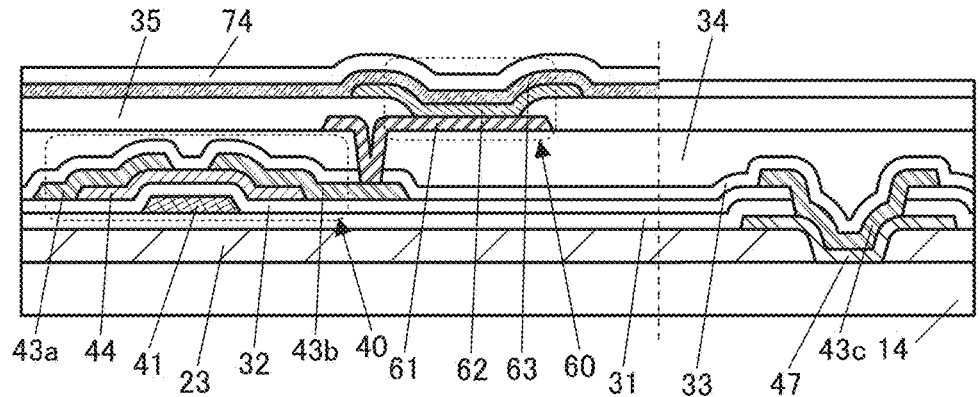

Next, the insulating layer 74 is formed so as to cover the conductive layer 63 (FIG. 3C). The insulating layer 74 functions as a protective layer that prevents diffusion of impurities such as water into the display element 60. The display element 60 is sealed with the insulating layer 74.

The insulating layer 74 is formed at a temperature which is lower than or equal to the heat resistant temperature of the resin layer 23 and lower than or equal to the heat resistant temperature of the display element 60. The insulating layer 74 is preferably formed at a temperature lower than the heating temperature in the above-described postbake treatment.

The insulating layer 74, for example, preferably contains an inorganic insulating film with a high barrier property that can be used for the above-described insulating layer 31. A stack including an inorganic insulating film and an organic insulating film can also be used.

Figure 4A:
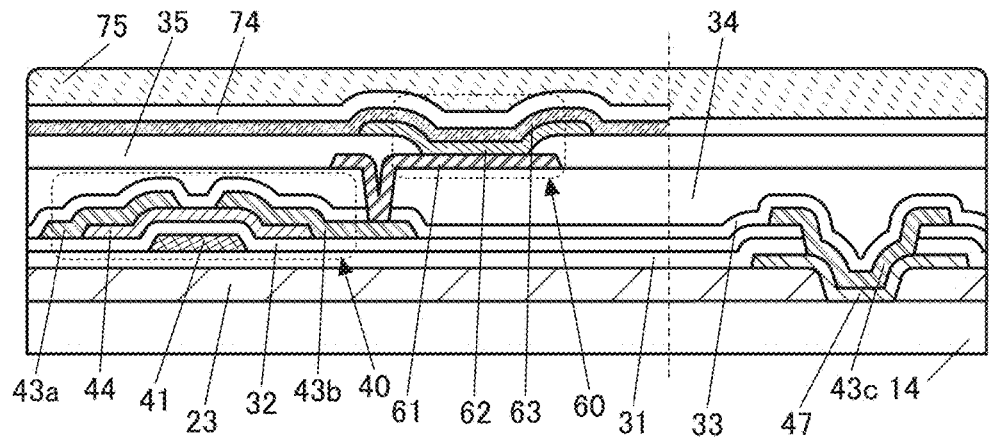
FIGS. 4A to 4C are diagrams illustrating an example of a manufacturing method of a flexible device.

Then, the protective layer 75 is formed over the insulating layer 74 (FIG. 4A). The protective layer 75 can be used as a layer positioned on the outermost surface of the display device 10. The protective layer 75 preferably has a high visible-light transmitting property.

The above-described organic insulating film that can be used for the insulating layer 31 is preferably used for the protective layer 75 because the surface of the display device can be prevented from being damaged or cracked. Furthermore, in the protective layer 75, a hard coat layer (e.g., a silicon nitride layer) by which a surface is protected from damage, a layer (e.g., an aramid resin layer) that can disperse pressure, or the like may be stacked.

Figure 4B:
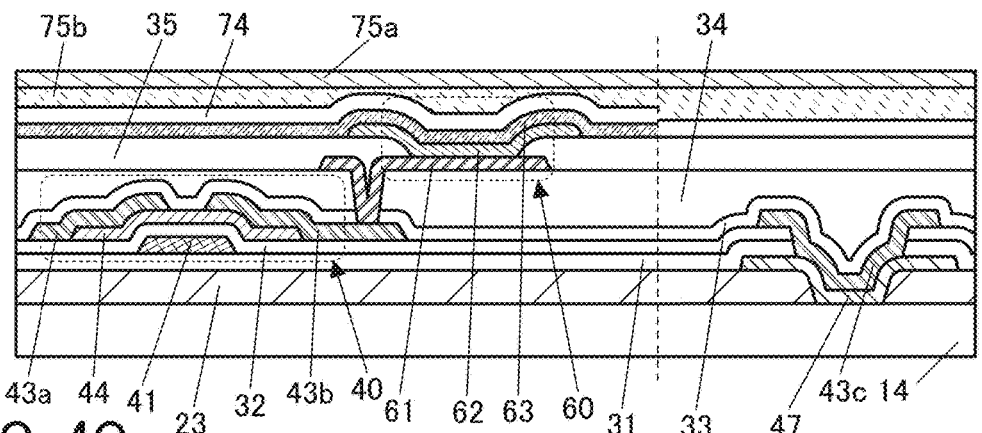

FIG. 4B illustrates an example where the substrate 75a is attached to the insulating layer 74 with the adhesive layer 75b. As an example of the substrate 75a, a resin can be given. The substrate 75a preferably has flexibility.

Any of a variety of curable adhesives, e.g., light curable adhesives such as a UV curable adhesive, a reactive curable adhesive, a thermal curable adhesive, and an anaerobic adhesive can be used for the adhesive layer 75b. Still alternatively, an adhesive sheet or the like may be used.

Examples of materials that can be used for the substrate 75a include polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber.

Figure 4C:
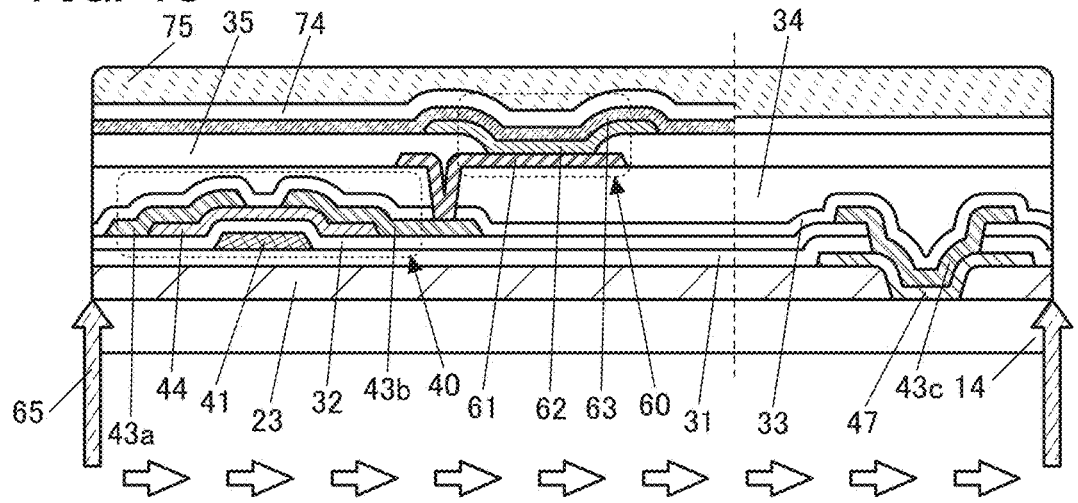

Next, the resin layer 23 and the second layer 47 are irradiated with a laser light 65 through the formation substrate 14 (FIG. 4C). The laser light 65 is a linear laser beam with which scanning is performed from the left to the right in FIG. 4C, for example, and the major axis is perpendicular to the scanning direction and the incident direction (from the bottom to the top).

By the irradiation with the laser light 65, the second layer 47 is heated and in the case where the second layer 47 is a silicon layer, hydrogen is released from the second layer 47. Further, when the second layer 47 is an oxide layer, oxygen is released from the second layer 47 in some cases. At this time, hydrogen or oxygen is released in a gaseous state. The released gas remains near the interface between the second layer 47 and the conductive layer 43c or near the interface between the second layer 47 and the formation substrate 14; thus, the force of separation occurs therebetween. Consequently, the adhesion between the second layer 47 and the conductive layer 43c or the adhesion between the second layer 47 and the formation substrate 14 is reduced to make a state where separation of the formation substrate 14 is easily performed.

With irradiation with the laser light 65, the chemical bond of a molecule in the resin layer 23 is broken. For example, in the case where the resin layer 23 includes the polyimide resin, the chemical bond of the polyimide is broken. Thus, a state where separation of the formation substrate 14 is easily performed can be obtained.

Part of the hydrogen or oxygen released from the second layer 47 remains in the second layer 47 in some cases. Thus, the second layer 47 may be embrittled and separation is likely to occur inside the second layer 47.

As the laser light 65, light, at least part of which has a wavelength such that the light passes through the formation substrate 14 and is absorbed by the resin layer 23 and the second layer 47, is used. The laser light 65 is preferably in a wavelength range from visible light to ultraviolet light. For example, light with a wavelength in a range of 200 nm to 400 nm, preferably a range of 250 nm to 350 nm can be used. In particular, an excimer laser with a wavelength of 308 nm is preferably used because the productivity is increased. An excimer laser is preferable because the excimer laser is used also for laser crystallization of LTPS, so that an apparatus for an existing LTPS production line can be used and new capital investment is not necessary. A solid-state UV laser (also referred to as a semiconductor UV laser), such as a UV laser with a wavelength of 355 nm that is the third harmonic of a Nd:YAG laser, may be used. A solid-state laser is preferable because it does not use a gas and thus the running cost can be reduced to approximately ⅓ of the case of using an excimer laser. A pulsed laser such as a picosecond laser may be used.

In the case where linear laser light is used as the laser light 65, the formation substrate 14 and a light source are relatively moved to perform scanning with the laser light 65; in this way, a region that is desirably separated is irradiated with the laser light 65.

The resin layer 23 absorbs part of the laser light 65; thus, an element such as a transistor is irradiated with the laser light 65 and an adverse effect on the characteristics of the element can be suppressed.

Figure 5A:
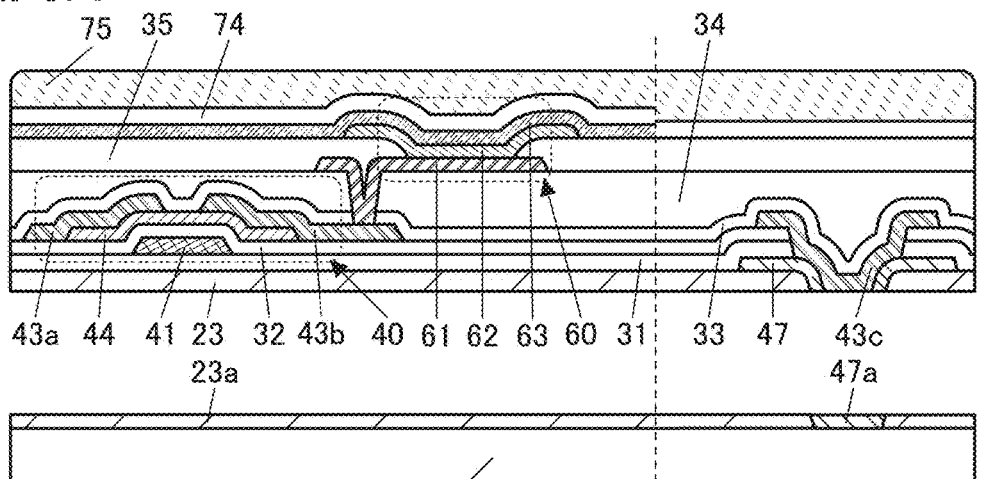
FIGS. 5A to 5C are diagrams illustrating an example of a manufacturing method of a flexible device.
Figure 5B:
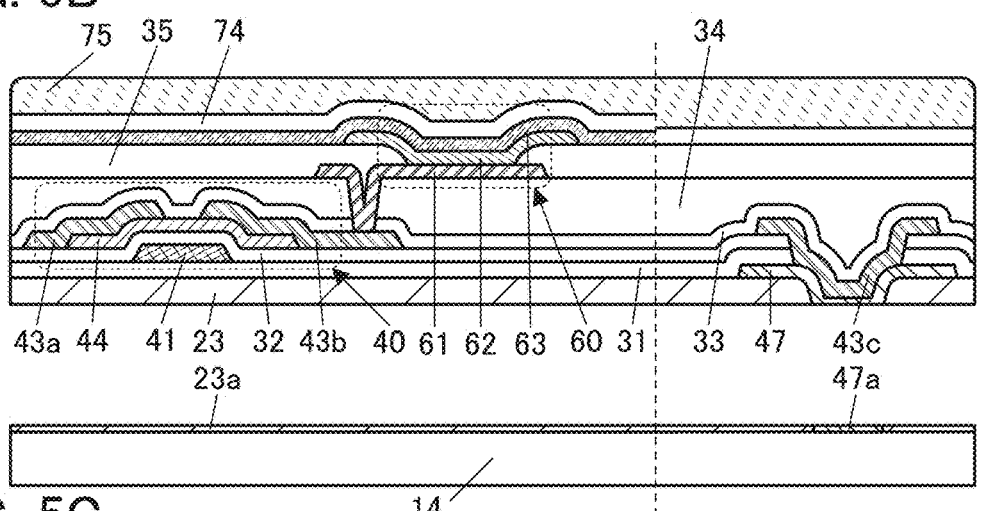
Figure 5C:
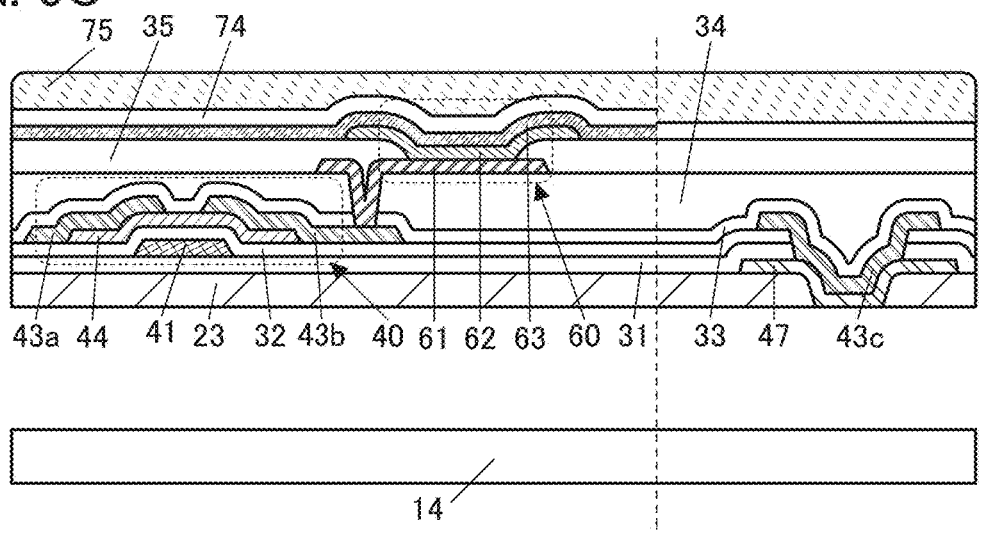

Next, the formation substrate 14 and the transistor 40 are separated from each other (FIG. 5A, 5B, or 5C).

FIG. 5A illustrates an example where separation occurs at the interface between the second layer 47 and the conductive layer 43c, and in the resin layer 23. Part of the second layer (a second layer 47a) and part of the resin layer (a resin layer 23a) remain over the formation substrate 14. The surface of the conductive layer 43c is exposed and the resin layer 23 remaining over the conductive layer 43c side becomes thinner than the resin layer 23 of FIG. 4C.

FIG. 5B illustrates an example where separation occurs in the second layer 47 and the resin layer 23. Part of the second layer (a second layer 47a) and part of the resin layer (a resin layer 23a) remain over the formation substrate 14. The surface of the conductive layer 43c is not exposed and the second layer 47 and the resin layer 23 remaining over the conductive layer 43c side becomes thinner than the second layer 47 and the resin layer 23 of FIG. 4C.

FIG. 5C illustrates an example where separation occurs at the interface between the second layer 47 and the formation substrate 14 and the interface between the resin layer 23 and the formation substrate 14. The second layer does not remain over the formation substrate 14. Further, the surface of the conductive layer 43c is not exposed. Note that the resin layer 23 does not remain over the formation substrate 14 in FIG. 5C; however, part of the resin layer remains over the formation substrate 14 in some cases.

The formation substrate 14 can be reused by removing the resin layer 23a and the second layer 47a remaining over the formation substrate 14 side.

The formation substrate 14 can be separated by applying a perpendicular tensile force to the resin layer 23 and the second layer 47, for example. Specifically, the formation substrate 14 can be separated by pulling up the protective layer 75 by part of its suction-attached top surface.

By inserting a sharp instrument such as a knife between the formation substrate 14 and the insulating layer 31, the separation starting point is preferably formed.

Figure 6A:
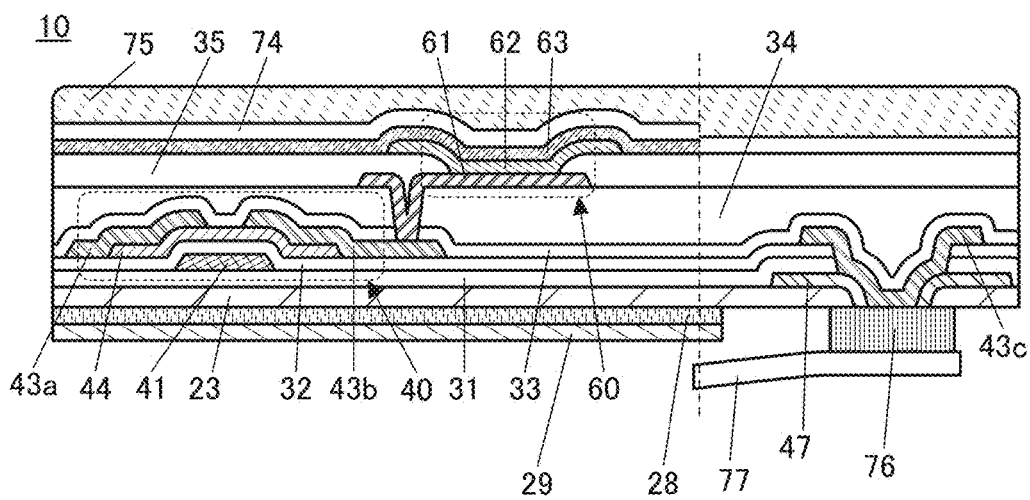
FIGS. 6A and 6B are diagrams each illustrating an example of a flexible device.

The separation of the formation substrate 14 and the transistor 40 can complete the display device 10 (FIG. 6A). The display device 10 can remain bent or can be bent repeatedly, for example.

As illustrated in FIG. 6A, a substrate 29 may be bonded to the surface of the resin layer 23 exposed by separation, by an adhesive layer 28. Note that the substrate 29 and the adhesive layer 28 are positioned so as not to overlap with the conductive layer 43c. The substrate 29 can function as a supporting substrate of the flexible device. FIG. 6A illustrates an example where the substrate 29 is bonded to the resin layer 23 with the adhesive layer 28.

The substrate 29 can be formed using the material that can be used for the substrate 75a.

The conductive layer 43c and an FPC 77 are electrically connected to each other through a connector 76. FIG. 6A illustrates the case where the conductive layer 43c is exposed and electrically connected to the FPC 77.

As the connector 76, any of various anisotropic conductive films (ACF), anisotropic conductive pastes (ACP), and the like can be used.

An example where a top-emission light-emitting element is used is described in one embodiment of the present invention. Since the protective layer 75 side is the display surface side in the case where the conductive layer 43c or the second layer 47 is exposed from the protective layer 75 side and electrically connected to the FPC 77, the display region and the FPC 77 cannot overlap with each other and thus, there is a limit in the region where the FPC 77 overlaps with the display device. According to one embodiment of the present invention, a photosensitive material is used as the resin layer 23 and thus, the conductive layer 43c or the second layer 47 can be exposed from the surface opposite to the display surface. Therefore, the conductive layer 43c and the FPC 77 can be electrically connected to each other through an opening provided in the resin layer 23. Such a structure allows the FPC 77 to be positioned on the side opposite to the display surface. Thus, a space for bending the FPC 77 in incorporating a display device in an electronic device can be eliminated, which enables the electronic device to be smaller.

Through the above steps, the display device using an oxide semiconductor for the transistor and a separate coloring method for an EL element can be fabricated (FIG. 6A).

Figure 6B:
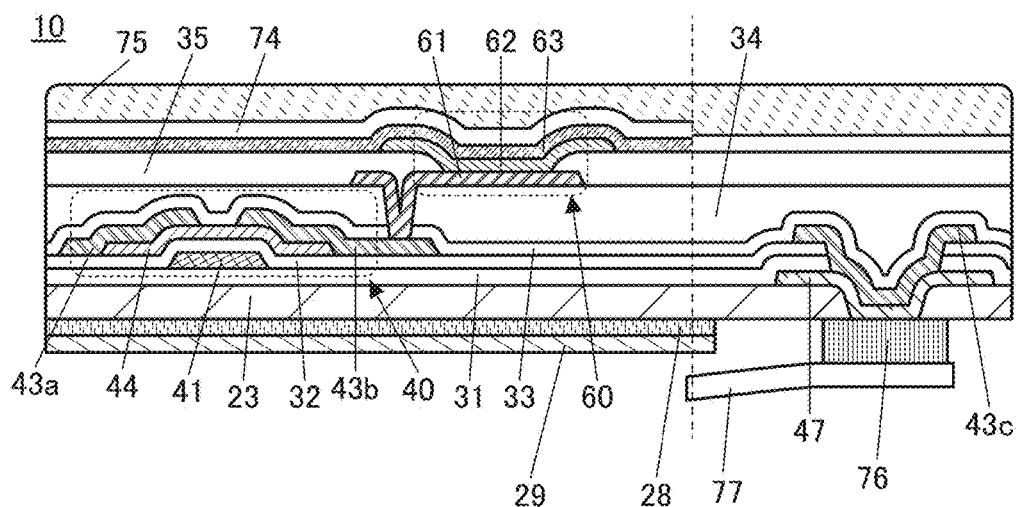

In the case where the conductive layer 43c is not exposed, the second layer 47 is in contact with the connector 76 as illustrated in FIG. 6B. In this case, the conductive layer 43c is electrically connected to the FPC 77 through the connector 76 and the second layer 47. In the structure illustrated in FIG. 6B, a low-resistant silicon layer or the oxide layer is preferably used as the second layer 47.

Manufacturing Method Example 2

Figure 7A:
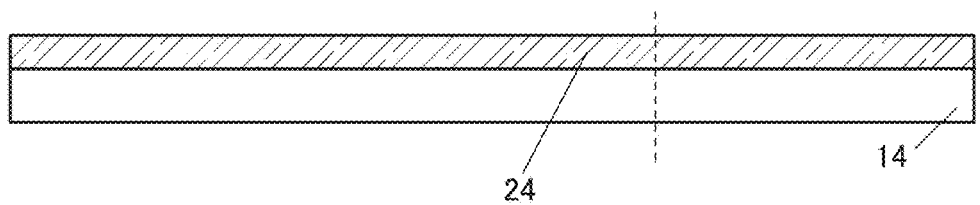
FIGS. 7A to 7D are diagrams illustrating an example of a manufacturing method of a flexible device.
Figure 7B:
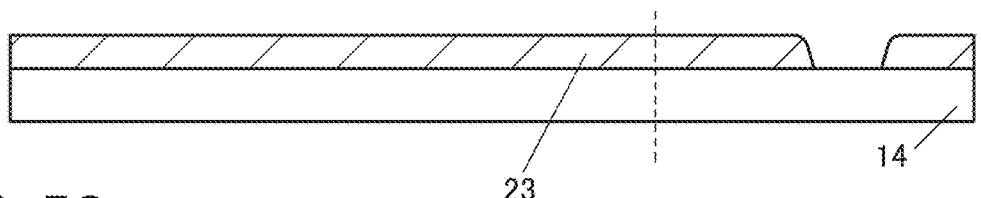

First, in a manner similar to that in the manufacturing method example 1, a resin layer 23 including the opening reaching the formation substrate 14 is formed over the formation substrate 14 (FIGS. 7A and 7B).

Figure 7C:
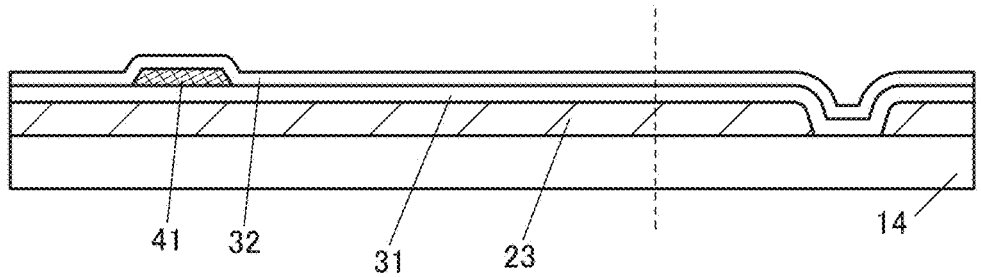

Next, the insulating layer 31 is formed over the resin layer 23 (FIG. 7C). Then, the transistor 40 is formed over the insulating layer 31 (FIGS. 7C and 7D and FIGS. 8A and 8B).

Specifically, first, the conductive layer 41 is formed over the insulating layer 31 (FIG. 7C). Next, the insulating layer 32 is formed (FIG. 7C).

Figure 7D:
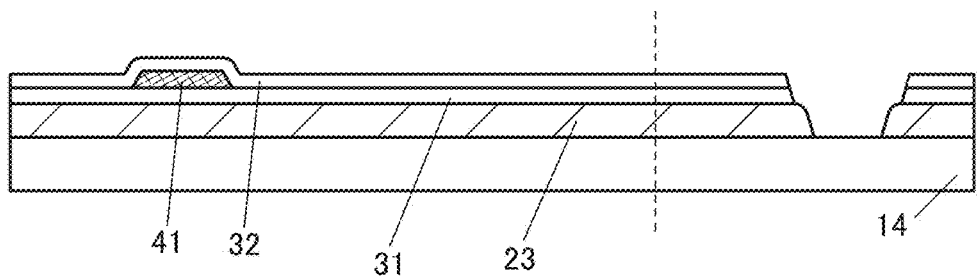

Next, an opening is formed in a portion of the insulating layers 31 and 32 overlapping with the opening in the resin layer 23 (FIG. 7D). Here, an example where the opening is formed in the insulating layers 31 and 32 at one time is illustrated. The opening of the insulating layers 31 and 32 may be formed in different steps. For example, the opening may be formed in the insulating layer 31 before the conductive layer 41 is formed. By forming the opening, the formation substrate 14 covered by the insulating layers 31 and 32 is exposed.

Figure 8A:
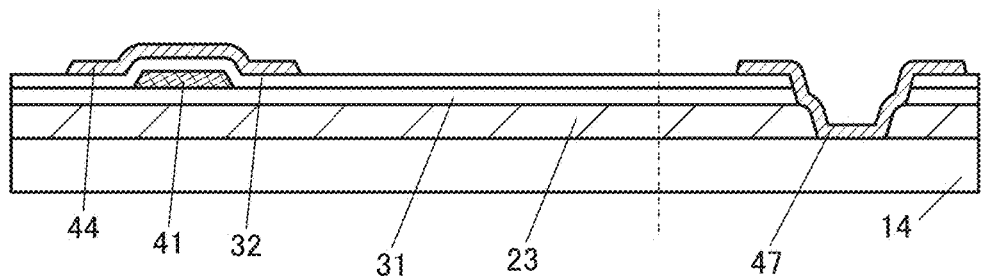
FIGS. 8A to 8C are diagrams illustrating an example of a manufacturing method of a flexible device.

Subsequently, a second layer 47 is formed. Further, the oxide semiconductor layer 44 is formed (FIG. 8A). Note that the second layer 47 and the oxide semiconductor layer 44 may be formed at the same time. After the opening is formed in the insulating layers 31 and 32, the oxide semiconductor film is formed. The second layer 47 and the oxide semiconductor layer 44 can be formed at the same time in the following manner: a resist mask is formed, an oxide semiconductor film is etched, and a resist mask is removed. In this case, the second layer 47 is an oxide layer, and the composition and thickness of the second layer 47 are the same as those of the oxide semiconductor layer 44. Note that after the second layer 47 and the oxide semiconductor layer 44 are formed, hydrogen, boron, phosphorus, or nitrogen may be injected only to the second layer 47, for example. Thus, the transistor 40 can be prevented from being normally-on and the resistivity of the second layer 47 can be reduced.

By forming the second layer 47 and the oxide semiconductor layer 44 at the same time, the manufacturing process of the flexible device of one embodiment of the present invention can be simplified. In the case where the second layer 47 and the oxide semiconductor layer 44 are formed in different steps, the second layer 47 and the oxide semiconductor layer 44 can have different compositions and thicknesses. Furthermore, in the case where the second layer 47 and the oxide semiconductor layer 44 are formed in different steps, the second layer 47 can be a silicon layer, for example.

Figure 8B:
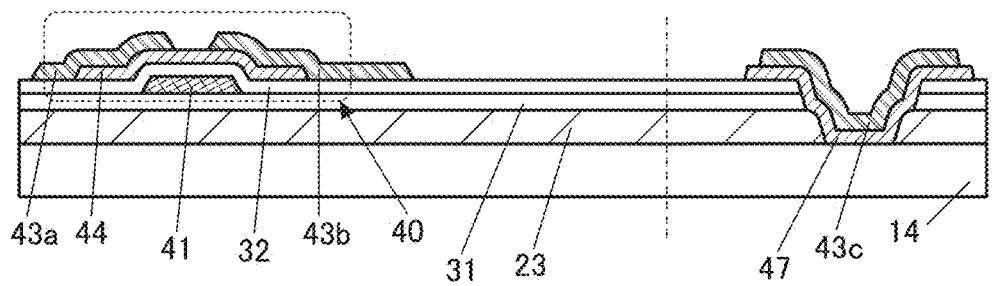
Figure 8C:
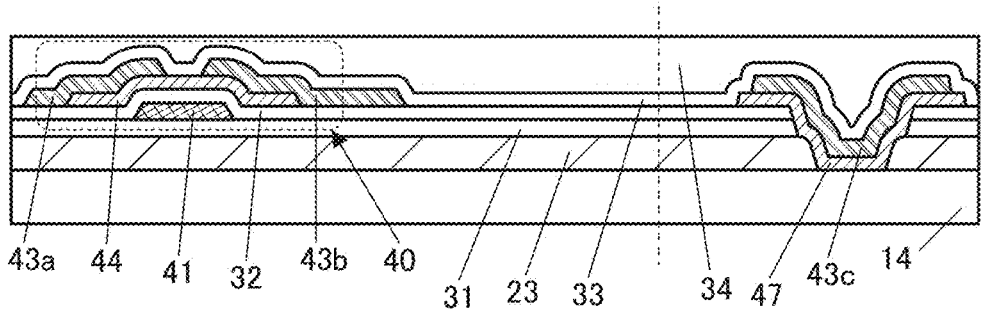
Figure 9A:
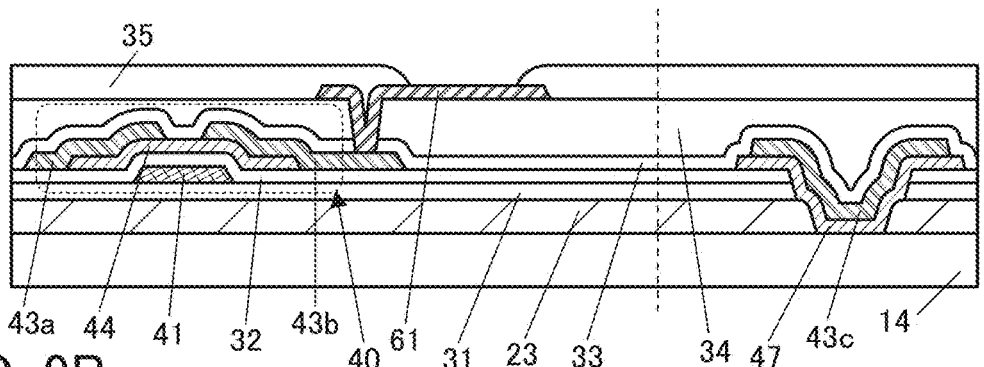
FIGS. 9A to 9C are diagrams illustrating an example of a manufacturing method of a flexible device.
Figure 9B:
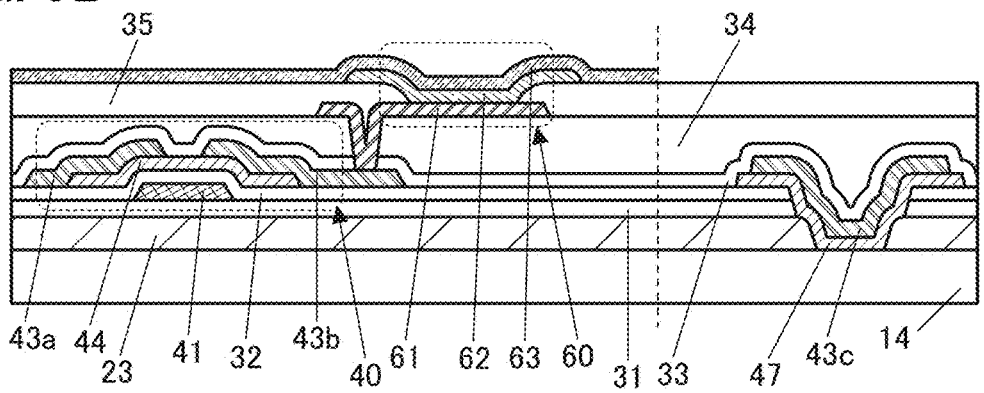
Figure 9C:
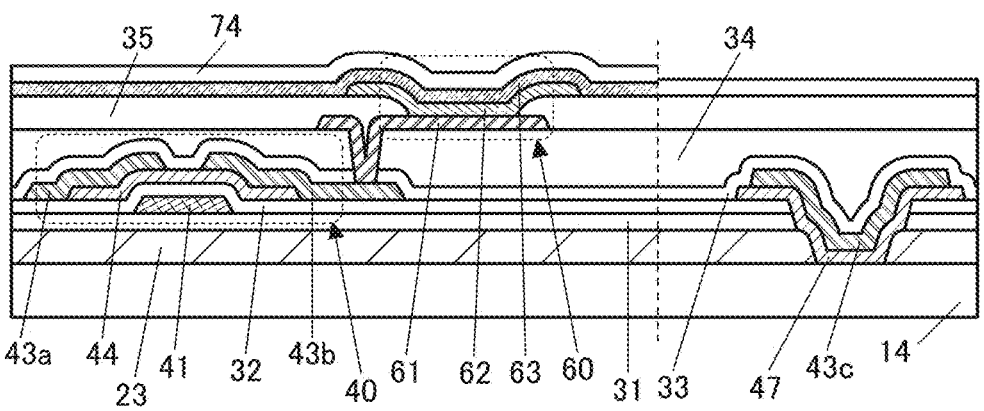
Figure 10A:
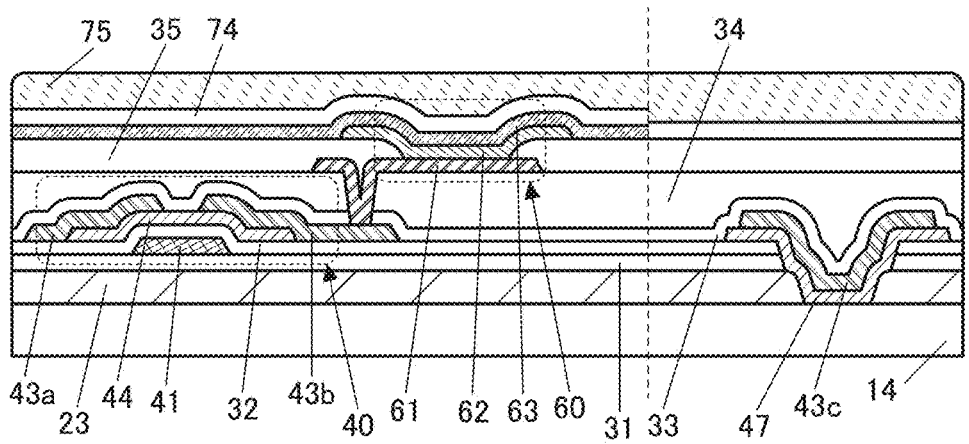
FIGS. 10A to 10C are diagrams illustrating an example of a manufacturing method of a flexible device.
Figure 10B:
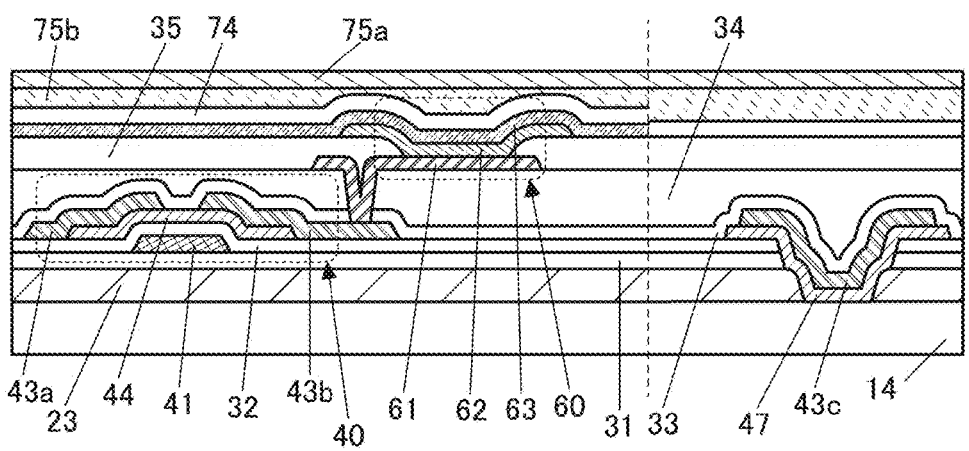
Figure 10C:
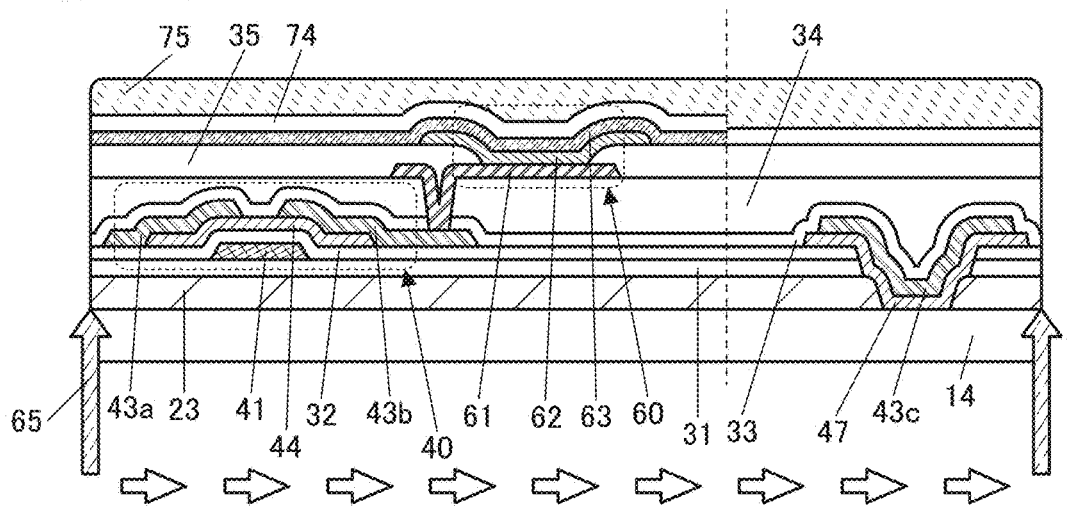
Figure 11A:
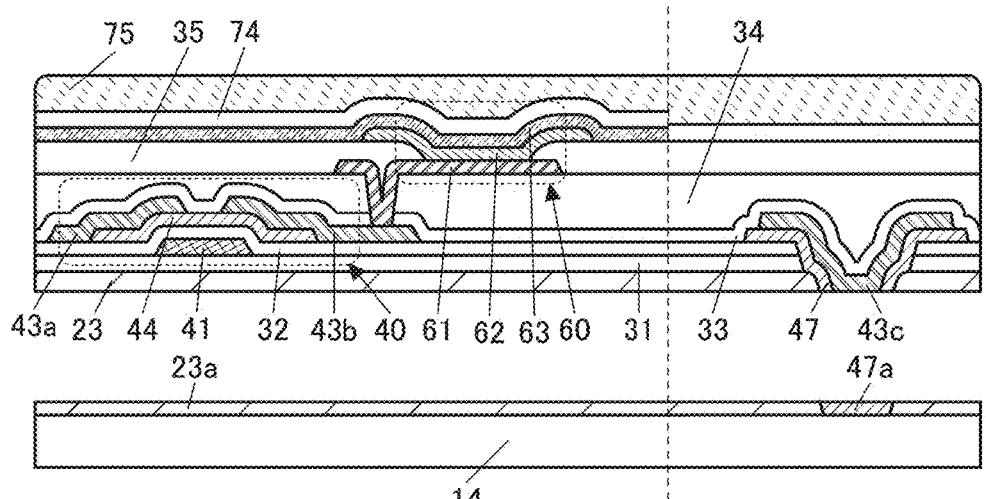
FIGS. 11A to 11C are diagrams illustrating an example of a manufacturing method of a flexible device.
Figure 11B:
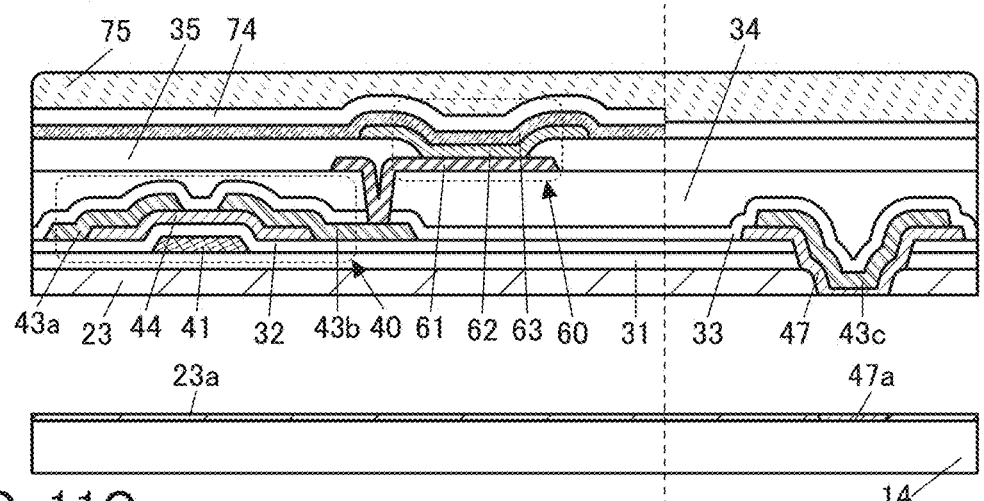
Figure 11C:
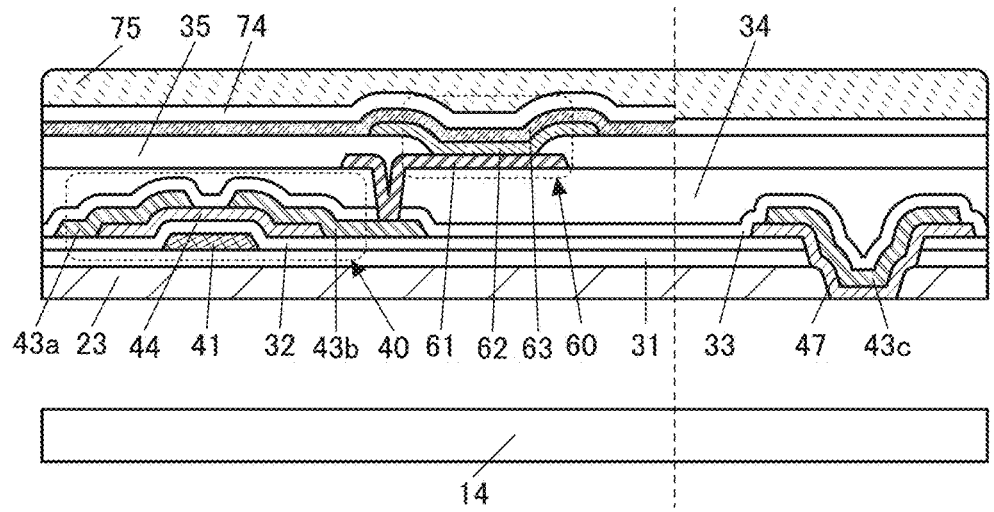

Next, the conductive layers 43a, 43b, and 43c are formed (FIG. 8B). The conductive layer 43a and the conductive layer 43b are connected to the semiconductor layer 44. The conductive layer 43c is connected to the second layer 47 through the opening provided in the resin layer 23 and the insulating layers 31 and 32. In the above manner, the transistor 40 can be manufactured (FIG. 8B).

The steps illustrated in FIG. 8C, FIGS. 9A to 9C, FIGS. 10A to 10C, FIGS. 11A to 11C, and FIGS. 12A and 12B are similar to those shown in FIGS. 3A to 3C, FIGS. 4A to 4C, FIGS. 5A to 5C, and FIGS. 6A and 6B.

Manufacturing Method Example 3

Figure 13A:
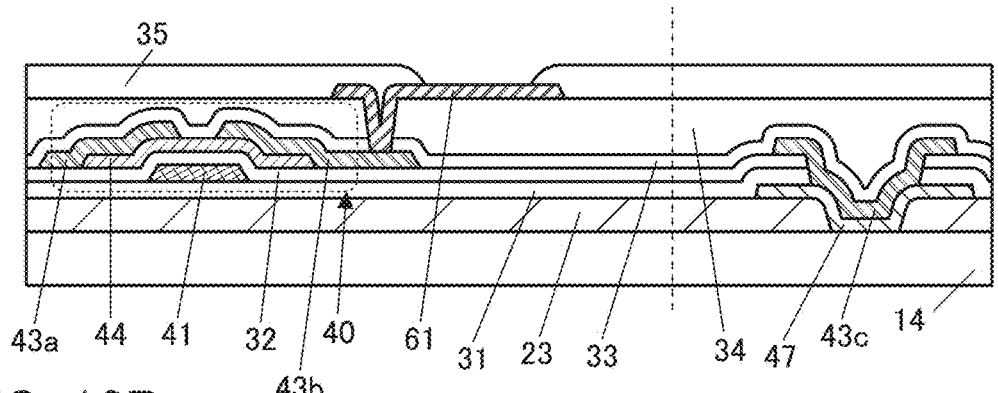
FIGS. 13A to 13C are diagrams illustrating an example of a manufacturing method of a flexible device.

First, components from the resin layer 23 to the insulating layer 35 are formed in order over the formation substrate 14 in a manner similar to that in the manufacturing method example 1 (FIG. 13A).

Figure 13B:
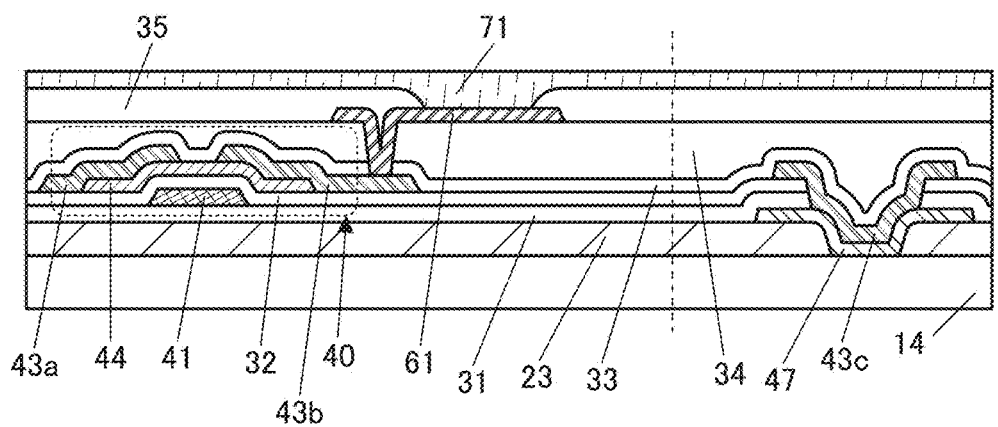

Then, the protective layer 71 is formed as illustrated in FIG. 13B.

The protective layer 71 has a function of protecting surfaces of the insulating layer 35 and the conductive layer 61 in steps after the separation step. The protective layer 71 can be formed using a material that can be easily removed.

For the protective layer 71 that can be removed, a water-soluble resin can be used, for example. The water-soluble resin is applied to an uneven surface to cover the unevenness, which facilitates the protection of the surface. A stack of the water-soluble resin and an adhesive that can be separated by light or heat may be used for the protective layer 71 that can be removed.

Alternatively, for the protective layer 71 that can be removed, a base material having a property in which adhesion is strong in a normal state but weakened when irradiated with light or heated may be used. For example, a thermal separation tape whose adhesion is weakened by heat, a UV-separation tape whose adhesion is weakened by ultraviolet irradiation, or the like may be used. Alternatively, a weak adhesion tape with weak adhesiveness in a normal state, or the like can be used.

Figure 13C:
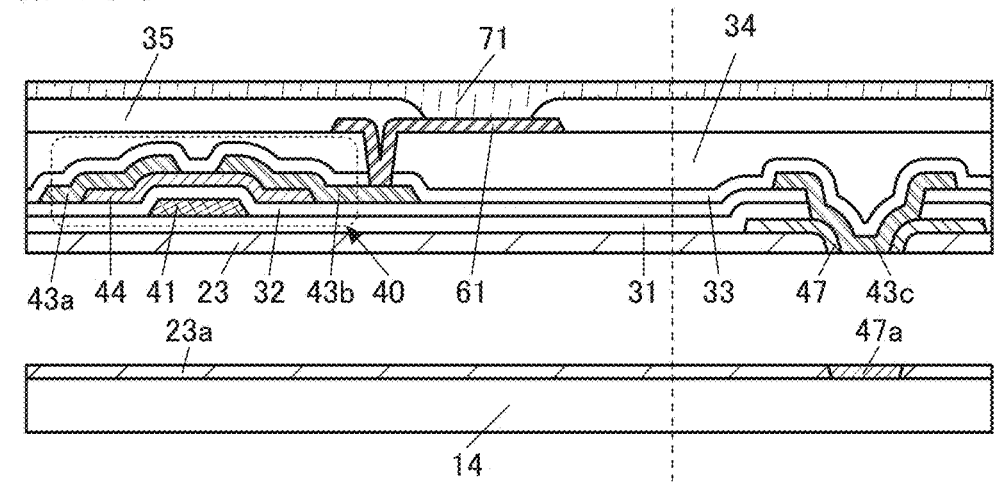

Then, the formation substrate 14 and the transistor 40 are separated from each other in a manner similar to that in the manufacturing method example 1 (FIG. 13C). FIG. 13C illustrates an example where separation occurs at the interface between the second layer 47 and the conductive layer 43c, and in the resin layer 23. By the separation, the resin layer 23 and the conductive layer 43c are exposed.

After the formation substrate 14 and the transistor 40 are separated from each other, the protective layer 71 is removed.

Then, the EL layer 62 and the conductive layer 63 are formed, whereby the display element 60 is completed. Thus, by sealing the display element 60, the display device 10 can be completed. For sealing of the display element 60, one or more of the insulating layer 74, the protective layer 75, the substrate 75a, the adhesive layer 75b, and the like can be used.

Although the EL layer 62 and the conductive layer 63 may be formed while the resin layer 23 and the conductive layer 43c are fixed to a stage of a deposition apparatus, they are preferably formed while the resin layer 23 and the conductive layer 43c are fixed to a supporting substrate by a tape or the like and the supporting substrate is placed on the stage of the deposition apparatus. Fixing the resin layer 23 and the conductive layer 43c to the supporting substrate facilitates the transfer of the resin layer 23 and the conductive layer 43c.

In the manufacturing method example 3, the EL layer 62 and the conductive layer 63 can be formed after the separation of the formation substrate 14. In the case where the stacked layer structure of the EL layer 62 and the like include a portion having a low adhesion, forming these layers after the separation can suppress a reduction in the yield of separation. Thus, by using the manufacturing method example 3, the material can be selected more freely, leading to fabrication of a highly reliable display device at lower cost.

Figure 14A:
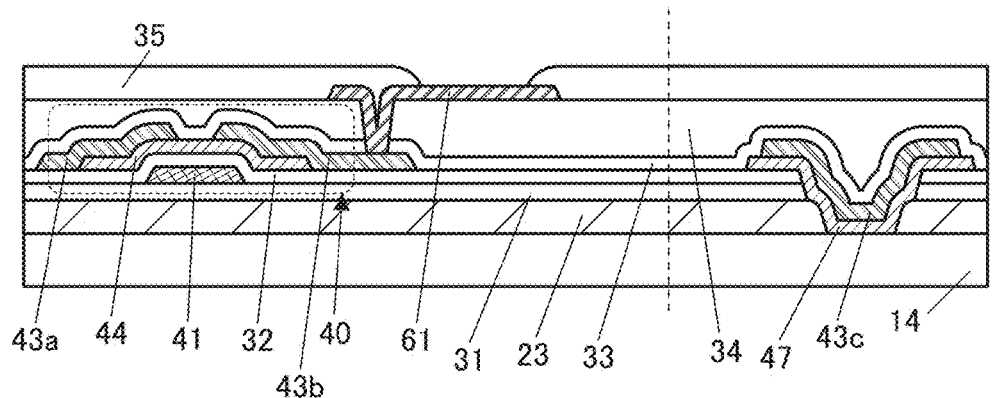
FIGS. 14A to 14C are diagrams illustrating an example of a manufacturing method of a flexible device.
Figure 14B:
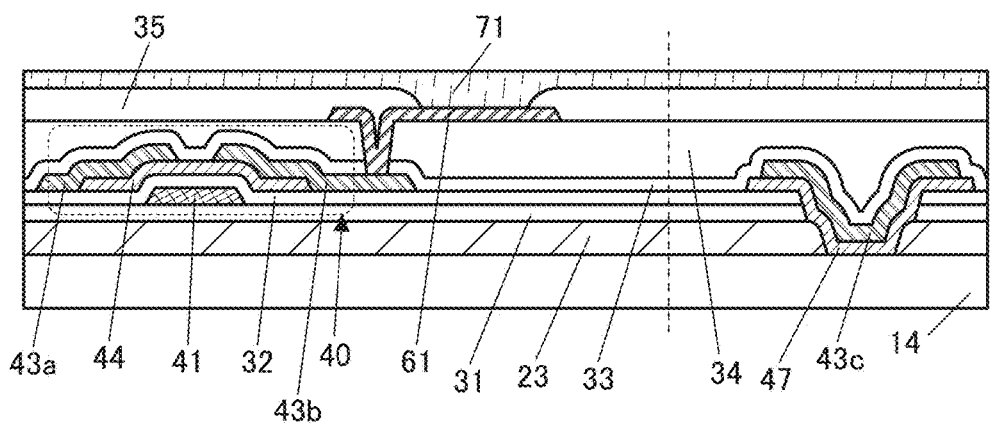
Figure 14C:
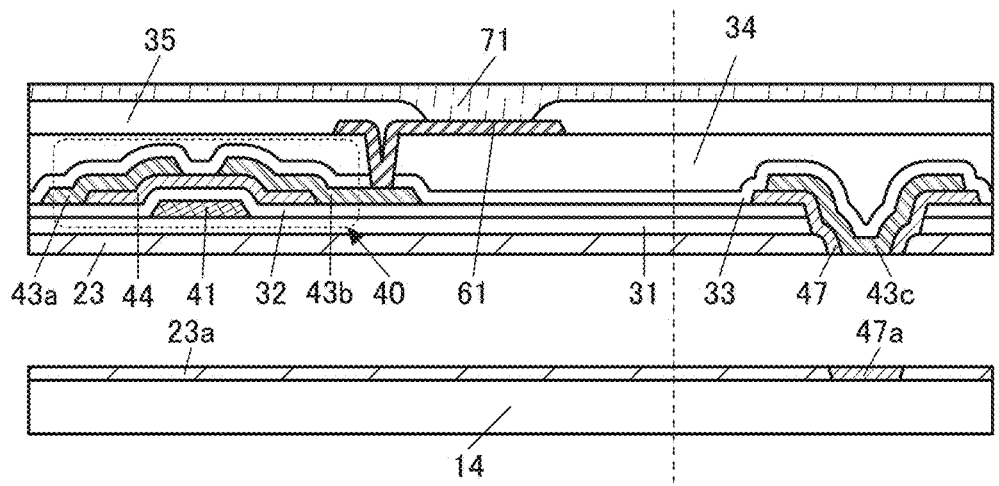

FIG. 14A illustrates the step for forming the components from the resin layer 23 to the insulating layer 35 similar to that of the manufacturing method example 2. Note that the step illustrated in FIGS. 14B and 14C is similar to that illustrated in FIGS. 13B and 13C.

As described above, in one embodiment of the present invention, a flexible device can be manufactured by separating the transistor or the like from the formation substrate using the oxide layer or a silicon layer having a function of releasing hydrogen.

In one embodiment of the present invention, the resin layer having a desired shape can be easily manufactured by using a photosensitive material. Thus, the external connection terminal and the circuit substrate can be electrically connected to each other on the surface opposite to the display surface. A space for bending the FPC or the like in incorporating a display device in an electronic device can be eliminated, which enables the electronic device to be smaller.

According to one embodiment of the present invention, by using an oxide semiconductor for a channel formation region of the transistor, the manufacturing process of the transistor can be performed at low temperature. Furthermore, the resin layer can have a small thickness and low heat resistance. Thus, the material of the resin layer can be selected from a wide range, high mass productivity can be obtained at low cost, and a large substrate can be used, for example.

This embodiment can be combined with any of the other embodiments as appropriate.

Embodiment 2

In this embodiment, a separation method and a method for manufacturing a flexible device of one embodiment of the present invention will be described.

In this embodiment, the case where a display device in which an oxide semiconductor is used for the transistor and a color filter is used for the EL elements is manufactured is given as an example. A flexible device and the method for manufacturing the flexible device of one embodiment of the present invention will be specifically described below with reference to FIGS. 15A to 15C, FIGS. 16A to 16C, FIGS. 17A to 17C, FIGS. 18A and 18B, FIGS. 19A and 19B, FIGS. 20A and 20B, FIG. 21, FIGS. 22A and 22B, FIGS. 23A and 23B, FIGS. 24A to 24C, FIGS. 25A to 25C, FIGS. 26A to 26C, FIGS. 27A and 27B, FIGS. 28A and 28B, FIGS. 29A and 29B, FIG. 30, FIGS. 31A and 31B, FIGS. 32A and 32B, and FIGS. 33A and 33B.

Note that the detailed description of the components described in Embodiment 1 is omitted in some cases.

Manufacturing Method Example 4

Figure 15A:
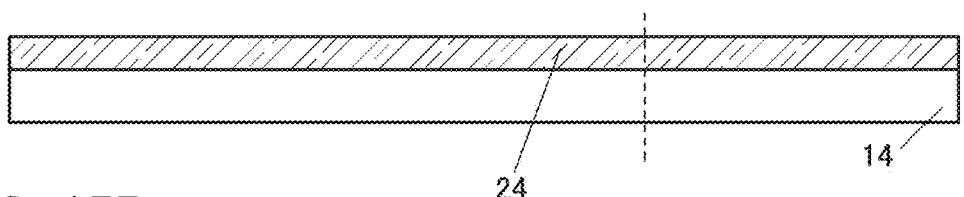
FIGS. 15A to 15C are diagrams illustrating an example of a manufacturing method of a flexible device.

First, the first layer 24 is formed using the photosensitive and thermosetting material in a manner similar to that in manufacturing method example 1 (FIG. 15A).

Figure 15B:
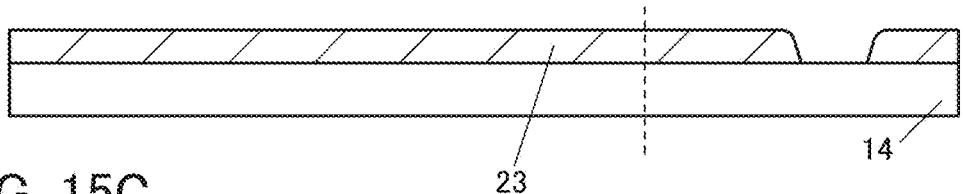

Next, in a manner similar to that in manufacturing method example 1, the first layer 24 is processed into a desired shape. The processed layer is then heated, so that the layer 23 is formed (FIG. 15B). FIG. 15B illustrates an example where the resin layer 23 includes an opening that reaches the formation substrate 14.

Figure 15C:
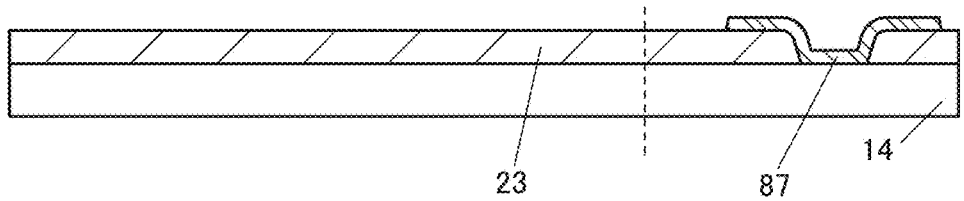

Subsequently, a second layer 87 is formed (see FIG. 15C). For the second layer 87, the description of the second layer 47 can be referred to. As the second layer 87, a silicon layer is preferably used. In the case where the second layer 87 is a silicon layer, the second layer 87 can be formed in the following manner: a silicon film is formed, a resist mask is formed, the silicon film is etched, and the resist mask is removed. Note that as the second layer 87, an oxide layer may be used.

Figure 16A:
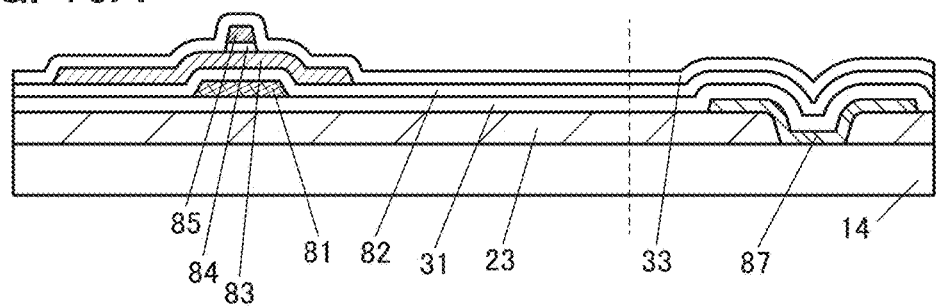
FIGS. 16A to 16C are diagrams illustrating an example of a manufacturing method of a flexible device.

Next, the insulating layer 31 is formed over the resin layer 23 in a manner similar to that in manufacturing method example 1 (FIG. 16A).

Figure 16B:
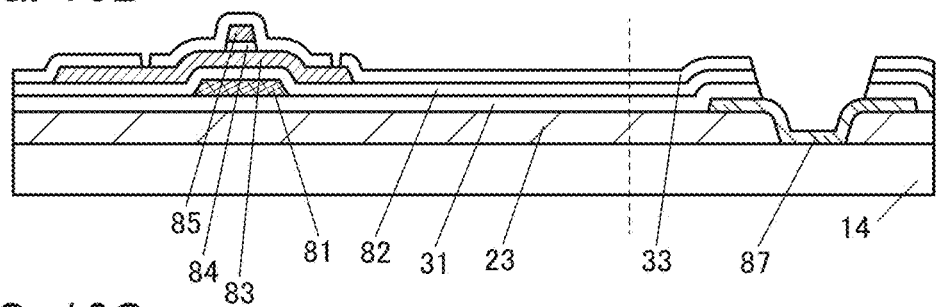
Figure 16C:
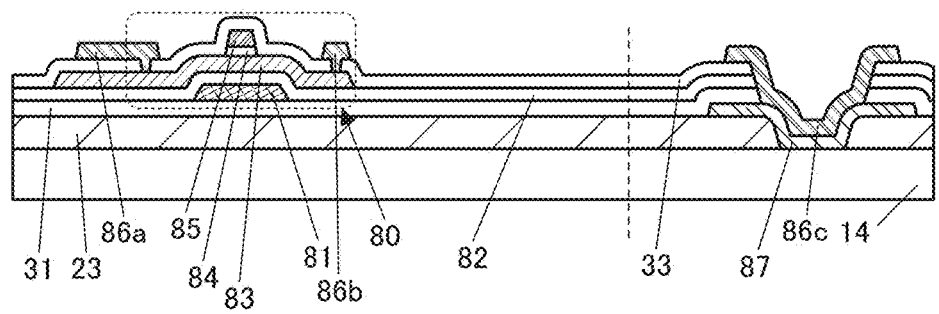

Next, the transistor 80 is formed over the insulating layer 31 (FIGS. 16A, 16B, and 16C).

Described here is the case where a transistor including an oxide semiconductor layer 83 and two gates is manufactured as the transistor 80.

Furthermore, the transistor 80 is formed at a temperature lower than or equal to the heat resistant temperature of the resin layer 23. The transistor 80 is preferably formed at a temperature lower than the heating temperature in the above-described postbake treatment.

Specifically, first, the conductive layer 81 is formed over the insulating layer 31 (FIG. 16A). The conductive layer 81 can be formed in the following manner: a conductive film is formed, a resist mask is formed, the conductive film is etched, and the resist mask is removed.

Next, the insulating layer 82 is formed (FIG. 16A). For the insulating layer 82, the inorganic insulating film that can be used for the insulating layer 31 can be used.

Then, the oxide semiconductor layer 83 is formed (FIG. 16A). The oxide semiconductor layer 83 can be formed in the following manner: an oxide semiconductor film is formed, a resist mask is formed, the oxide semiconductor film is etched, and the resist mask is removed. For the oxide semiconductor layer 83, the material that can be used for the oxide semiconductor layer 44 can be used.

Next, the insulating layer 84 and the conductive layer 85 are formed (FIG. 16A). For the insulating layer 84, the inorganic insulating film that can be used for the insulating layer 31 can be used. The insulating layer 84 and the conductive layer 85 can be formed in the following manner: an insulating film to be the insulating layer 84 is formed, a conductive film to be the conductive layer 85 is formed, a resist mask is formed, the insulating film and the conductive film are etched, and the resist mask is removed.

Next, the insulating layer 33 that covers the oxide semiconductor layer 83, the insulating layer 84, and the conductive layer 85 is formed. The insulating layer 33 can be formed in a manner similar to that of the insulating layer 31.

Next, an opening is formed in a portion of the insulating layers 31, 82, and 33 overlapping with the opening of the resin layer 23 (FIG. 16B). Here, an example where an opening is formed in the insulating layers 31, 82, and 33 at one step is illustrated. The opening of the insulating layers 31, 82, and 33 may be formed in different steps. Further, the opening may be formed in two or more of the insulating layers at the same time. For example, the opening may be formed in the insulating layer 31 before the conductive layer 81 is formed. For example, the opening may be formed in the insulating layer 82 before the oxide semiconductor layer 83 is formed. By forming the opening, the formation substrate 14 is exposed.

Further, two openings that reach the oxide semiconductor layer 83 are provided in the insulating layer 33 (FIG. 16B).

Next, conductive layers 86a, 86b, and 86c are formed (FIG. 16C). The conductive layers 86a, 86b, and 86c can be formed in the following manner: a conductive film is formed, a resist mask is formed, the conductive film is etched, and the resist mask is removed. The conductive layer 86a and the conductive layer 86b are electrically connected to the semiconductor layer 83 through the openings provided in the insulating layer 33. The conductive layer 86c is connected to the second layer 87 in the opening provided in the resin layer 23 and the insulating layers 31, 82, and 33.

In the above manner, the transistor 80 can be manufactured (FIG. 16C). In the transistor 80, part of the conductive layer 81 functions as a first gate and part of the insulating layer 82 functions as a first gate insulating layer. Part of the conductive layer 85 functions as a second gate and part of the insulating layer 84 functions as a second gate insulating layer.

The oxide semiconductor layer 83 includes a channel region and a low-resistant region. The channel region overlaps with the conducting layer 85 with the insulating layer 84 interposed therebetween. The low-resistant region includes a portion connected to the conductive layer 86a and a portion connected to the conductive layer 86b.

Note that although the case where the conductive layer 86c is formed at the same time as the conductive layers 86a and 86b is shown, the conductive layer 86c and the conductive layers 86a and 86b are not necessarily formed at the same time. For example, the conductive layer 86c may be formed at the same time as the conductive layer 81. In this case, after the insulating layer 31 is formed, the opening is formed in the insulating layer 31 in a portion that overlaps with the opening portion of the resin layer 23. Next, a conductive film is formed. The conductive layers 81 and 86c are formed in the following manner: a resist mask is formed, the conductive film is etched, and the resist mask is removed.

Figure 17A:
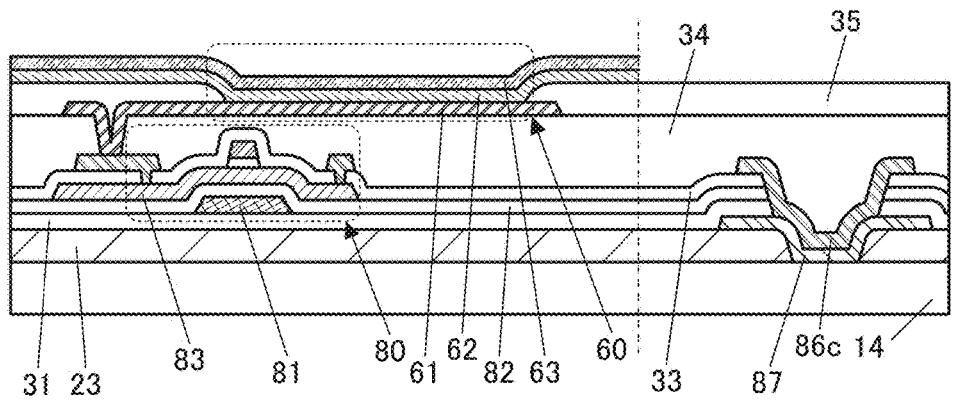
FIGS. 17A to 17C are diagrams illustrating an example of a manufacturing method of a flexible device.

After that, components from the insulating layer 34 to the display element 60 are formed over the insulating layer 33 (FIG. 17A). For these steps, manufacturing method example 1 in Embodiment 1 can be referred to.

Figure 17B:
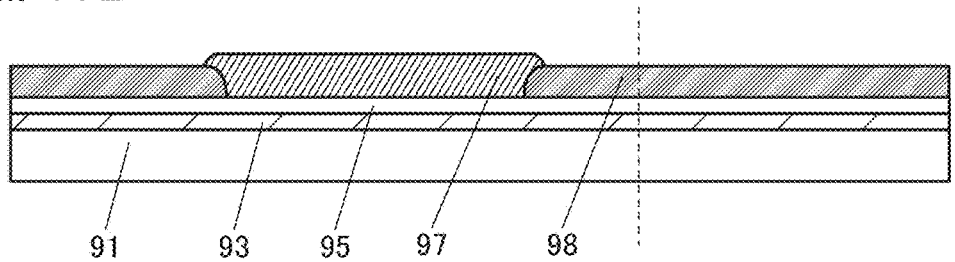

Furthermore, a resin layer 93 is formed using the photosensitive and thermosetting material over the formation substrate 91 (see FIG. 17B).

The resin layer 93 has flexibility. The formation substrate 91 has lower flexibility than the resin layer 93 does. Since the resin layer 93 is formed over the formation substrate 91, the resin layer 93 can be transferred easily.

For the resin layer 93, a polyimide resin is preferably used. For a material and a formation method of the resin layer 93, the description of the resin layer 23 is referred to.

The thickness of the resin layer 93 is preferably greater than or equal to 0.01 μm and less than 10 μm, further preferably greater than or equal to 0.1 μm and less than or equal to 3 μm, and still further preferably greater than or equal to 0.5 μm and less than or equal to 1 μm. With the use of a solution with low viscosity, the resin layer 93 can be easily made thin.

In the case where the resin layer 93 is positioned on the display surface side of the display device, the resin layer 93 preferably has a high visible-light transmitting property.

For the formation substrate 91, the description of the formation substrate 14 can be referred to.

Next, an insulating layer 95 is formed over the resin layer 93. Then, a coloring layer 97 and a light-blocking layer 98 are formed over the insulating layer 95 (FIG. 17B).

For the insulating layer 95, the description of the insulating layer 31 can be referred to.

A color filter and the like can be used as the coloring layer 97. The coloring layer 97 overlaps with the display element 60.

A black matrix and the like can be used as the light-blocking layer 98. The light-blocking layer 98 overlaps with the insulating layer 35.

Figure 17C:
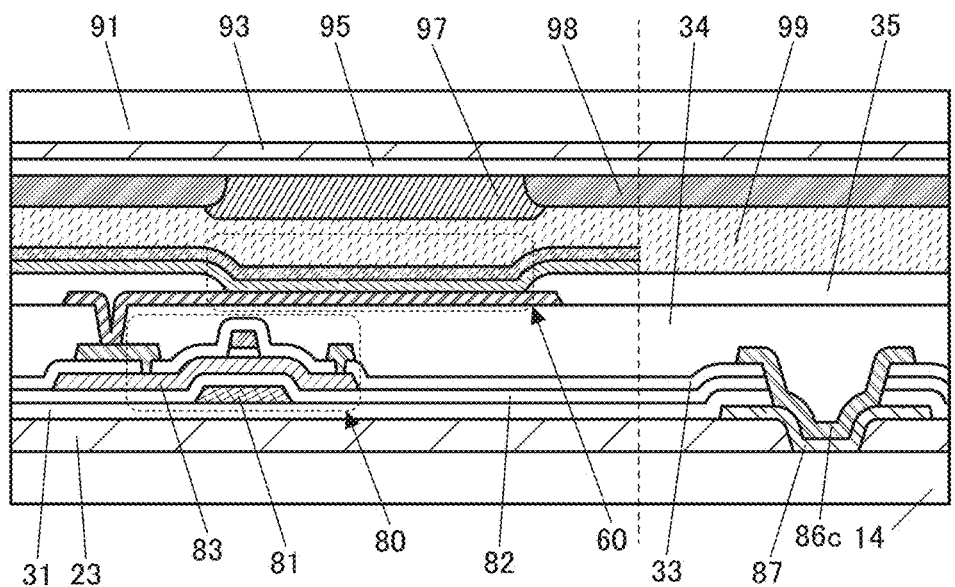

Then, the formation substrate 14 and the formation substrate 91 are bonded with the adhesive layer 99 so that the transistor 80, the display element 60, and the coloring layer 97 are interposed between the formation substrate 14 and the formation substrate 91 (FIG. 17C).

Figure 18A:
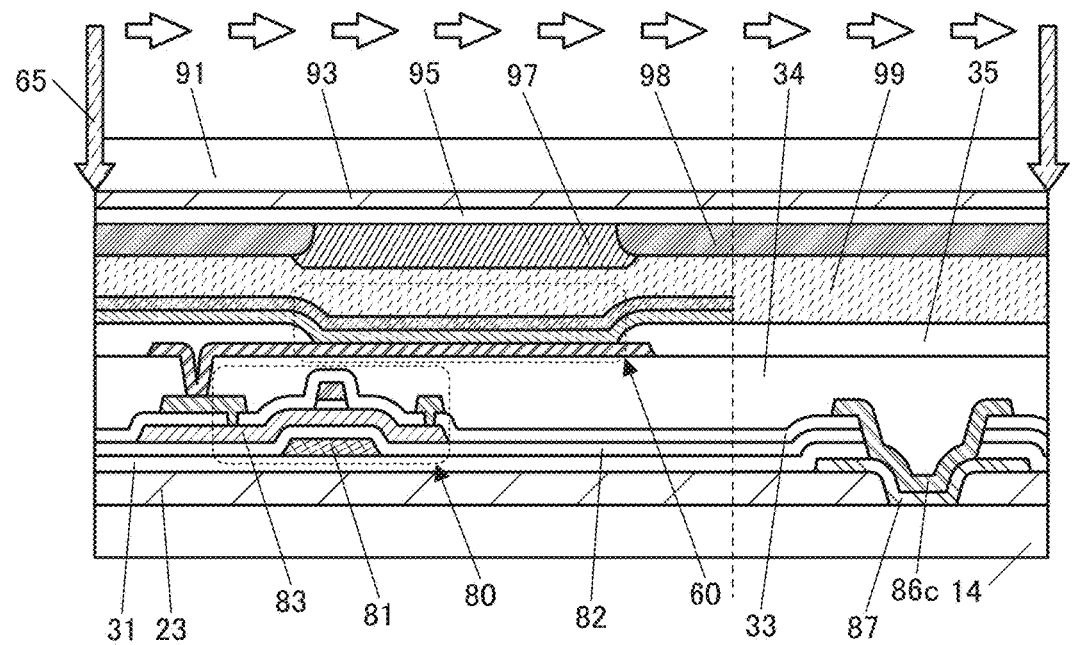
FIGS. 18A and 18B are diagrams illustrating an example of a manufacturing method of a flexible device.

Next, the resin layer 93 is irradiated with laser light through the formation substrate 91 (FIG. 18A). Here, an example where the formation substrate 91 is separated ahead of the formation substrate 14 is illustrated.

Figure 18B:
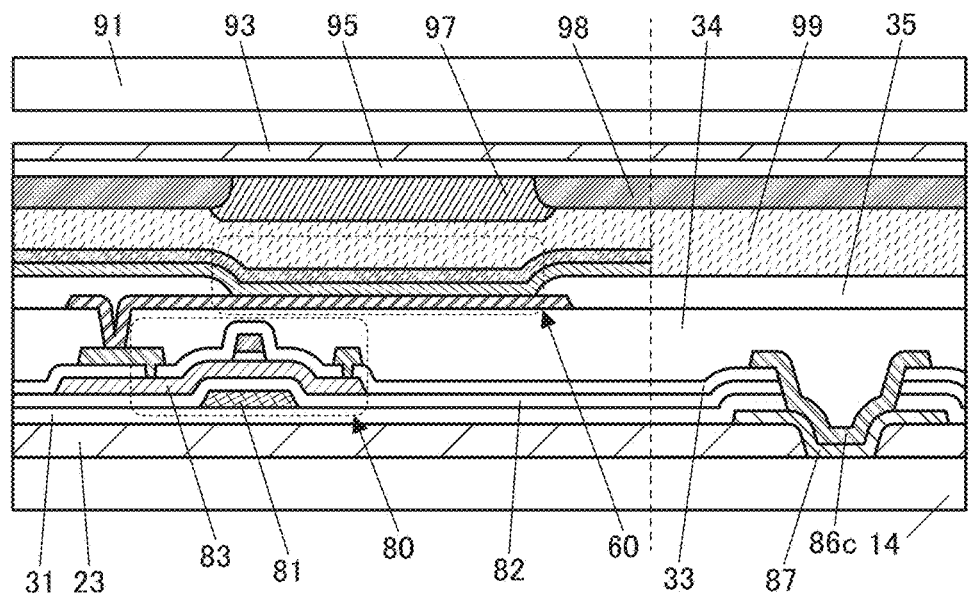

Next, the formation substrate 91 and the insulating layer 95 are separated from each other (FIG. 18B). FIG. 18B illustrates an example where separation occurs at the interface between the formation substrate 91 and the resin layer 93.

Note that separation occurs in the resin layer 93 in some cases. At this time, part of the resin layer remains over the formation substrate 91 and thus the resin layer 93 remaining over the insulating layer 95 side becomes thinner than the resin layer 93 of FIG. 18A.

Figure 19A:
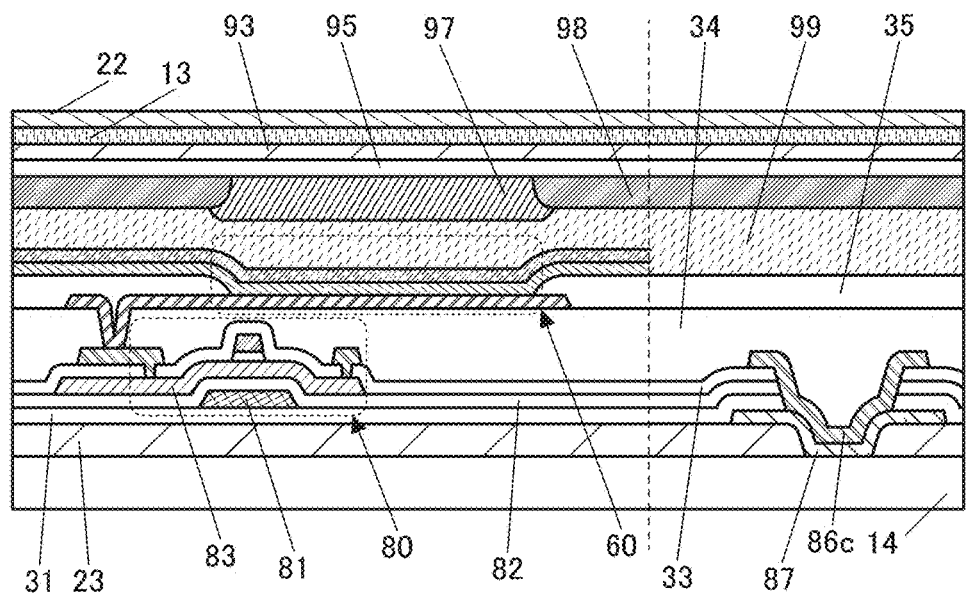
FIGS. 19A and 19B are diagrams illustrating an example of a manufacturing method of a flexible device.

Next, the exposed resin layer 93 (or the insulating layer 95) and a substrate 22 are bonded with the adhesive layer 13 (FIG. 19A).

In FIG. 19A, the light emitted from the display element 60 is extracted to the outside of the display device through the coloring layer 97 and the resin layer 93. Thus, the transmittance of visible light of the resin layer 93 is preferably high. In the separation method of one embodiment of the present invention, the thickness of the resin layer 93 can be small. Thus, the transmittance of visible light of the resin layer 93 can be high.

Alternatively, the resin layer 93 may be removed and the substrate 22 may be bonded to the insulating layer 95 with the adhesive layer 13.

The adhesive layer 13 can be formed using a material for the adhesive layer 75b.

The substrate 22 can be formed using a material for the substrate 75a.

Figure 19B:
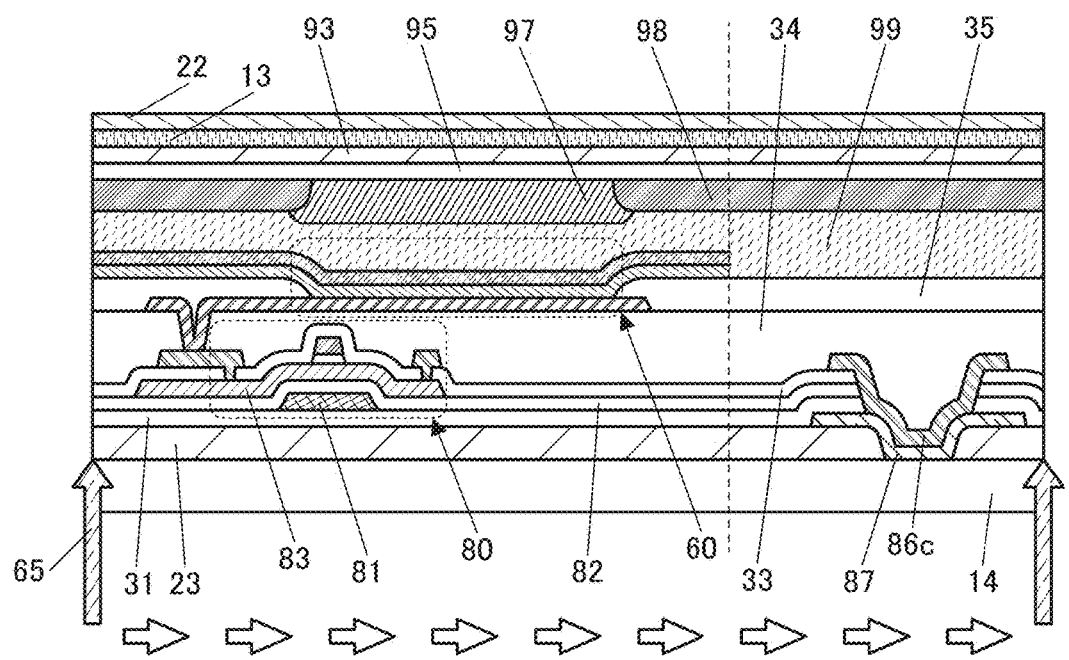

Next, the resin layer 23 and the second layer 87 are irradiated with the laser light 65 through the formation substrate 14 (FIG. 19B).

By irradiation with the laser light 65, the second layer 87 is heated and hydrogen is released from the second layer 87.

Figure 20A:
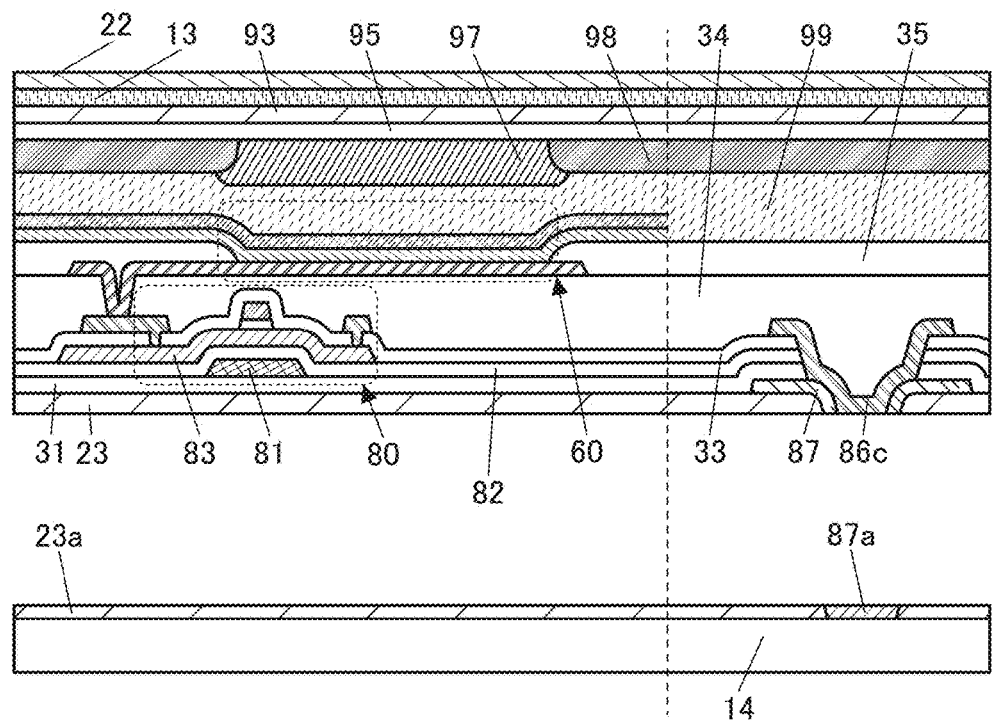
FIGS. 20A and 20B are diagrams illustrating an example of a manufacturing method of a flexible device.
Figure 20B:
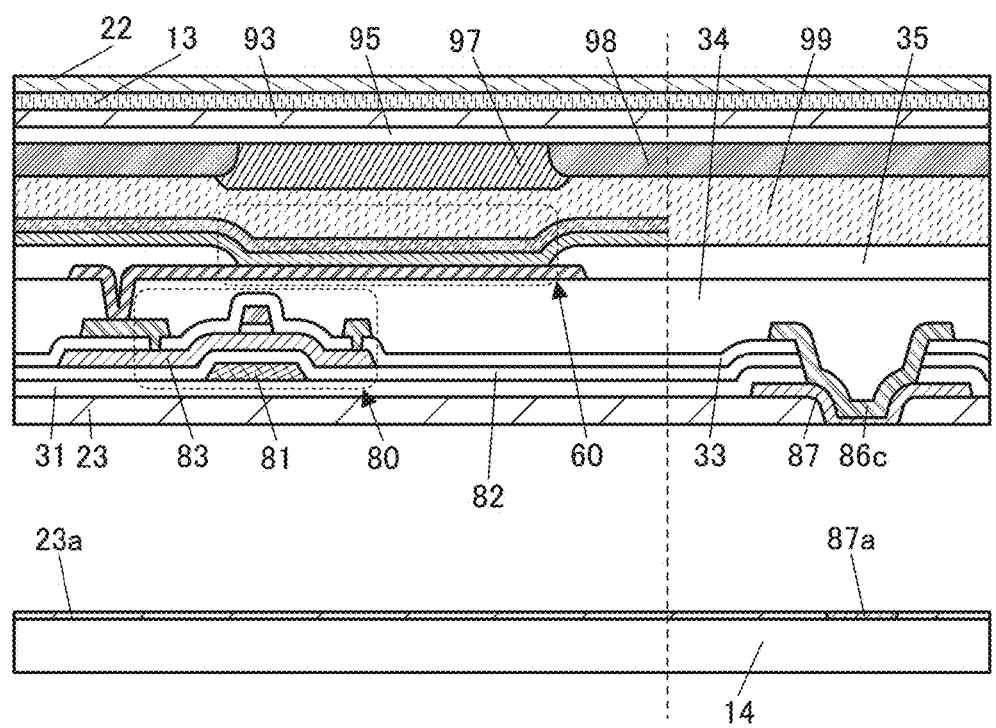
Figure 21:
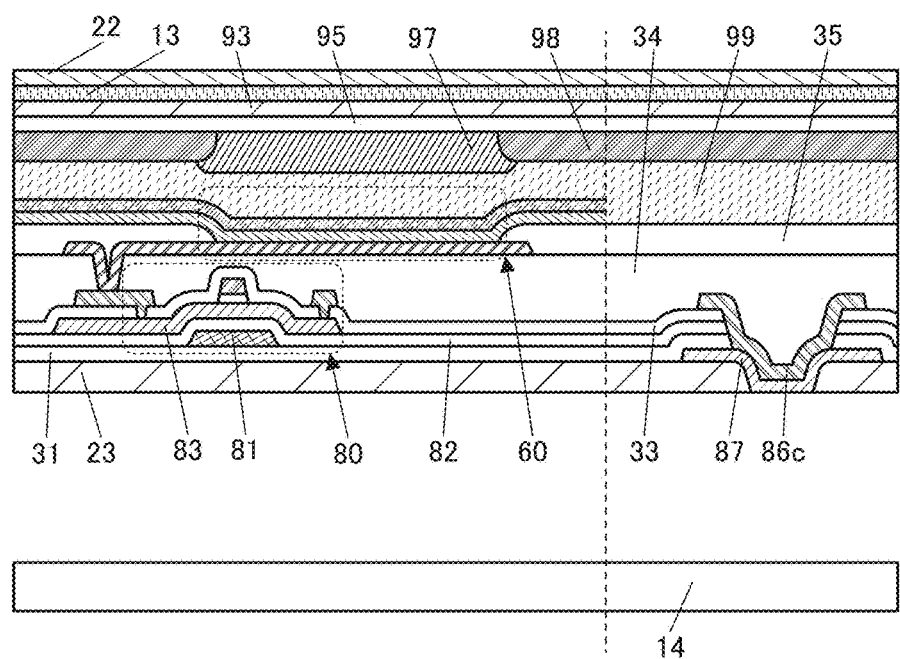
FIG. 21 is a diagram illustrating an example of a manufacturing method of a flexible device.

Next, the formation substrate 14 and the insulating layer 31 are separated from each other (FIG. 20A, FIG. 20B, or FIG. 21).

FIG. 20A illustrates an example where separation occurs at the interface between the second layer 87 and the conductive layer 86c, and in the resin layer 23. Part of the second layer (a second layer 87a) and part of the resin layer (a resin layer 23a) remain over the formation substrate 14. The surface of the conductive layer 86c is exposed and the resin layer 23 remaining over the conductive layer 86c side becomes thinner than the resin layer 23 of FIG. 19B.

FIG. 20B illustrates an example where separation occurs in the second layer 87 and the resin layer 23. Part of the second layer (the second layer 87a) and part of the resin layer (the resin layer 23a) remain over the formation substrate 14. The surface of the conductive layer 86c is not exposed and the second layer 87 and the resin layer 23 remaining over the conductive layer 86c side becomes thinner than the second layer 87 and the resin layer 23 of FIG. 20B.

FIG. 21 illustrates an example where separation occurs at the interface between the second layer 87 and the formation substrate 14 and the interface between the resin layer 23, and the formation substrate 14. The second layer does not remain over the formation substrate 14. Further, the surface of the conductive layer 86c is not exposed. Note that the resin layer 23 does not remain over the formation substrate 14 in FIG. 21; however, part of the resin layer remains over the formation substrate 14 in some cases.

Figure 22A:
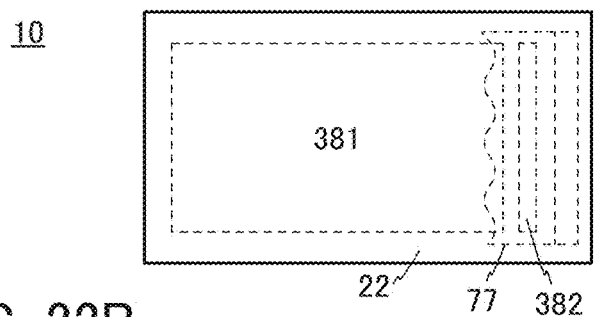
FIGS. 22A and 22B are diagrams each illustrating an example of a flexible device.
Figure 22B:
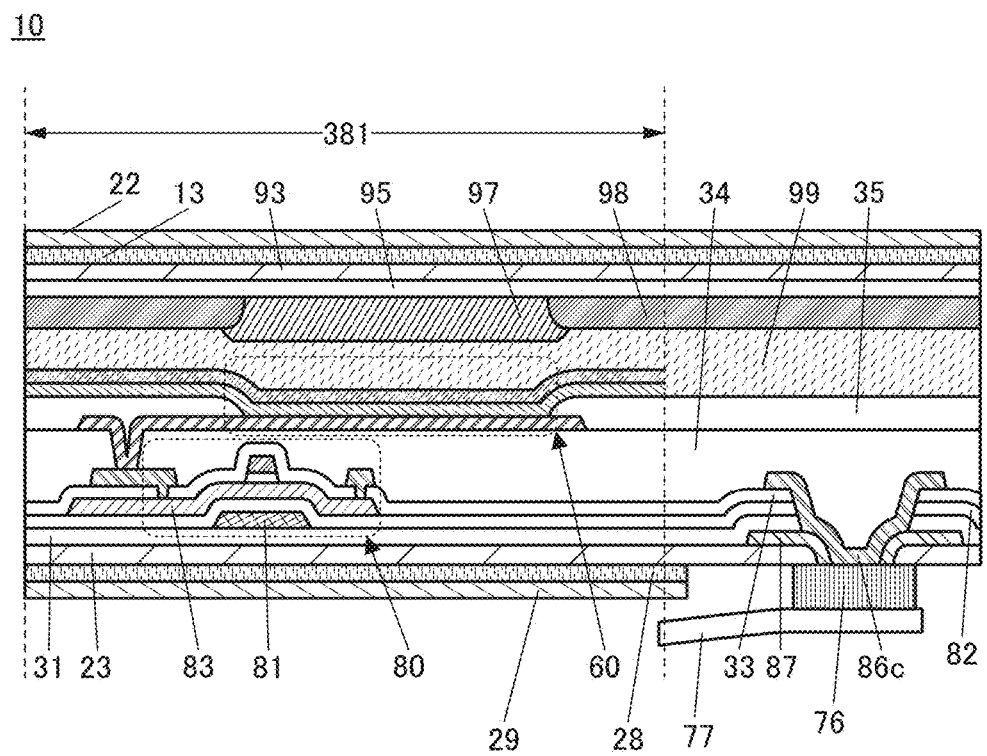

The separation of the formation substrate 14 and the transistor 80 can manufacture the display device 10 (FIGS. 22A and 22B). The display device 10 can remain bent or can be bent repeatedly, for example.

FIG. 22A is a top view of the display device 10. FIG. 22B is a cross-sectional view of a display portion 381 and a portion connected to the FPC 77 of the display device 10.

The display device 10 in FIGS. 22A and 22B includes a pair of substrates (a substrate 22 and a substrate 29). The substrate 22 side functions as a display surface side of the display device. The display device includes the display portion 381 and the driver circuit portion 382. The FPC 77 is attached to the display device.

As illustrated in FIG. 22B, the substrate 29 may be bonded to the surface of the resin layer 23 exposed by separation using an adhesive layer 28. Note that the substrate 29 and the adhesive layer 28 are positioned so as not to overlap with the conductive layer 86c.

The conductive layer 86c and an FPC 77 are electrically connected to each other through a connector 76. FIG. 22B illustrates the case where the conductive layer 86c is exposed and electrically connected to the FPC 77.

The display device 10 with the structure illustrated in FIG. 22B includes the insulating layers 31, 82, and 33 formed after the second layer 87; however, one embodiment of the present invention is not limited to this. For example, after the opening is formed in the resin layer 23, the insulating layers 31, 82, and 33 may be formed before forming the second layer 87. An opening is formed in a portion of the insulating layers 31, 82, and 33 overlapping with the opening of the resin layer 23. After that, the second layer 87 may be formed. In this case, the display device 10 has the structure illustrated in FIG. 23A. Alternatively, the insulating layer 31 and the opening in the insulating layer 31 may be formed before the second layer 87 is formed. After that, the second layer 87 may be formed in the opening and the insulating layer 82 may be formed, for example. Alternatively, the second layer 87 may be formed after the insulating layer 82 is formed and before the insulating layer 33 is formed.

Figure 23A:
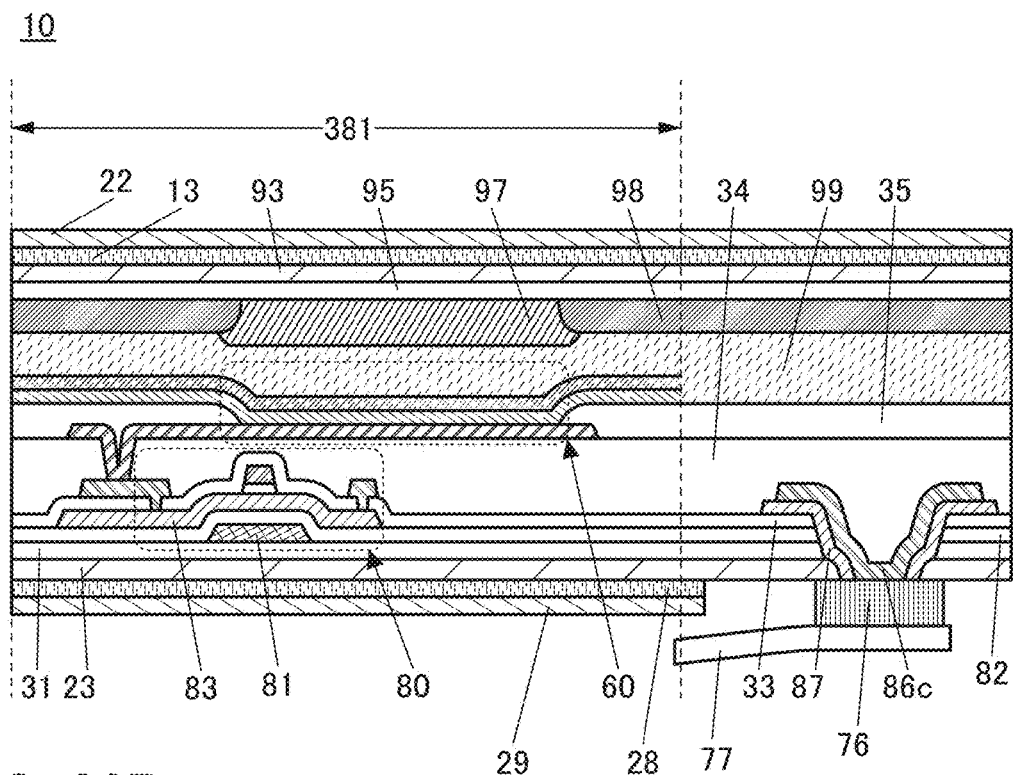
FIGS. 23A and 23B are diagrams each illustrating an example of a flexible device.
Figure 23B:
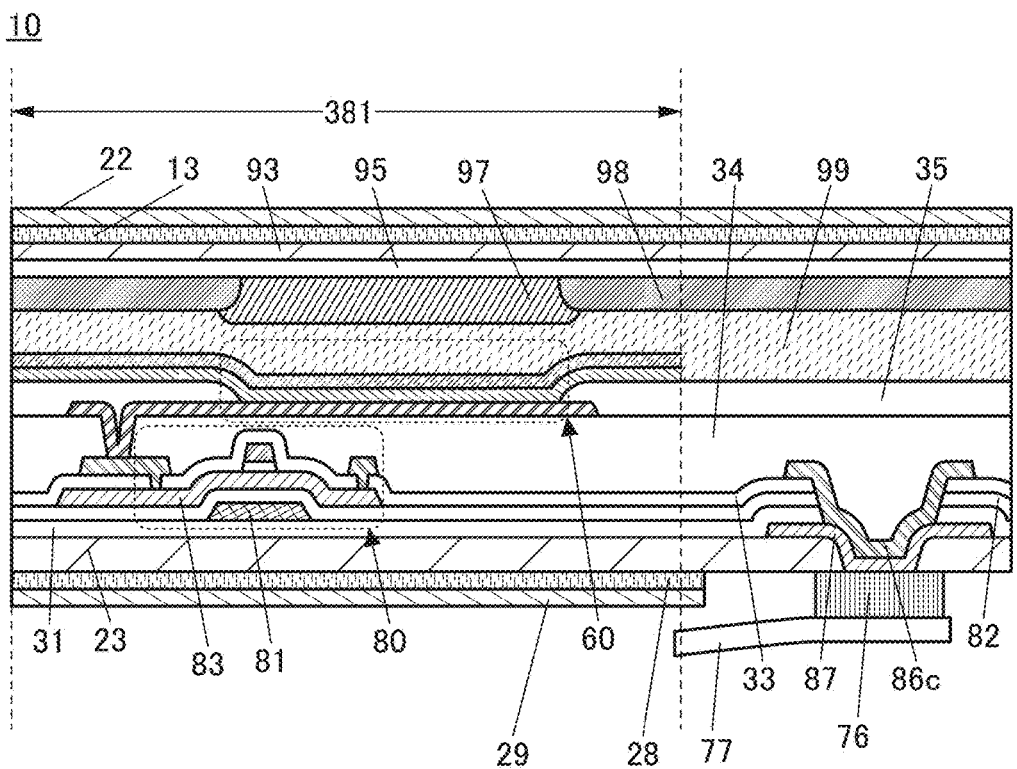

In the case where the conductive layer 86c is not exposed, the second layer 87 is in contact with the connector 76 as illustrated in FIG. 23B. In this case, the conductive layer 86c is electrically connected to the FPC 77 through the connector 76 and the second layer 87. In the structure illustrated in FIG. 23B, a second layer whose resistance is reduced is preferably used as the second layer 87.

An example where a top-emission light-emitting element is used is illustrated in one embodiment of the present invention. The substrate 22 side is the display surface side and thus, the conductive layer 86c or the second layer 87 are exposed from the substrate 22 side. In the case where the substrate 22 is electrically connected to the FPC 77, the display region and the FPC 77 cannot be overlapped with each other and thus, there is a limit in the region where the FPC 77 overlaps with the display device. According to one embodiment of the present invention, a photosensitive material is used as the resin layer 23 and thus, the conductive layer 86c or the second layer 87 can be exposed from the surface opposite to the display surface. Therefore, the conductive layer 86c and the FPC 77 are electrically connected to each other through the opening in the resin layer 23. Such a structure allows the FPC 77 to be positioned on the side opposite to the display surface. Thus, a space for bending the FPC 77 in incorporating a display device in an electronic device can be eliminated, which enables the electronic device to be smaller.

Manufacturing method example 4 is an example where the separation is performed two times by the separation method of one embodiment of the present invention to manufacture a flexible device. In one embodiment of the present invention, each of the functional elements and the like included in the flexible device is manufactured over the formation substrate; thus, even in the case where a high-resolution display device is manufactured, high alignment accuracy of the flexible substrate is not required. It is thus easy to attach the flexible substrate.

Manufacturing Method Example 5

Figure 24A:
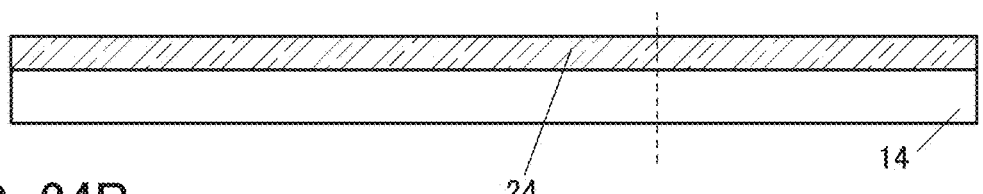
FIGS. 24A to 24C are diagrams illustrating an example of a manufacturing method of a flexible device.
Figure 24B:
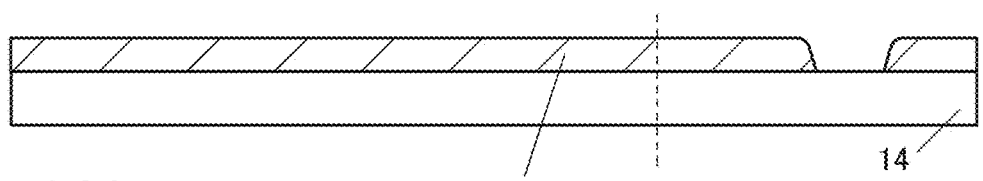

First, the resin layer 23 including an opening reaching the formation substrate 14 is formed over the formation substrate 14 in a manner similar to that in manufacturing method example 4 (FIGS. 24A and 24B).

Figure 24C:
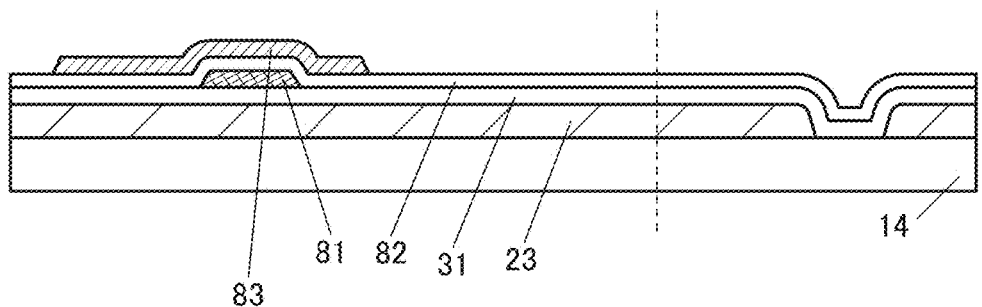

Next, the insulating layer 31 is formed over the resin layer 23 in a manner similar to that in manufacturing method example 2 (FIG. 24C).

Next, the transistor 80 is formed over the insulating layer 31 (FIG. 24C and FIGS. 25A to 25C). Specifically, first, the conductive layer 81 is formed over the insulating layer 31 (FIG. 24C). Then, the insulating layer 82 is formed (FIG. 24C).

Next, the oxide semiconductor layer 83 is formed (FIG. 24C). Then, the insulating layer 84 is formed (FIG. 25A).

Figure 25A:
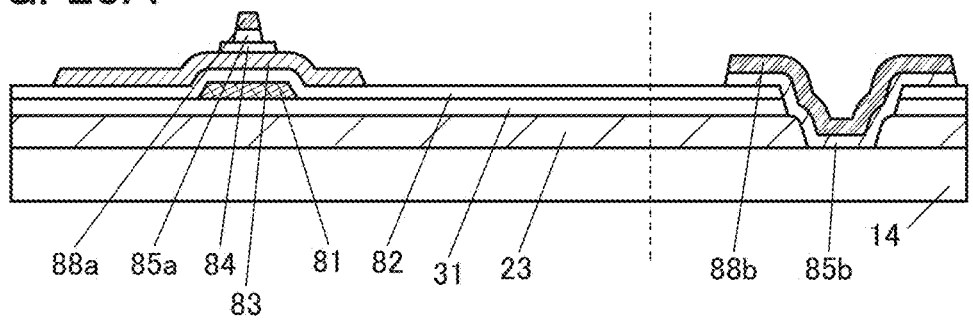
FIGS. 25A to 25C are diagrams illustrating an example of a manufacturing method of a flexible device.

Next, an opening is formed in the portion of insulating layers 31 and 82 overlapping with the opening of the resin layer 23 (FIG. 25A). Here, an example where the opening is formed in the insulating layers 31 and 82 at one step is illustrated. The opening of the insulating layers 31 and 82 may be formed in different steps. For example, the opening may be formed in the insulating layer 31 before the conductive layer 81 is formed. For example, the opening may be formed in the insulating layer 82 before the oxide semiconductor layer 83 is formed. By forming the opening, the formation substrate 14 is exposed.

Alternatively, the opening may be formed in the insulating layers 31 and 82 before the insulating layer 84 is formed, for example. As an example, the opening may be formed in the insulating layers 31 and 82 before the oxide semiconductor layer 83 is formed.

Next, the oxide layers 85a and 85b and the conductive layers 88a and 88b are formed (FIG. 25A). The oxide layers 85a and 85b and the conductive layers 88a and 88b can be formed in the following manner: an oxide film and a conductive film are formed, a resist mask is formed, the oxide film and the conductive film are etched, and the resist mask is removed. The oxide layer 85a is in contact with the insulating layer 84 and the conductive layer 88a is in contact with the oxide layer 85a. The oxide layer 85b and the conductive layer 88b are formed in the opening portion formed in the resin layer 23 and the insulating layers 31 and 82.

For the oxide layers 85a and 85b, the oxide insulating layer, the oxide conductive layer, and the oxide semiconductor layer that can be used for the second layer 47 can be used. In particular, for the oxide layers 85a and 85b, the oxide conductive layer is preferably used. In that case, the oxide layer 85a can function as a gate of the transistor 80. Further, the oxide layer 85b can function as an electrode that can be used as an external connection terminal.

Figure 25B:
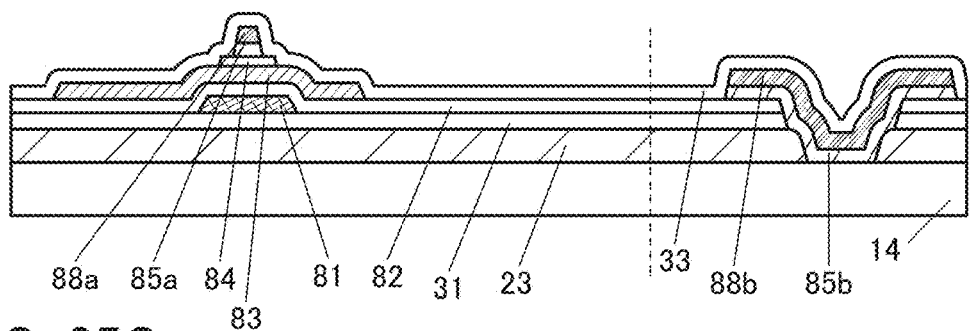

Next, the insulating layer 33 that covers the oxide semiconductor layer 83, the insulating layer 84, the oxide layer 85a, the conductive layer 88a, the oxide layer 85b, and the conductive layer 88b is formed (FIG. 25B). The insulating layer 33 can be formed in a manner similar to that of the insulating layer 31.

Figure 25C:
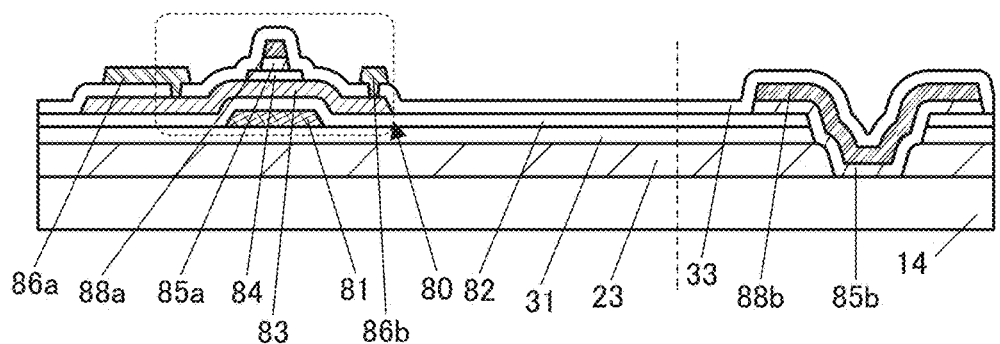
Figure 26A:
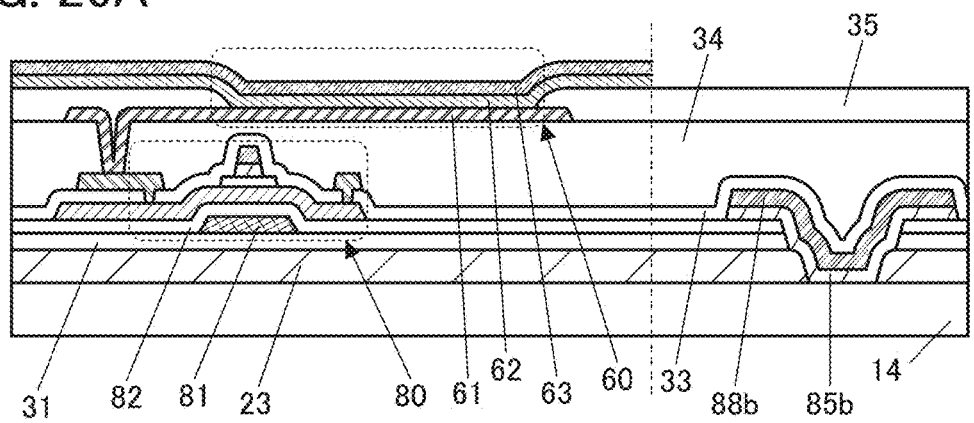
FIGS. 26A to 26C are diagrams illustrating an example of a manufacturing method of a flexible device.
Figure 26B:
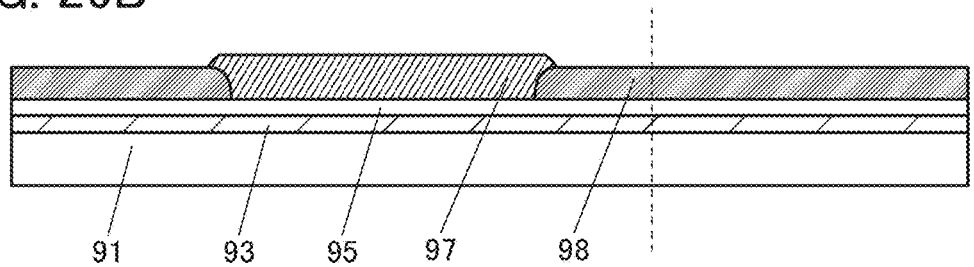
Figure 26C:
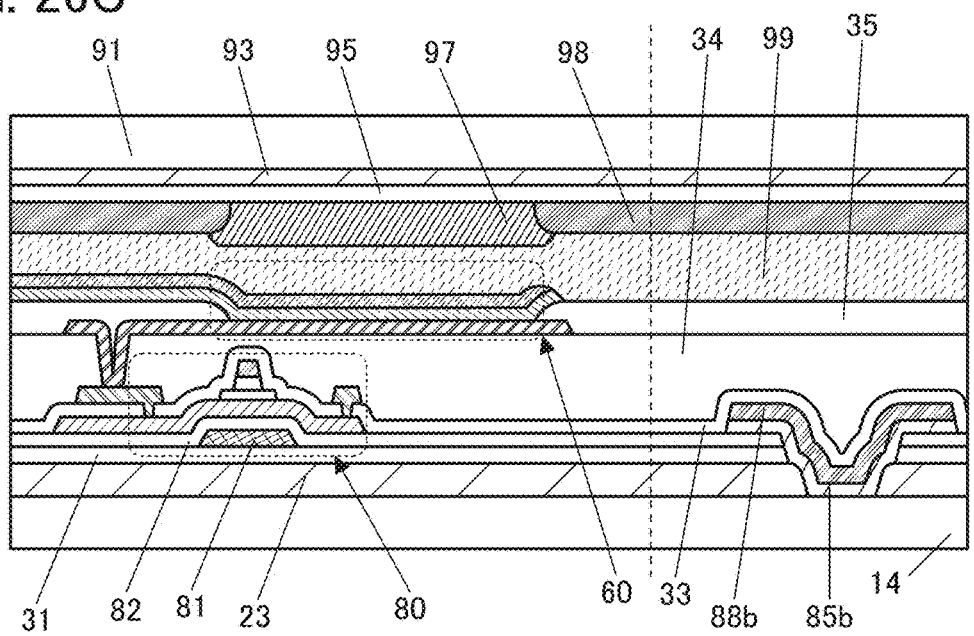
Figure 27A:
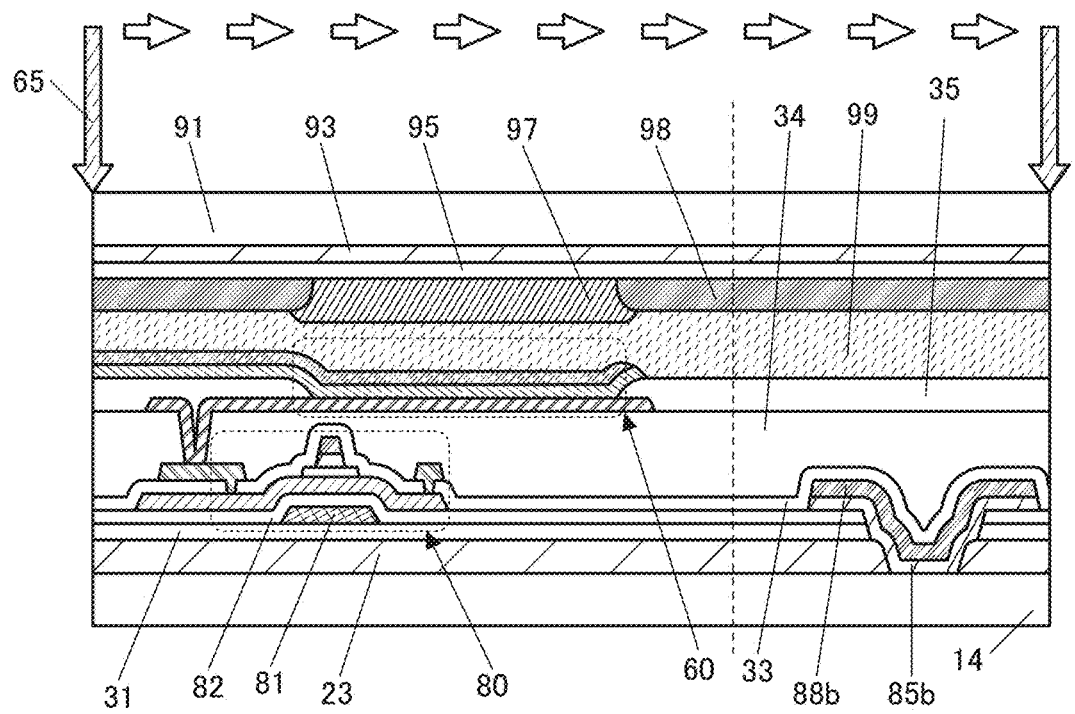
FIGS. 27A and 27B are diagrams illustrating an example of a manufacturing method of a flexible device.
Figure 27B:
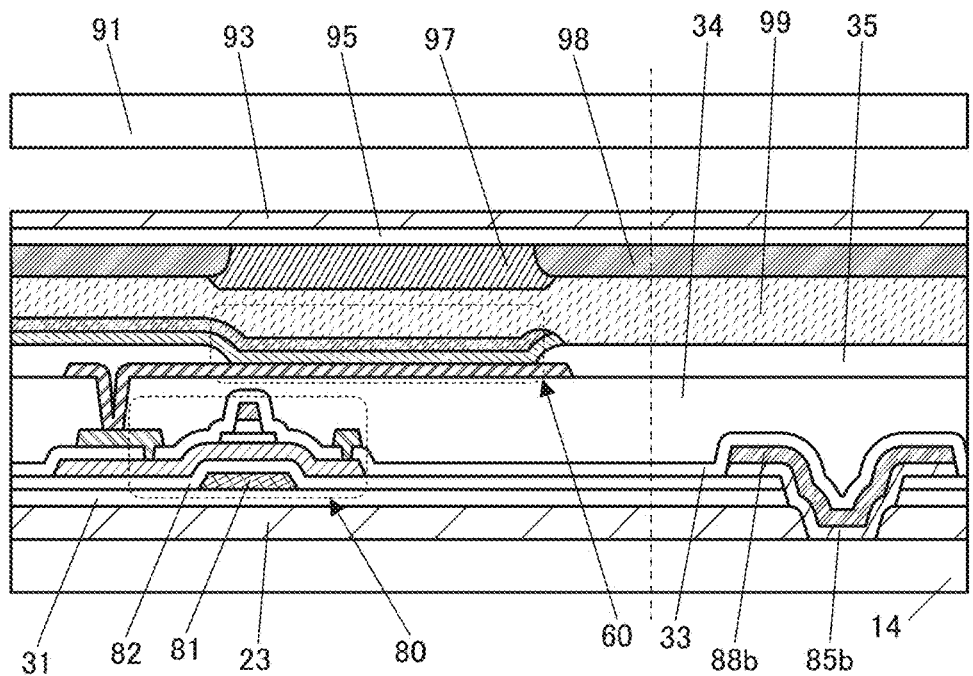
Figure 28A:
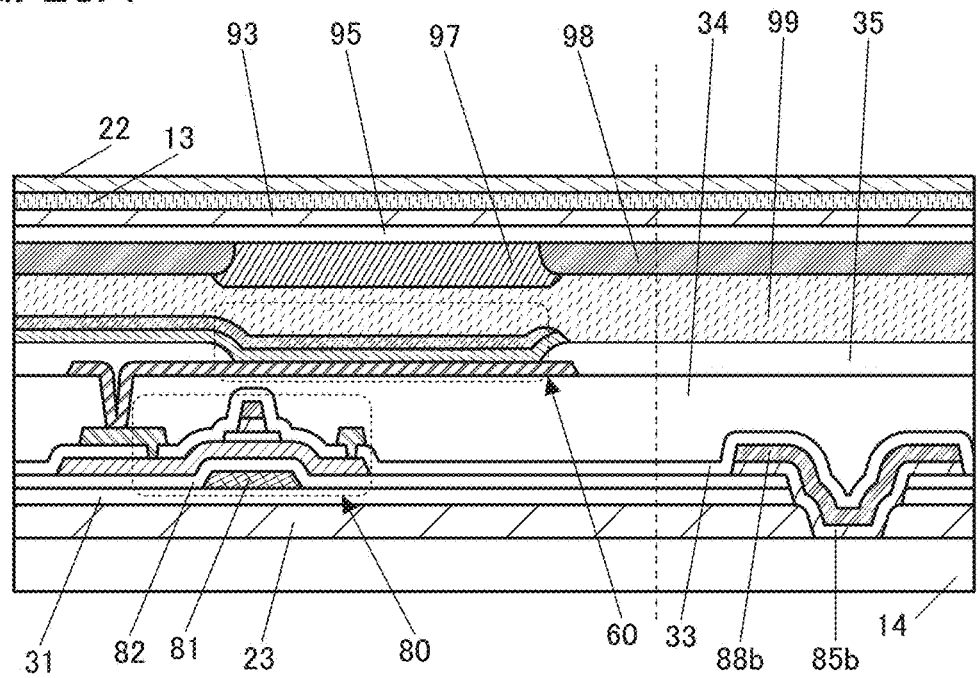
FIGS. 28A and 28B are diagrams illustrating an example of a manufacturing method of a flexible device.
Figure 28B:
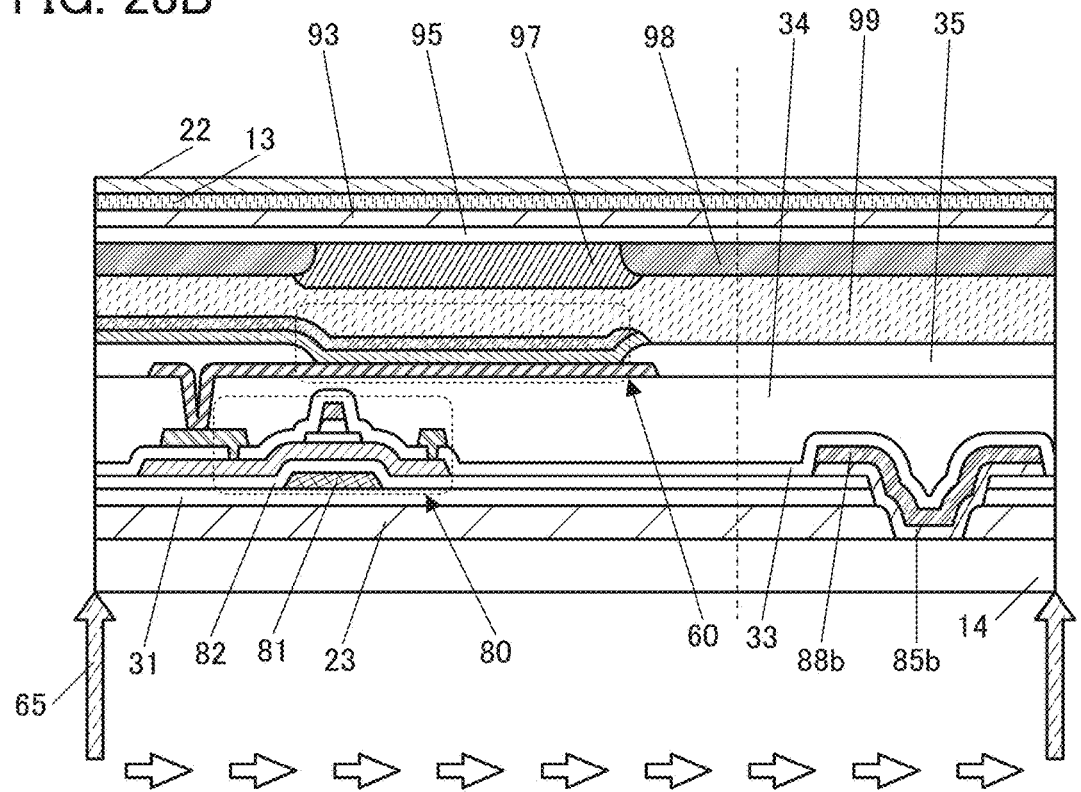
Figure 29A:
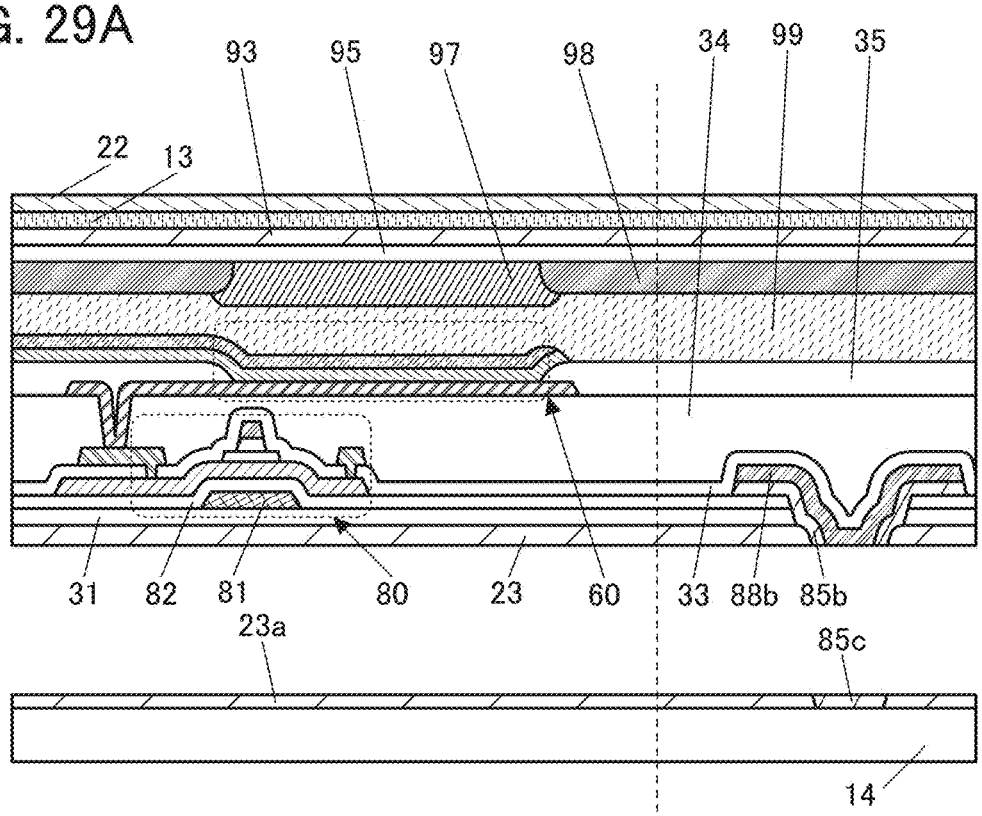
FIGS. 29A and 29B are diagrams illustrating an example of a manufacturing method of a flexible device.
Figure 29B:
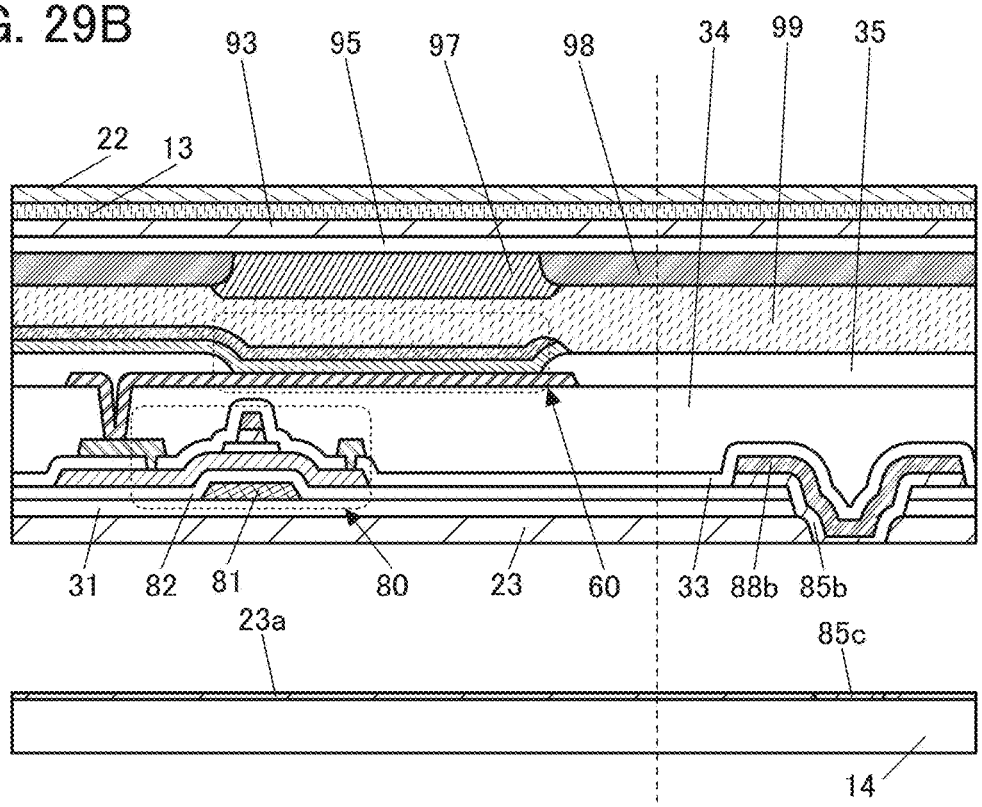
Figure 30:
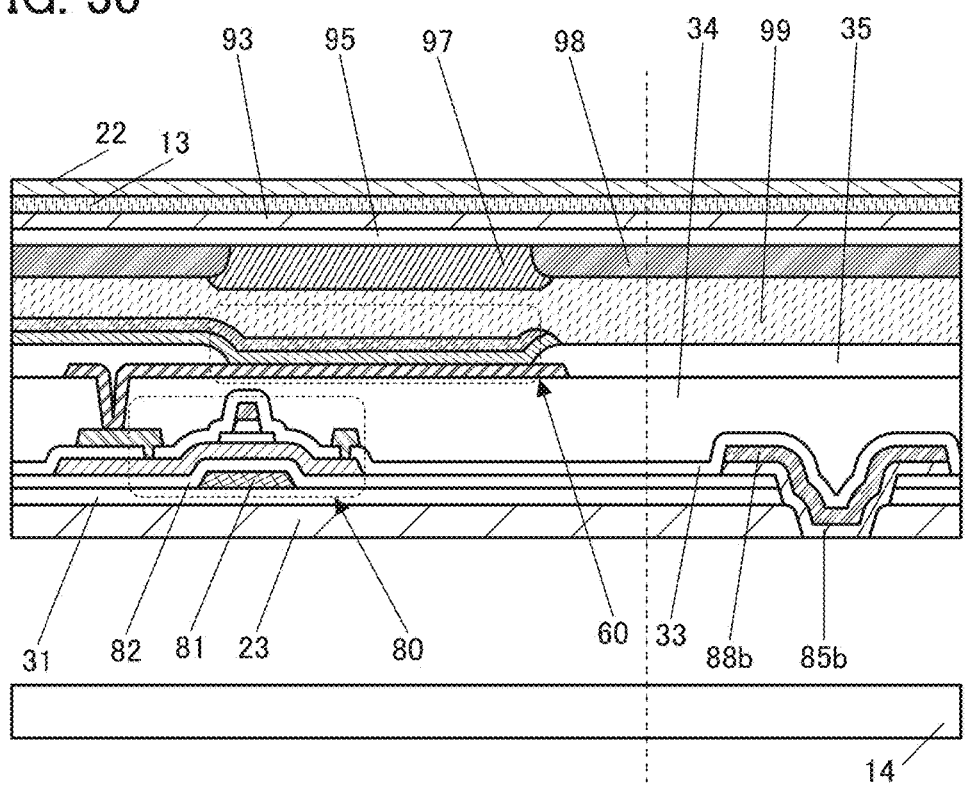
FIG. 30 is a diagram illustrating an example of a manufacturing method of a flexible device.

Then, two openings reaching the oxide semiconductor layer 83 are formed in the insulating layer 33. Then, the conductive layers 86a and 86b are formed (FIG. 25C). The conductive layers 86a and 86b can be formed in the following manner: a conductive film is formed, a resist mask is formed, the conductive film is etched, and the resist mask is removed. The conductive layer 86a and the conductive layer 86b are electrically connected to the oxide semiconductor layer 83 through the openings provided in the insulating layer 33.

In the above manner, the transistor 80 can be manufactured (FIG. 25C). In the transistor 80, part of the conductive layer 81 functions as the first gate and part of the insulating layer 82 functions as the first gate insulating layer. Part of the oxide layer 85a and part of the conductive layer 88a function as a second gate and part of the insulating layer 84 functions as a second gate insulating layer.

The oxide semiconductor layer 83 includes a channel region and a low-resistant region. The channel region overlaps with the oxide layer 85a and the conductive layer 88a with the insulating layer 84 positioned therebetween. The low-resistant region includes a portion connected to the conductive layer 86a and a portion connected to the conductive layer 86b.

Note that although the case where the conductive layer 88b is formed at the same time as the conductive layer 88a is shown, the conductive layer 88b and the conductive layer 88a are not necessarily formed at the same time. For example, the conductive layer 88b may be formed at the same time as the conductive layer 86a and 86b. In that case, an opening reaching the oxide layer 85b is formed in the insulating layer 33 in addition to the two openings reaching the oxide semiconductor layer 83 after the insulating layer 33 is formed. Next, a conductive film is formed. Then, a resist mask is formed, the conductive film is etched, and then the resist mask is removed, so that the conductive layers 86a, 86b, and 88b are formed.

Note that the steps shown in FIGS. 26A to 26C, FIGS. 27A and 27B, FIGS. 28A and 28B, FIGS. 29A and 29B, FIG. 30, FIGS. 31A and 31B, and FIGS. 32A and 32B are similar to the steps shown in FIGS. 17A to 17C, FIGS. 18A and 18B, FIGS. 19A and 19B, FIGS. 20A and 20B, FIG. 21, FIGS. 22A and 22B, and FIGS. 23A and 23B.

Modification Example 1

In one embodiment of the present invention, a display device having a bottom-emission structure can be manufactured.

Figure 33A:
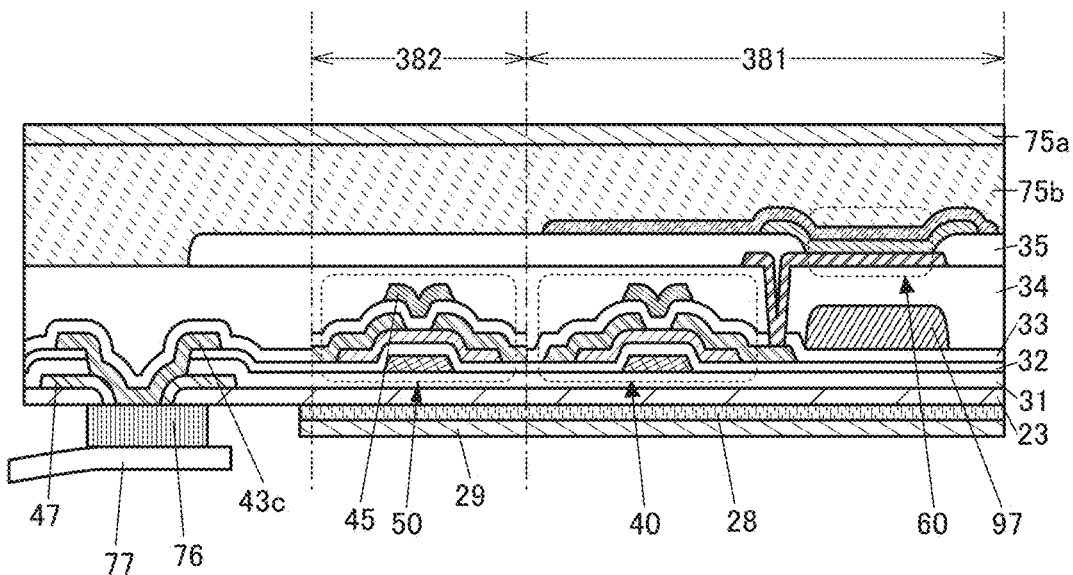
FIGS. 33A and 33B are diagrams each illustrating an example of a flexible device.

The display device shown in FIG. 33A is a display device having a bottom-emission structure using a color filter method. FIG. 33A is a cross-sectional view of the display portion 381, a cross-sectional view of the driver circuit portion 382, and a cross-sectional view of the portion connected to the FPC 77 of the display device.

The display device in FIG. 33A includes the substrate 29, the adhesive layer 28, the resin layer 23, the insulating layer 31, the transistor 40, transistor 50, the second layer 47, the conductive layer 43c, the insulating layer 33, the insulating layer 34, the insulating layer 35, the display element 60, the adhesive layer 75b, the substrate 75a, and the coloring layer 97.

In FIG. 33A, the transistor 40 and the transistor 50 include a conductive layer 45 functioning as a gate, in addition to the components of the transistor 40 shown in FIG. 6A.

The display element 60 emits light to the coloring layer 97 side.

The FPC 77 and the conductive layer 43c are electrically connected to each other through a connector 76. In the cross-sectional view of the portion connected to the FPC 77, an example where the end portion of the insulating layer 35 is not exposed at the end portion of the display device is shown.

Modification Example 2

Figure 33B:
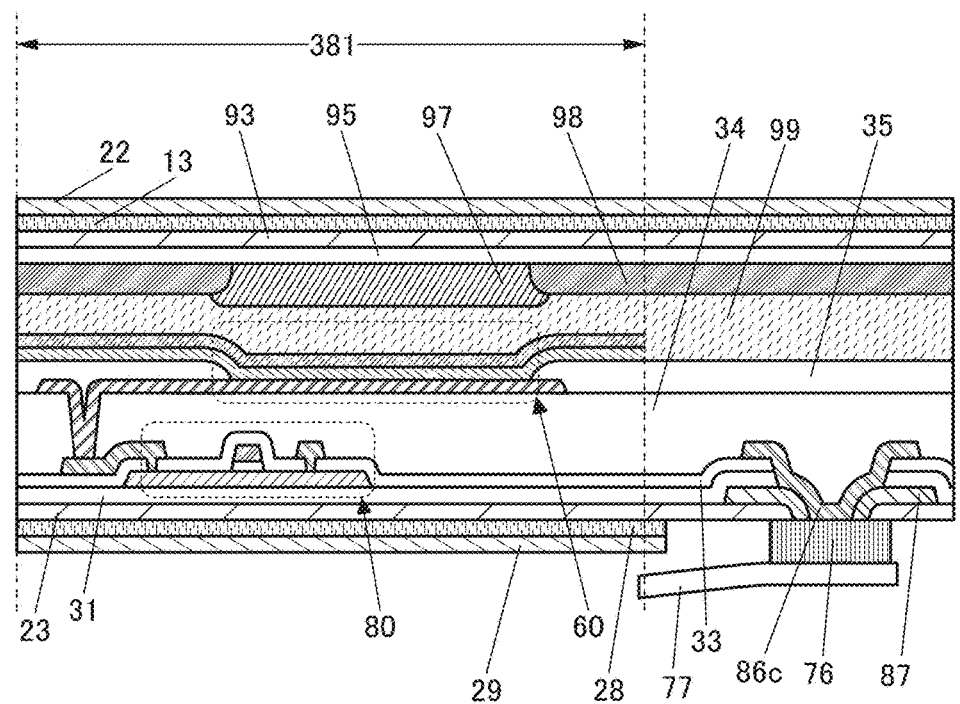

The display device in FIG. 33B is different from the display device in FIG. 22B in that the conductive layer 81 and the insulating layer 82 are not provided in the transistor 80.

Modification Example 3

Figure 12A:
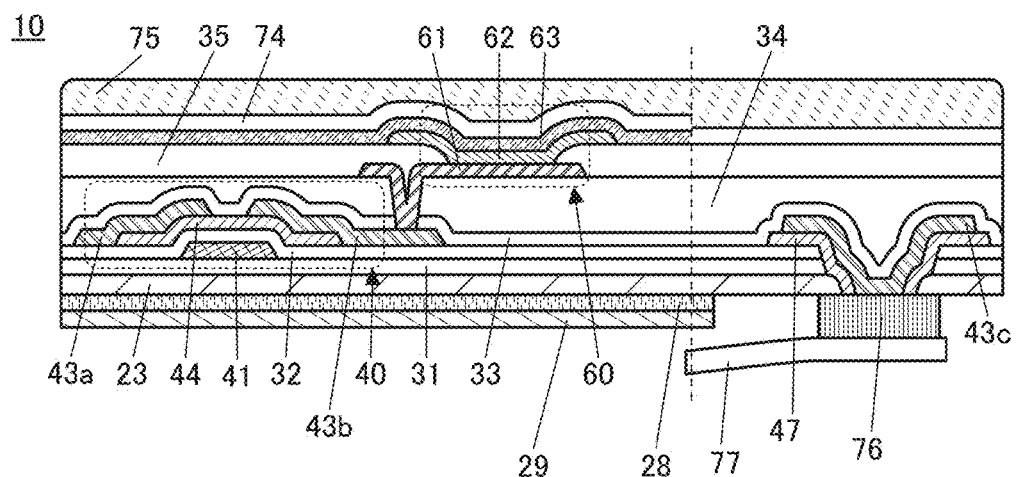
FIGS. 12A and 12B are diagrams each illustrating an example of a flexible device.
Figure 12B:
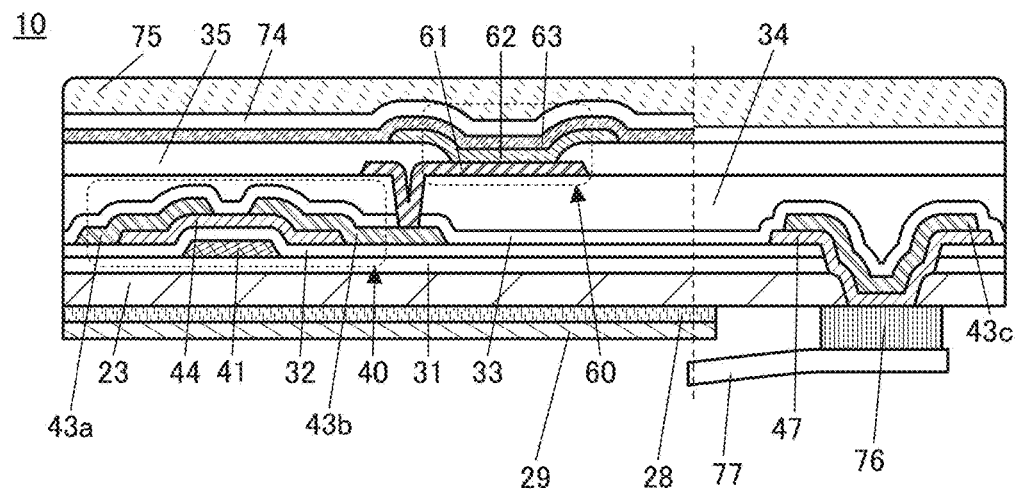
Figure 34A:
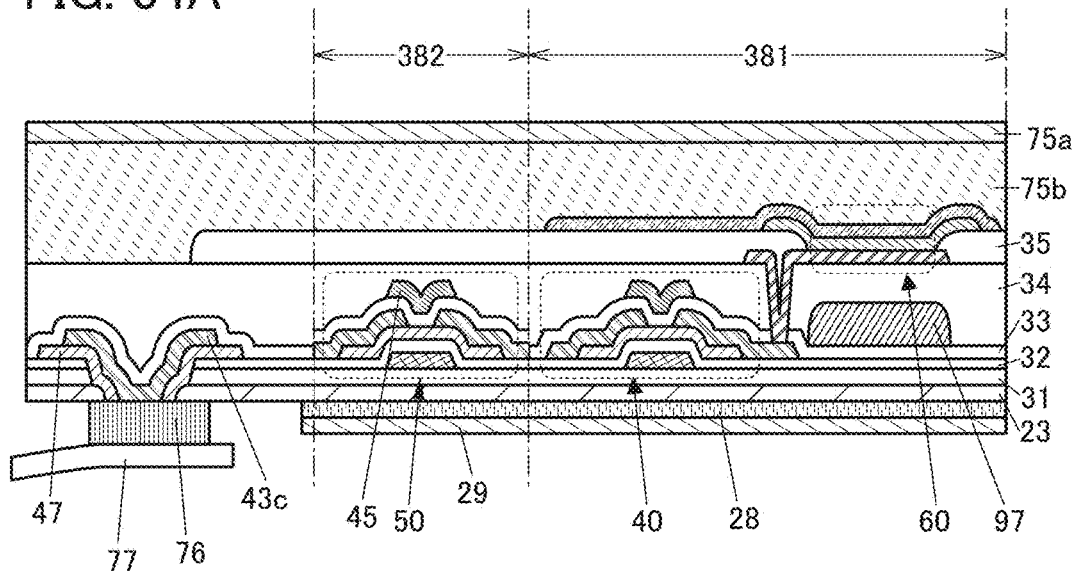
FIGS. 34A and 34B are diagrams each illustrating an example of a flexible device.

In FIG. 34A, the transistor 40 and the transistor 50 include a conductive layer 45 functioning as a gate, in addition to the components of the transistor 40 shown in FIG. 12A.

Modification Example 4

Figure 31A:
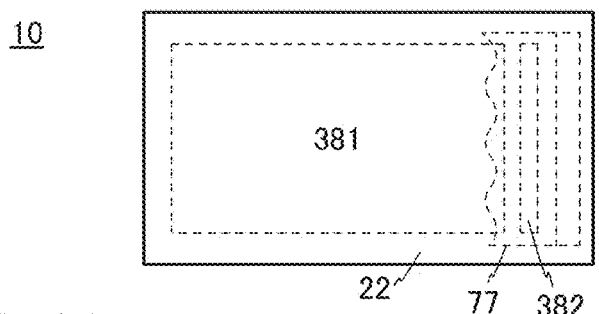
FIGS. 31A and 31B are diagrams each illustrating an example of a flexible device.
Figure 31B:
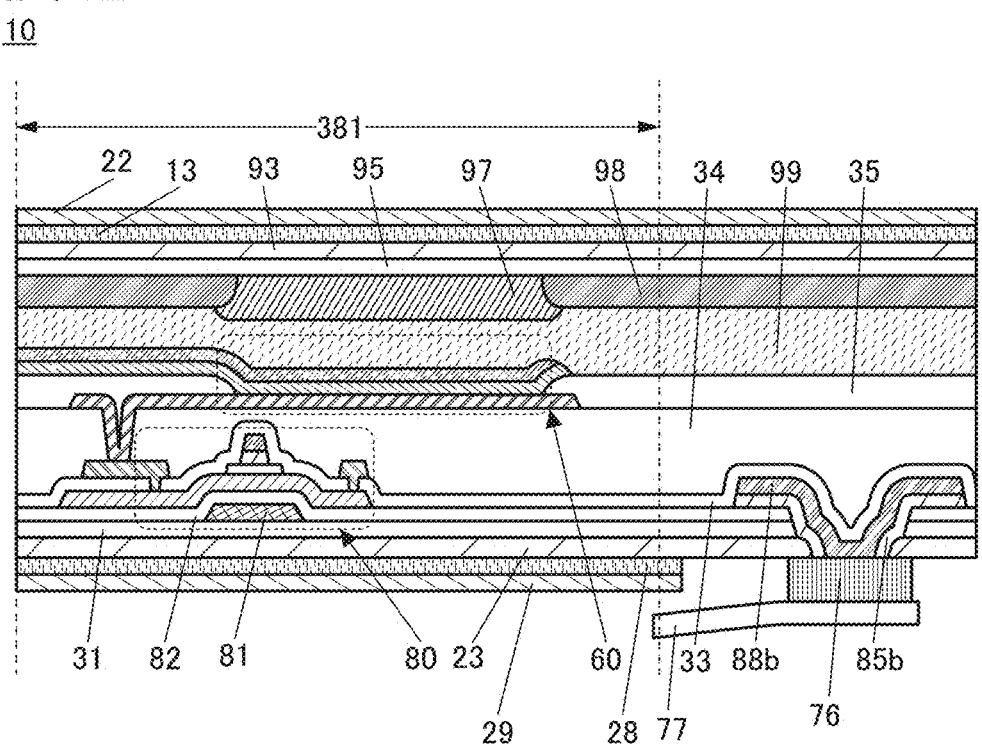
Figure 32A:
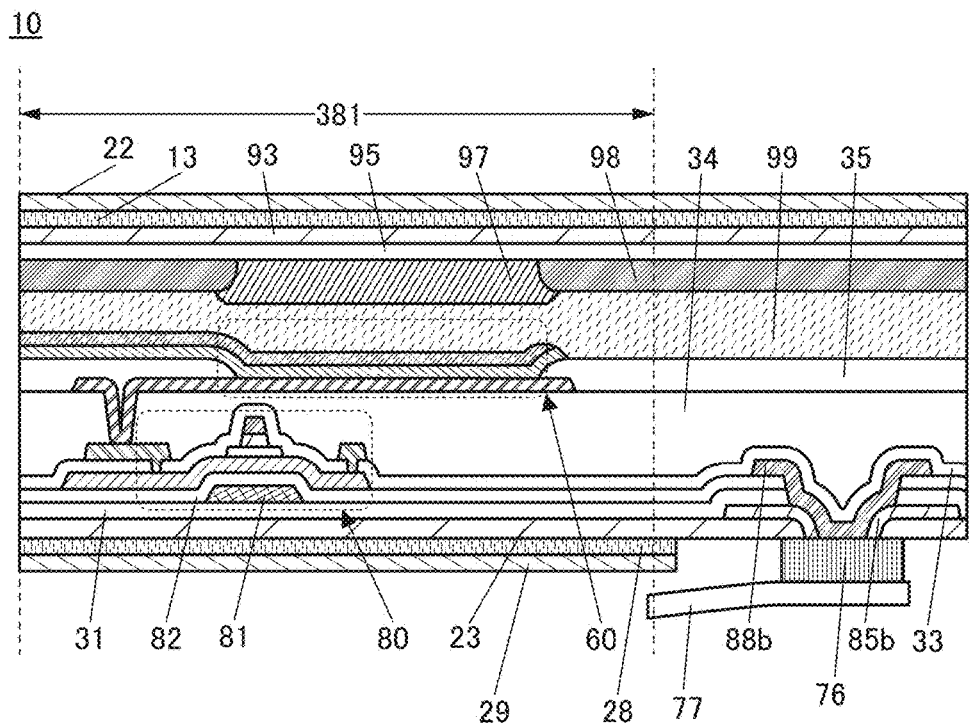
FIGS. 32A and 32B are diagrams each illustrating an example of a flexible device.
Figure 32B:
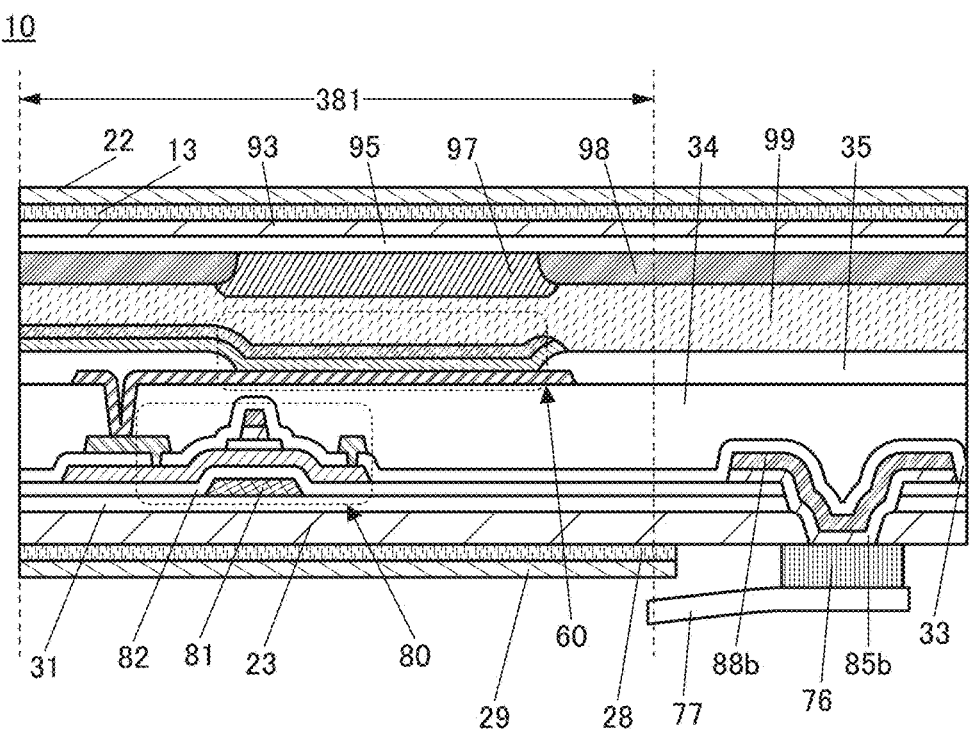
Figure 34B:
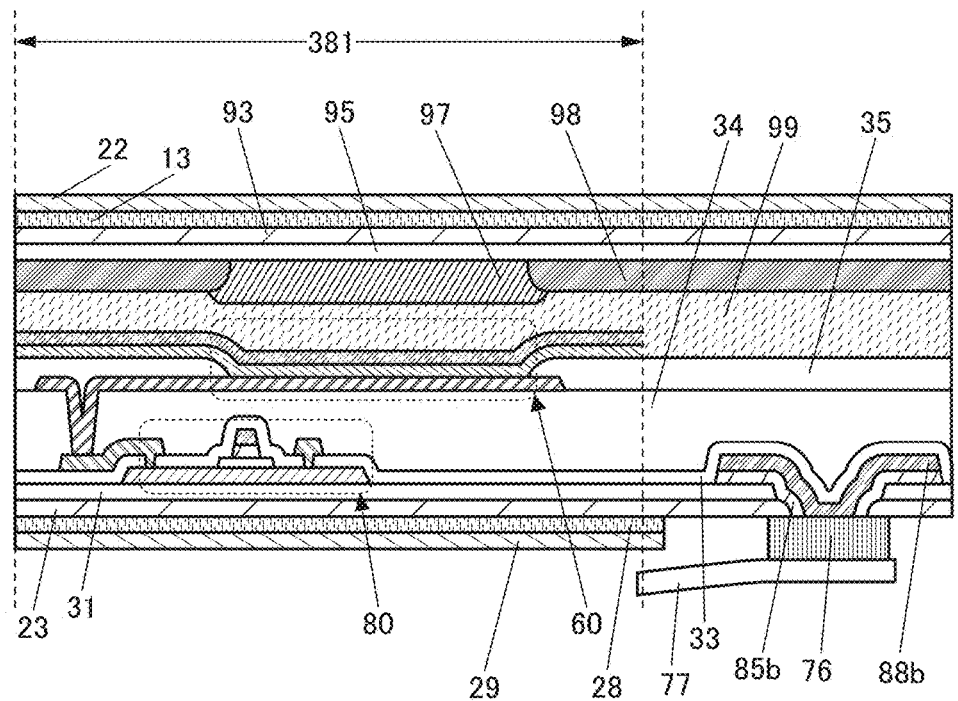

The display device in FIG. 34B is different from the display device in FIG. 31B in that the conductive layer 81 and the insulating layer 82 are not provided in the transistor 80.

Modification Example 5

Figure 35A:
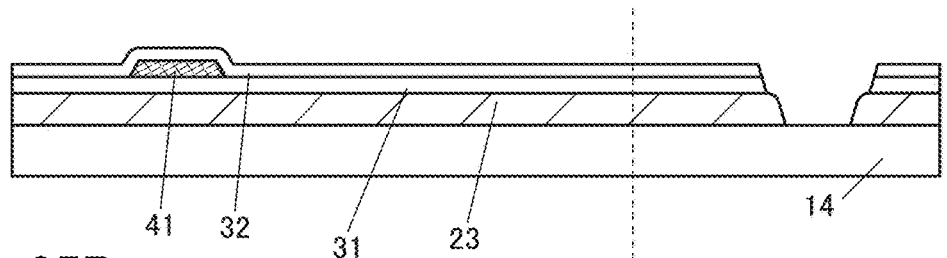
FIGS. 35A to 35C are diagrams illustrating an example of a manufacturing method of a flexible device.
Figure 35B:
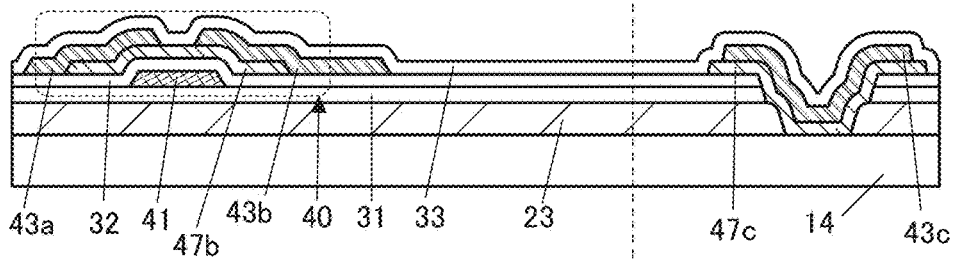
Figure 35C:
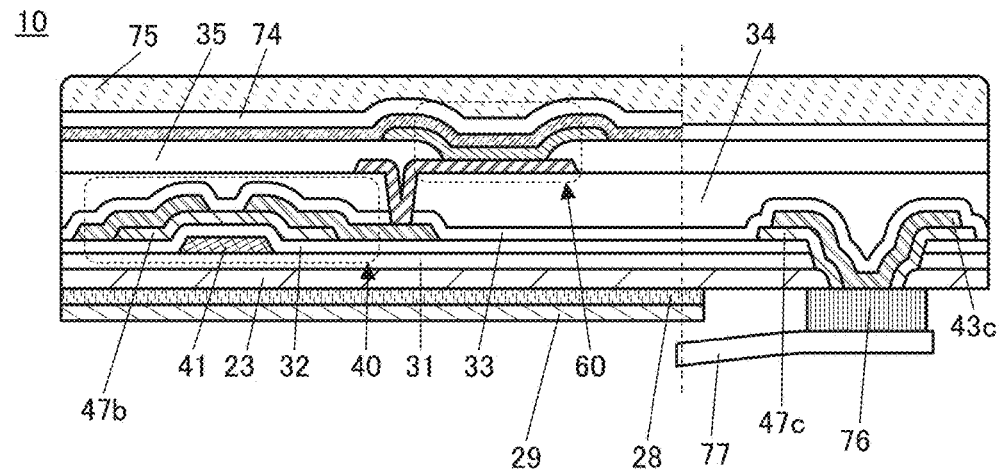

In FIGS. 35A to 35C, a hydrogenated amorphous silicon film used for the semiconductor layer of the transistor is used as the second layer. The resin layer 23 including an opening is formed over the formation substrate 14, the insulating layer 31 is formed over the resin layer 23, the conductive layer 41 is formed over the insulating layer 31, and the insulating layer 32 is formed over the conductive layer 41 and the insulating layer 31. Next, an opening is formed in a portion of the insulating layers 31 and 32 overlapping with the opening of the resin layer 23 (FIG. 35A). Embodiment 1 or Embodiment 2 may be referred to for the details.

Next, the hydrogenated amorphous silicon film is formed. As described in the Embodiment 1, a material which releases hydrogen due to laser light irradiation is used. Further, the hydrogenated amorphous silicon film can also be used as the semiconductor layer of the transistor 40. Thus, a material with a film quality and thickness suitable for the purpose is used. Then, the hydrogenated amorphous silicon film is etched and second layers 47b and 47c are formed. The second layer 47c is formed so as to cover the opening of the resin layer 23 and the insulating layers 31 and 32. The second layer 47b is used as the semiconductor layer of the transistor 40. The second layer 47b may be crystallized by local heating (for example, laser annealing).

Further, the conductive layers 43a, 43b, and 43c are formed to cover the second layers 47b and 47c and the insulating layer 32 (FIG. 35B). The conductive layers 43a and 43b function as a source and a drain of the transistor 40. After that, wirings and electrodes that are needed are further formed and another substrate is attached. Embodiment 1 or Embodiment 2 may be referred to for the details.

After that, by irradiating the laser light from the rear surface of the formation substrate 14, the formation substrate 14 and a circuit including the transistor 40 and the like can be separated from each other. Embodiment 1 or Embodiment 2 may be referred to for the details.

A structure example of the display device 10 manufactured through the steps shown in FIGS. 35A and 35B is illustrated in FIG. 35C. The display device 10 illustrated in FIG. 35C has the same structure as the display device 10 in FIG. 6B except that the oxide semiconductor layer 44 is the second layer 47b and that the second layer 47 is the second layer 47c.

This embodiment can be combined with any of the other embodiments as appropriate.

Embodiment 3

In this embodiment, the composition of a cloud-aligned composite oxide semiconductor (CAC-OS) applicable to a transistor disclosed in one embodiment of the present invention is described.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is uniformly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film containing In as a main component and a film containing Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions containing In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC-OS, composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

This embodiment can be combined with any of other embodiments as appropriate.

Embodiment 4

In this embodiment, electronic devices that can be manufactured using one embodiment of the present invention will be described with reference to FIGS. 36A to 36F.

One embodiment of the present invention makes it possible to manufacture an electronic device having a curved surface and high reliability. Further, one embodiment of the present invention makes it possible to manufacture an electronic device having flexibility and high reliability.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a nickel-hydride battery, a nickel-cadmium battery, an organic radical battery, a lead storage battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

Figure 36A:
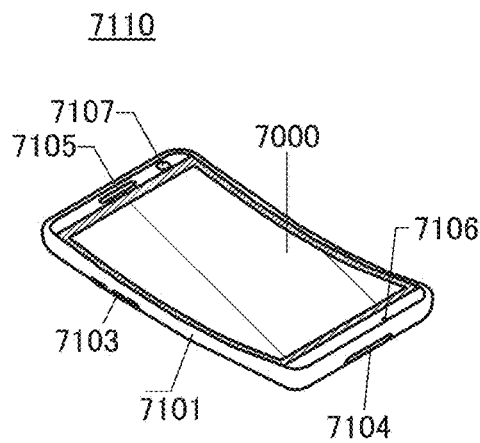
FIGS. 36A to 36F illustrate examples of an electronic device.
Figure 36B:
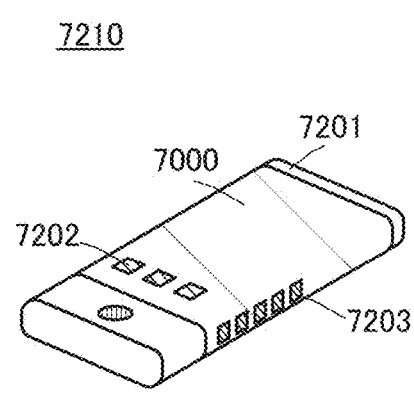
Figure 36C:
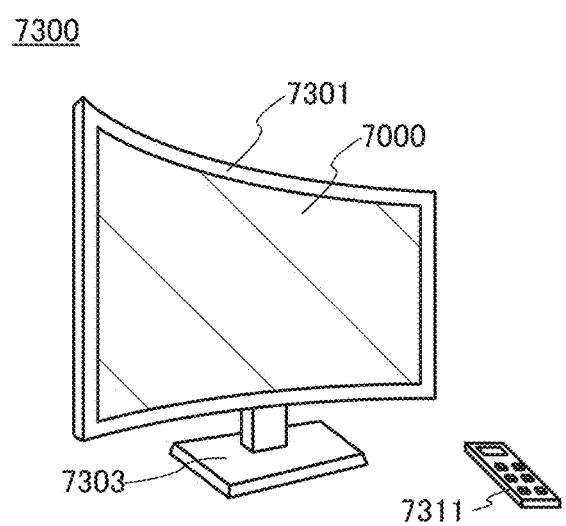

FIGS. 36A to 36C illustrate examples of an electronic device including a display portion 7000 with a curved surface. The display surface of the display portion 7000 is bent, and images can be displayed on the bent display surface. The display portion 7000 may have flexibility.

The display portion 7000 can be manufactured using the display device of one embodiment of the present invention. One embodiment of the present invention makes it possible to provide a highly reliable electronic device having a curved display portion.

FIG. 36A illustrates an example of a mobile phone. A mobile phone 7110 illustrated in FIG. 36A include a housing 7101, the display portion 7000, an operation button 7103, an external connection port 7104, a speaker 7105, a microphone 7106, a camera 7107, and the like.

The mobile phone 7110 includes a touch sensor in the display portion 7000. Operations such as making a call and inputting a letter can be performed by touch on the display portion 7000 with a finger, a stylus, or the like.

With the operation button 7103, power ON or OFF can be switched. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

FIG. 36B illustrates an example of a portable information terminal. A portable information terminal 7210 illustrated in FIG. 36B includes a housing 7201 and the display portion 7000. The portable information terminal 7210 may also include operation buttons, an external connection port, a speaker, a microphone, an antenna, a camera, a battery, or the like. The display portion 7000 is provided with the touch sensor. An operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminal 7210 can display characters, image information, and the like on its plurality of surfaces. For example, three operation buttons 7202 can be displayed on one surface, and information 7203 indicated by a rectangle can be displayed on another surface. FIG. 36B illustrates an example where the operation buttons 7202 are displayed at the top of the portable information terminal 7210 and the information 7203 is displayed at the side of the portable information terminal 7210. Note that the operation buttons 7202 may be displayed at the side of the portable information terminal 7210 and the information 7203 may be displayed at the top of the portable information terminal 7210, for example. Information may be displayed on three or more surfaces of the portable information terminal 7210.

Examples of the information 7203 include notification from a social networking service (SNS), display indicating reception of an e-mail, an incoming call, or the like, the title or the sender of an e-mail or the like, the date, the time, remaining battery, and the reception strength of an antenna. Alternatively, the operation button, an icon, or the like may be displayed in place of the information 7203.

FIG. 36C illustrates an example of a television set. In a television set 7300, the display portion 7000 is incorporated into a housing 7301. Here, the housing 7301 is supported by a stand 7303.

The television set 7300 illustrated in FIG. 36C can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 36D:
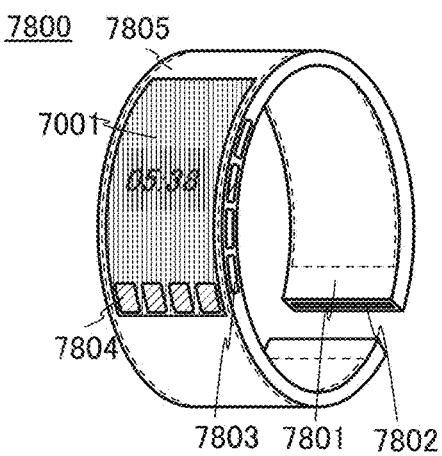
Figure 36E:
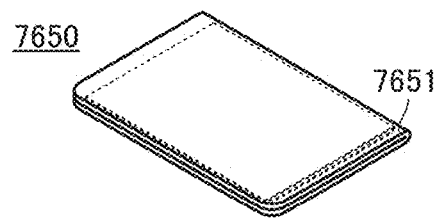
Figure 36F:
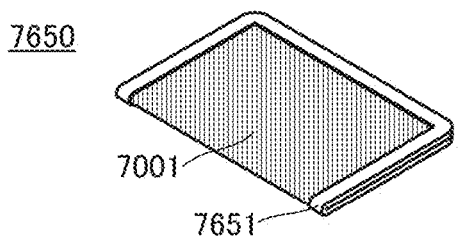

FIGS. 36D to 36F illustrate examples of portable information terminals each including a flexible and bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIG. 36D illustrates an example of a wrist-watch-type portable information terminal. The portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be arranged to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal 7800 and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

FIGS. 36E and 36F illustrate an example of a foldable portable information terminal. FIG. 36E illustrates a portable information terminal 7650 that is folded so that the display portion 7001 is on the inside. FIG. 36F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged. Note that FIGS. 36E and 36F each illustrate a structure in which the portable information terminal 7650 is folded in two; however, the portable information terminal 7650 may be folded in three or four or more. The portable information terminal 7650 may also include an operation button, an external connection port, a speaker, a microphone, an antenna, a camera, a battery, or the like.

This embodiment can be combined with any of other embodiments as appropriate.

Example 1

This example describes results of separating the formation substrate from the process member by using the separation method of one embodiment of the present invention.

Figure 37A:
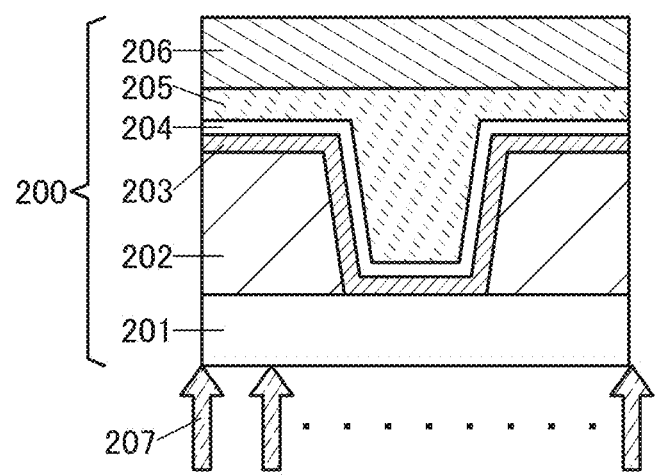
FIGS. 37A and 37B are diagrams showing a process member and a member after separation in Example 1.

FIG. 37A is a cross-sectional schematic view of a process member 200. The process member 200 includes a formation substrate 201, a resin layer 202, an oxide layer 203, an insulating layer 204, an adhesive layer 205, and a substrate 206.

A glass substrate was used as the formation substrate 201. A polyimide resin layer with a thickness of approximately 1.5 μm was used as the resin layer 202. An In—Ga—Zn oxide layer with an atomic ratio of In:Ga:Zn=5:1:6 and a thickness of 50 nm was used as the oxide layer 203. A silicon nitride layer with a thickness of 100 nm was used as the insulating layer 204. An aramid film was used as the substrate 206.

Manufacturing process of the process member 200 will be described. First, a material including a resin material that becomes polyimide after polymerization was applied to the formation substrate 201 to have a thickness of approximately 2.0 μm. Next, the applied material was heated (pre-baking), subjected to light exposure, and developed. Then, heat treatment (postbaking) was performed at 400° C. and the resin layer 202 including an opening reaching the formation substrate 201 was formed.

Then, the oxide layer 203 was formed by a sputtering method using an oxide target having an atomic ratio of In:Ga:Zn=5:1:7. A flow rate of a mixed gas of oxygen and argon set to 10% was used as a sputtering gas and the pressure of the sputtering gas was set to 0.6 Pa. Further, a substrate temperature at the time of the deposition of the oxide layer 203 was set to a room temperature and a direct current (DC) power source was set to 2.5 kW.

After the oxide layer 203 was formed, the insulating layer 204 was formed by a CVD method. Then, the substrate 206 was attached to the insulating layer 204 with the adhesive layer 205.

Next, a step of separating the formation substrate 201 from the process member 200 will be described.

The process member 200 was irradiated with a laser light 207 from the formation substrate 201 side. The laser light 207 was emitted by a laser apparatus. The energy density of the apparatus was 339 mJ/cm$^2$, the scan speed of the apparatus was 3.6 mm/sec, the oscillation frequency of the apparatus was 60 Hz, and the energy of the apparatus was set at 950 mJ.

Figure 37B:
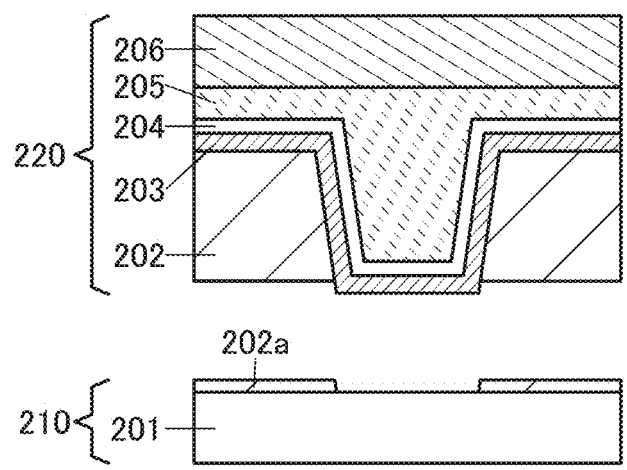

As illustrated in FIG. 37B, the formation substrate 201 was separated from the process member 200 after the irradiation with the laser light 207. After the separation, a member that includes the formation substrate 201 is a member 210 and a member including the substrate 206 is a member 220. Note that a residue of the resin layer 202 (resin layer 202a) might be attached to the formation substrate 201 after the separation. In that case, the resin layer 202a in addition to the formation substrate 201 is included in the member 210.

Figure 38A:
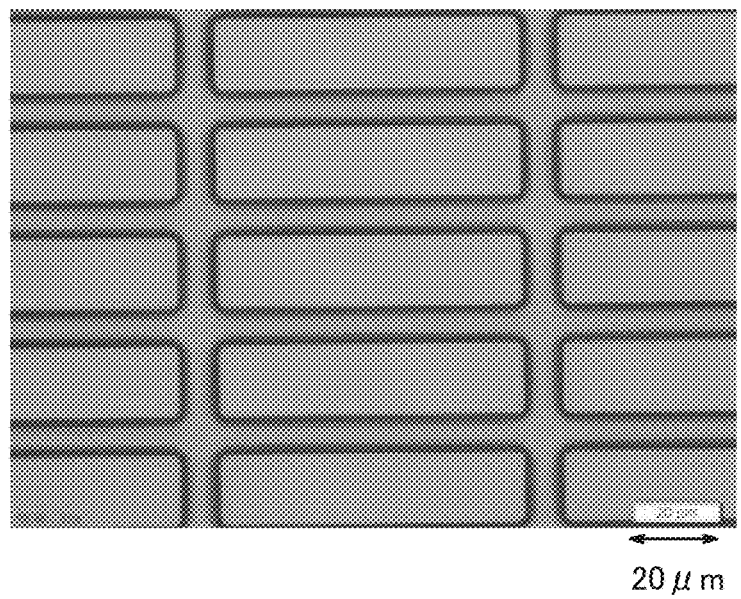
FIGS. 38A and 38B are photographs showing results of Example 1.
Figure 38B:
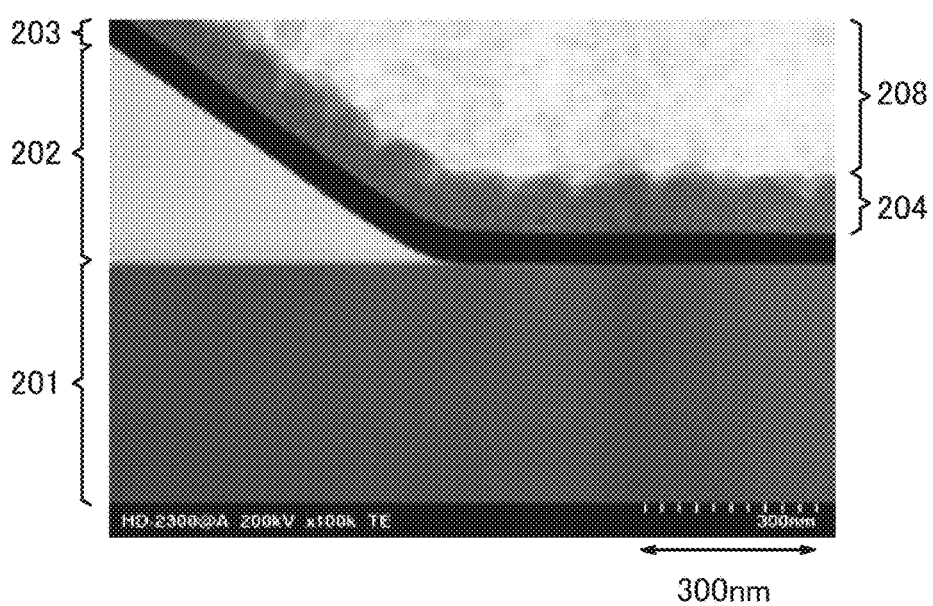

FIG. 38A shows an optical micrograph (taken at a magnification of 50) of the process member 200. FIG. 38B shows a cross-sectional STEM image (taken at a magnification of 100000) of the process member 200. Note that FIG. 38B shows a layer 208 including a layer containing carbon. FIG. 38B shows that the resin layer 202, the oxide layer 203, and the insulating layer 204 are formed over the formation substrate 201.

In this example, two members 210 and two members 220 were manufactured. Thus, two process members 200 were manufactured and each of the formation substrates 201 was separated from the respective process members 200. The observation photographs of the members 210 and 220 obtained from one of the two process members 200 are shown in FIGS. 39A to 39F. Further, the observation photographs of the members 210 and 220 obtained from the other process member 200 are shown in FIGS. 40A to 40F.

Figure 39A:
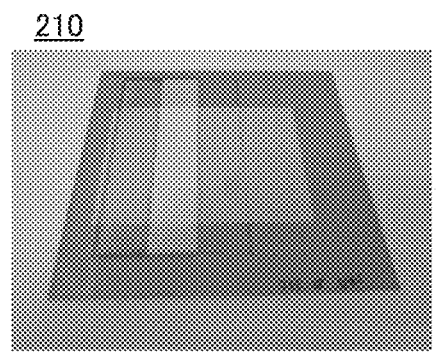
FIGS. 39A to 39F are photographs showing results of Example 1.
Figure 39B:
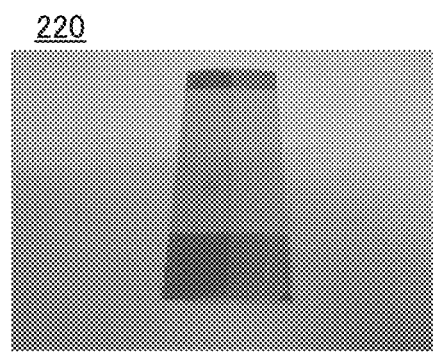
Figure 39C:
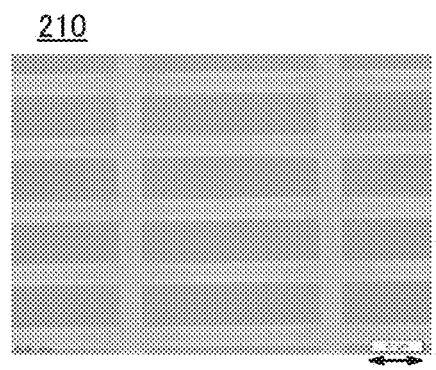
Figure 39D:
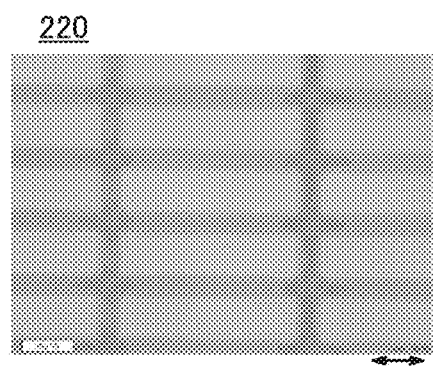
Figure 39E:
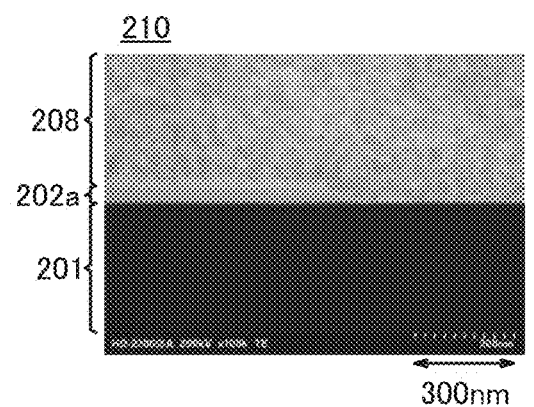
Figure 39F:
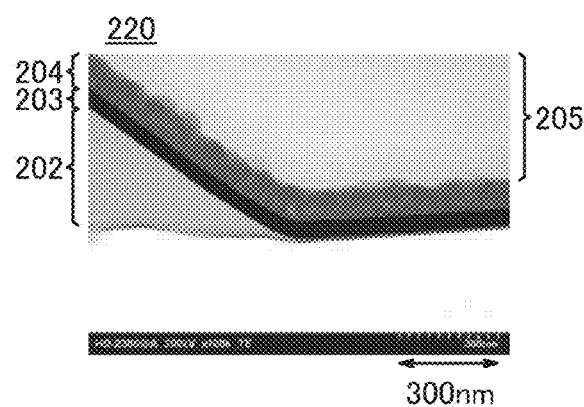
Figure 40A:
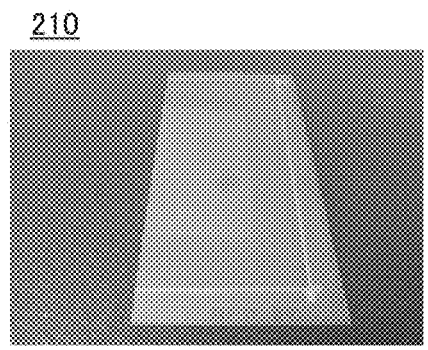
FIGS. 40A to 40F are photographs showing results of Example 1.
Figure 40B:
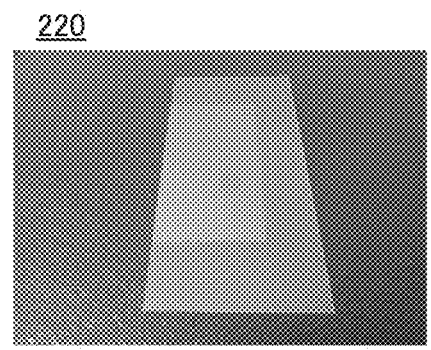
Figure 40C:
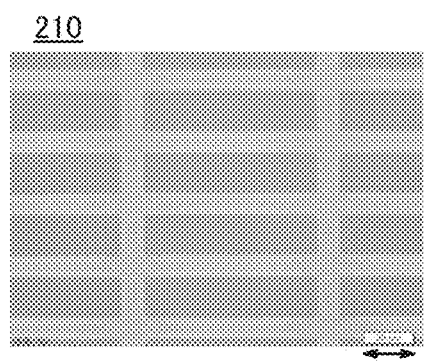
Figure 40D:
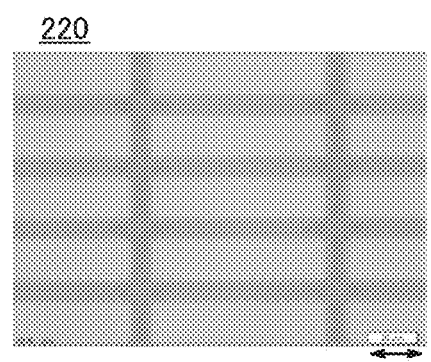
Figure 40E:
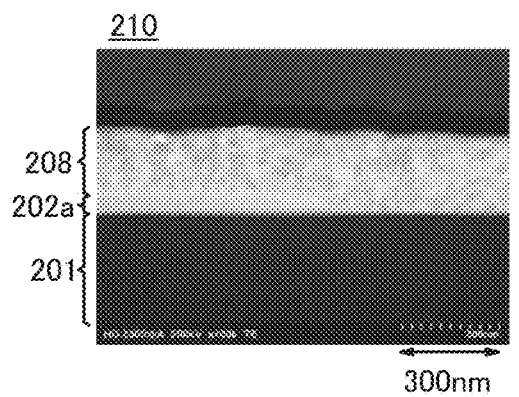

FIG. 39A and FIG. 40A each show the appearance of the member 210 and FIG. 39B and FIG. 40B each show the appearance of the member 220. FIG. 39C and FIG. 40C show an optical micrograph (taken at a magnification of 50) of the process member 210 and FIG. 39D and FIG. 40D show an optical micrograph (taken at a magnification of 50) of the process member 220. FIG. 39E and FIG. 40E each show a cross-sectional STEM image (taken at a magnification of 100000) of the member 210 and FIG. 39F and FIG. 40F each show a cross-sectional STEM image (taken at a magnification of 100000) of the process member 220. Note that FIG. 39E and FIGS. 40E and 40F each show a layer 208 that is a layer containing carbon.

Figure 40F:
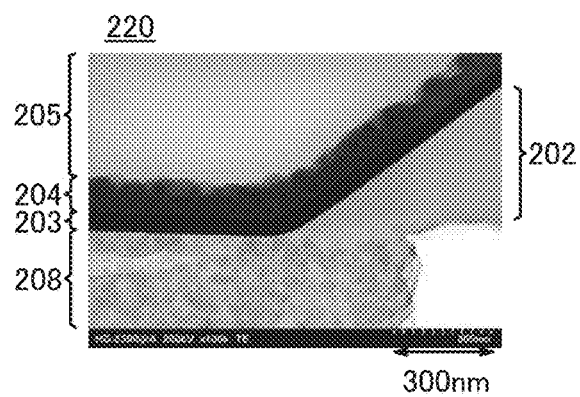

FIGS. 39E and 39F and FIGS. 40E and 40F show that the formation substrate 201 and the oxide layer 203 were separated at the interface therebetween in the portion where the two were in contact. Note that FIG. 39E and FIG. 40E each show that a residue of the resin layer 202 (resin layer 202a) with a thickness of approximately 60 nm is attached to the formation substrate 201 after the separation of the formation substrate 201. Further, the results of FIG. 39E and FIG. 40E are the same and the results of FIG. 39F and FIG. 40F are the same. Thus, the reproducibility of the separation of the formation substrate 201 was performed at the interface between the formation substrate 201 and the oxide layer 203 was confirmed.

REFERENCE NUMERALS

10: display device, 13: adhesive layer, 14: formation substrate, 22: substrate, 23: resin layer, 23a: resin layer, 24: layer, 28: adhesive layer, 29: substrate, 31: insulating layer, 32: insulating layer, 33: insulating layer, 34: insulating layer, 35: insulating layer, 40: transistor, 41: conductive layer, 43a: conductive layer, 43b: conductive layer, 43c: conductive layer, 44: oxide semiconductor layer, 45: conductive layer, 47: layer, 47a: layer, 47b: layer, 47c: layer, 50: transistor, 60: display element, 61: conductive layer, 62: EL layer, 63: conductive layer, 65: laser light, 71: protective layer, 74: insulating layer, 75: protective layer, 75a: substrate, 75b: adhesive layer, 76: connector, 77: FPC, 80: transistor, 81: conductive layer, 82: insulating layer, 83: oxide semiconductor layer, 84: insulating layer, 85: conductive layer, 85a: oxide layer, 85b: oxide layer, 86a: conductive layer, 86b: conductive layer, 86c: conductive layer, 87: layer, 87a: layer, 88a: conductive layer, 88b: conductive layer, 91: formation substrate, 93: resin layer, 95: insulating layer, 97: coloring layer, 98: light-blocking layer, 99: adhesive layer, 200: process member, 201: formation substrate, 202: resin layer, 202a: resin layer, 203: oxide layer, 204: insulating layer, 205: adhesive layer, 206: substrate, 207: laser light, 208: layer, 210: member, 220: member, 381: display portion, 382: driver circuit portion, 7000: display portion, 7001: display portion, 7101: housing, 7103: operation button, 7104: external connection port, 7105: speaker, 7106: microphone, 7107: camera, 7110: mobile phone, 7201: housing, 7202: operation button, 7203: information, 7210: portable information terminal, 7300: television set, 7301: housing, 7303: stand, 7311: remote controller, 7650: portable information terminal, 7651: non-display portion, 7800: portable information terminal, 7801: band, 7802: input/output terminal, 7803: operation button, 7804: icon, 7805: battery.

This application is based on Japanese Patent Application serial no. 2016-086552 filed with Japan Patent Office on Apr. 22, 2016 and Japanese Patent Application serial no. 2016-086553 filed with Japan Patent Office on Apr. 22, 2016, the entire contents of which are hereby incorporated by reference.

The invention claimed is:

1. A method for manufacturing a flexible device, comprising the steps of:
    forming a first layer with a thickness of 0.1 μm or more and 3 μm or less using a photosensitive and thermosetting material over a formation substrate;
    removing part of the first layer by a photolithography method and then performing heat treatment to form a resin layer comprising an opening;
    forming a silicon layer covering the opening of the resin layer;
    forming a transistor comprising a metal oxide over the resin layer;
    forming a conductive layer over the silicon layer covering the opening in the same manufacturing steps as manufacturing steps of a source or a drain of the transistor;
    performing irradiation with laser light on the resin layer and the silicon layer covering the opening; and
    separating the transistor and the conductive layer from the formation substrate.

2. The method for manufacturing a flexible device, according to claim 1, wherein the silicon layer is configured to release hydrogen by light irradiation.

3. The method for manufacturing a flexible device, according to claim 1, wherein the silicon layer is a hydrogenated amorphous silicon layer.

4. The method for manufacturing a flexible device, according to claim 1, wherein the resin layer and the silicon layer are irradiated with the laser light from the formation substrate side.

5. The method for manufacturing a flexible device, according to claim 1, wherein the laser light is linear laser light.

6. The method for manufacturing a flexible device, according to claim 1, wherein the first layer is formed using a solution with a viscosity of 5 cP or more and less than 100 cP.

7. The method for manufacturing a flexible device, according to claim 1, wherein the first layer is formed using a spin coater.

8. The method for manufacturing a flexible device, according to claim 1,
    wherein the heat treatment is performed at a first temperature, and
    wherein the transistor is manufactured at a temperature lower than the first temperature.

9. A method for manufacturing a flexible device, comprising the steps of:
    forming a first layer with a thickness of 0.1 μm or more and 3 μm or less using a photosensitive and thermosetting material over a formation substrate;
    removing part of the first layer by a photolithography method and then performing heat treatment to form a resin layer comprising an opening;
    forming an oxide layer covering the opening of the resin layer;
    forming a transistor comprising a metal oxide over the resin layer;
    forming a conductive layer over the oxide layer covering the opening in the same manufacturing steps as manufacturing steps of a source or a drain of the transistor;
    performing irradiation with laser light on the resin layer and the oxide layer covering the opening; and
    separating the transistor and the conductive layer from the formation substrate.

10. The method for manufacturing a flexible device, according to claim 9, wherein the oxide layer comprises indium, zinc, and any one of aluminum, gallium, yttrium, and tin.

11. The method for manufacturing a flexible device, according to claim 9, wherein the resin layer and the oxide layer are irradiated with the laser light from the formation substrate side.

12. The method for manufacturing a flexible device, according to claim 9, wherein the laser light is linear laser light.

13. The method for manufacturing a flexible device, according to claim 9, wherein the first layer is formed using a solution with a viscosity of 5 cP or more and less than 100 cP.

14. The method for manufacturing a flexible device, according to claim 9, wherein the first layer is formed using a spin coater.

15. The method for manufacturing a flexible device, according to claim 9,
    wherein the heat treatment is performed at a first temperature, and wherein the transistor is manufactured at a temperature lower than the first temperature.

16. A method for manufacturing a flexible device, comprising the steps of:
forming a first layer with a thickness of 0.1 μm or more and 3 μm or less using a photosensitive and thermosetting material over a formation substrate;
removing part of the first layer by a photolithography method and then performing heat treatment to form a resin layer comprising an opening;
forming an oxide layer covering the opening of the resin layer;
forming a transistor comprising a metal oxide over the resin layer;
forming a conductive layer over the oxide layer covering the opening in the same manufacturing steps as manufacturing steps of a source or a drain of the transistor;
performing irradiation with laser light on the resin layer and the oxide layer covering the opening; and
separating the transistor and the conductive layer from the formation substrate,
wherein the oxide layer comprises indium, zinc, and any one of aluminum, gallium, yttrium, and tin, and
wherein the resin layer and the oxide layer are irradiated with the laser light from the formation substrate side.

17. The method for manufacturing a flexible device, according to claim 16, wherein the laser light is linear laser light.

18. The method for manufacturing a flexible device, according to claim 16, wherein the first layer is formed using a solution with a viscosity of 5 cP or more and less than 100 cP.

19. The method for manufacturing a flexible device, according to claim 16, wherein the first layer is formed using a spin coater.

20. The method for manufacturing a flexible device, according to claim 16,
wherein the heat treatment is performed at a first temperature, and
wherein the transistor is manufactured at a temperature lower than the first temperature.

* * * * *